US008654057B2

(12) United States Patent
Tobita

(10) Patent No.: US 8,654,057 B2
(45) Date of Patent: Feb. 18, 2014

(54) ELECTRO-OPTICAL DEVICE, SHIFT REGISTER CIRCUIT, AND SEMICONDUCTOR DEVICE

(71) Applicant: Mitsubishi Electric Corporation, Chiyoda-ku (JP)

(72) Inventor: Youichi Tobita, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/863,060

(22) Filed: Apr. 15, 2013

(65) Prior Publication Data

US 2013/0222220 A1    Aug. 29, 2013

Related U.S. Application Data

(62) Division of application No. 12/705,235, filed on Feb. 12, 2010, now Pat. No. 8,462,098.

(30) Foreign Application Priority Data

Feb. 9, 2009  (JP) .................................. 2009-027244
Jan. 8, 2010  (JP) .................................. 2010-002580

(51) Int. Cl.
    *G09G 3/36*    (2006.01)
(52) U.S. Cl.
    USPC ........................................... 345/100; 345/98
(58) Field of Classification Search
    USPC .................... 345/87, 95, 96, 98–100, 208
    See application file for complete search history.

(56) References Cited

U.S. PATENT DOCUMENTS 7,548,228 B2    6/2009 Pak et al.
7,561,150 B2    7/2009 Kikuchi
8,462,098 B2    6/2013 Tobita
(Continued)

FOREIGN PATENT DOCUMENTS

JP    2000-347628    12/2000
JP    2004-78172    3/2004
JP    2006-106394    4/2006
JP    2006-189767    7/2006
(Continued)

OTHER PUBLICATIONS

Office Action issued in Japanese Patent Application No. 2010-025162 on Oct. 15, 2013 with partial English translation.

*Primary Examiner* — Ricardo L Osorio
(74) *Attorney, Agent, or Firm* — Oblon, Spivak, McClelland, Maier & Neustadt, L.L.P.

(57) ABSTRACT

An electro-optical device is configured to be capable of using a region of a gate line drive circuit efficiently and preventing rising speed of a gate line selection signal from decreasing (rising delay), and a shift register circuit is composed of a single conductivity type transistor which is suitable for the device. The gate line drive circuit including an odd driver to drive odd rows of a plurality of gate lines, and an even driver to drive even rows thereof. Each unit shift register in the odd and even drivers receives a selection signal in the second previous row and activates its own selection signal two horizontal periods later. A start pulse of the even driver is delayed in phase by one horizontal period with respect to a start pulse of the odd driver.

27 Claims, 20 Drawing Sheets

(56) References Cited

U.S. PATENT DOCUMENTS

| | | |
|---|---|---|
| 2003/0231735 A1 | 12/2003 | Moon et al. |
| 2004/0217935 A1 | 11/2004 | Jeon et al. |
| 2005/0083292 A1 | 4/2005 | Moon et al. |
| 2007/0195920 A1 | 8/2007 | Tobita |
| 2007/0245193 A1 | 10/2007 | Wei et al. |
| 2008/0001899 A1 | 1/2008 | Chan et al. |
| 2008/0174580 A1 | 7/2008 | Chang et al. |
| 2009/0128541 A1 | 5/2009 | Tsai et al. |

FOREIGN PATENT DOCUMENTS

| | | |
|---|---|---|
| JP | 2006-285233 | 10/2006 |
| JP | 2007-257813 | 10/2007 |
| JP | 2008-287753 | 11/2008 |
| JP | 2009-025428 | 2/2009 |

F I G . 1
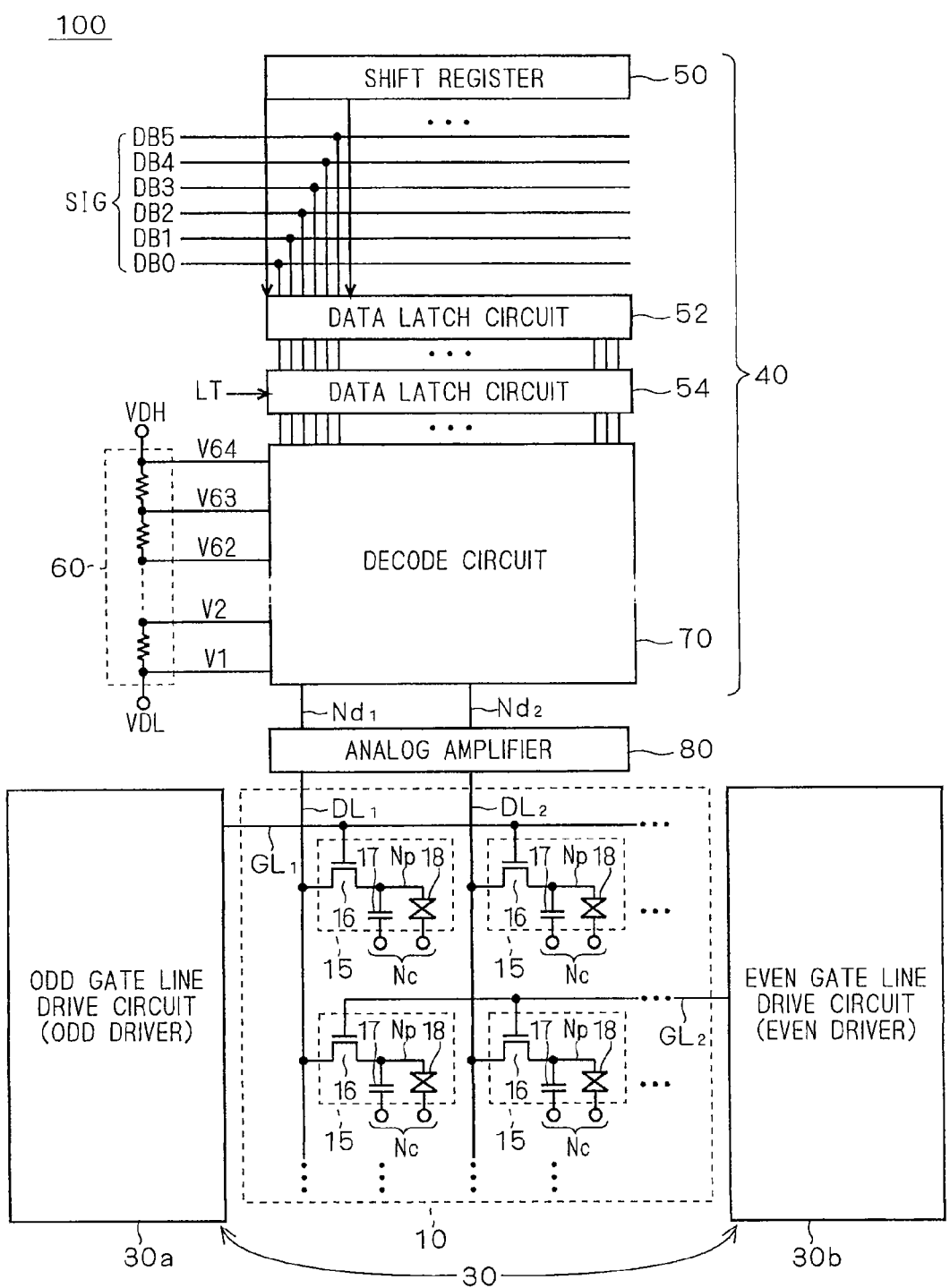

F I G . 3
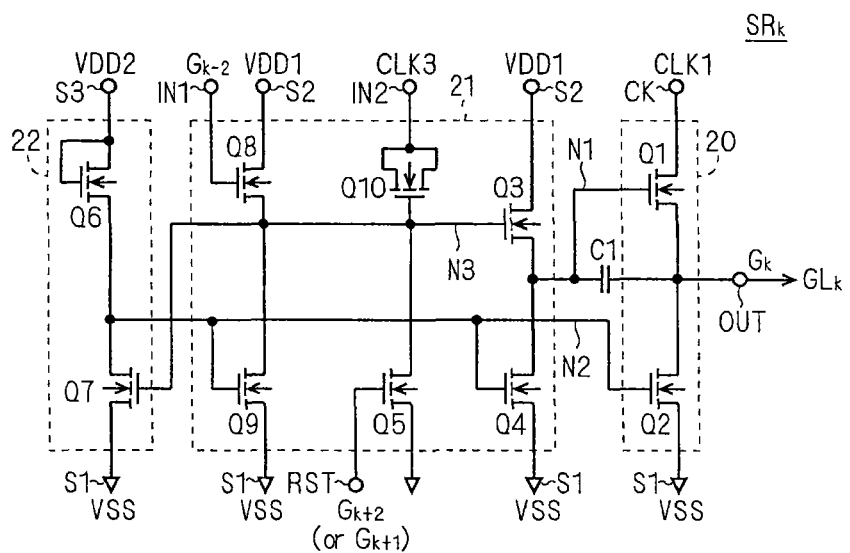

F I G . 1 2
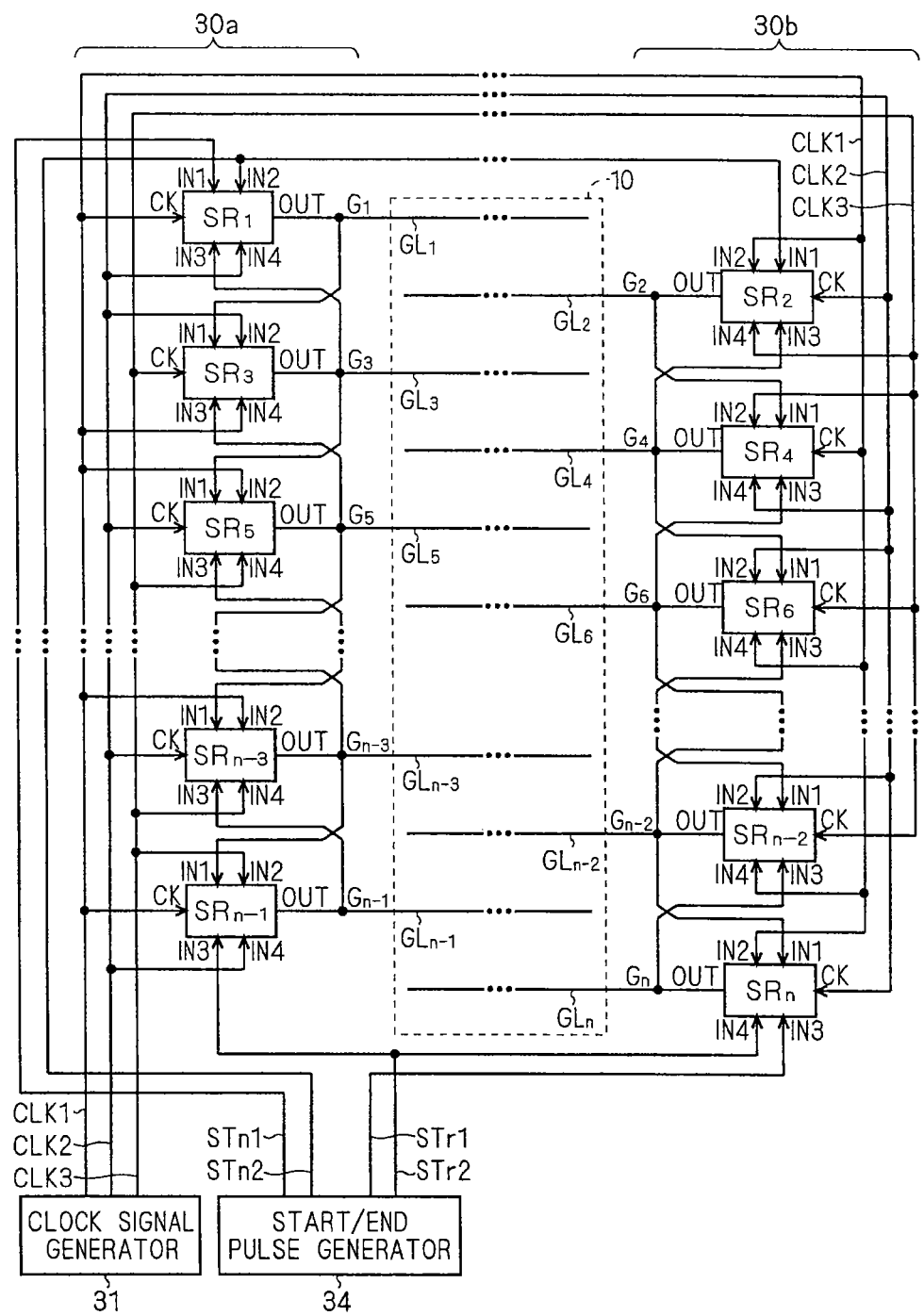

F I G . 1 4
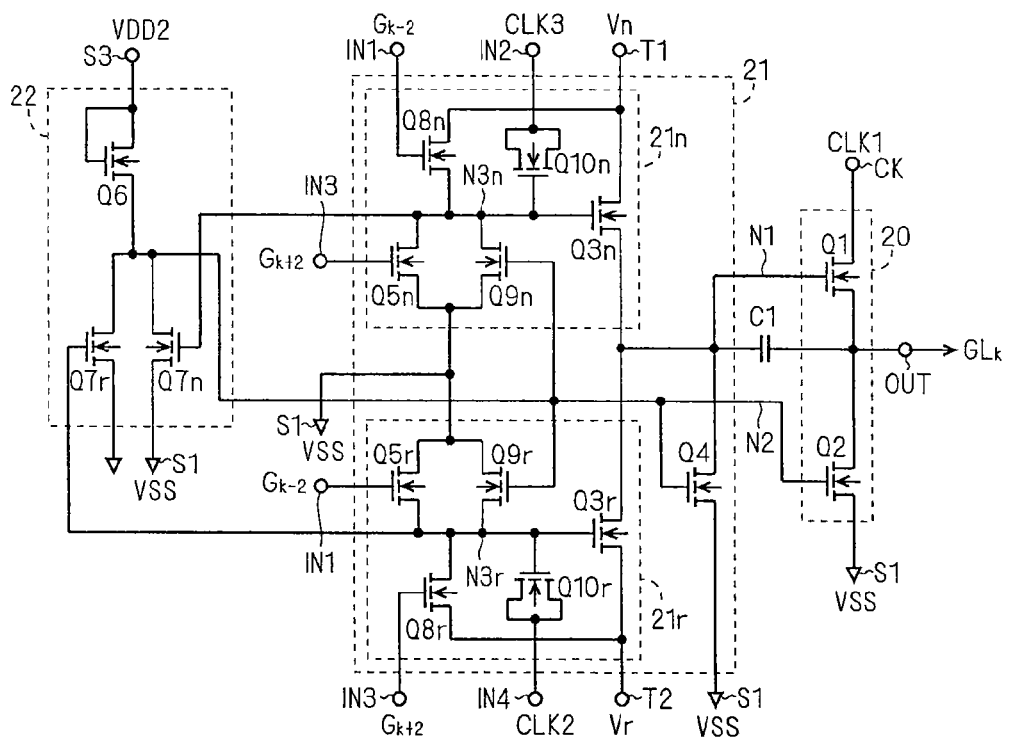

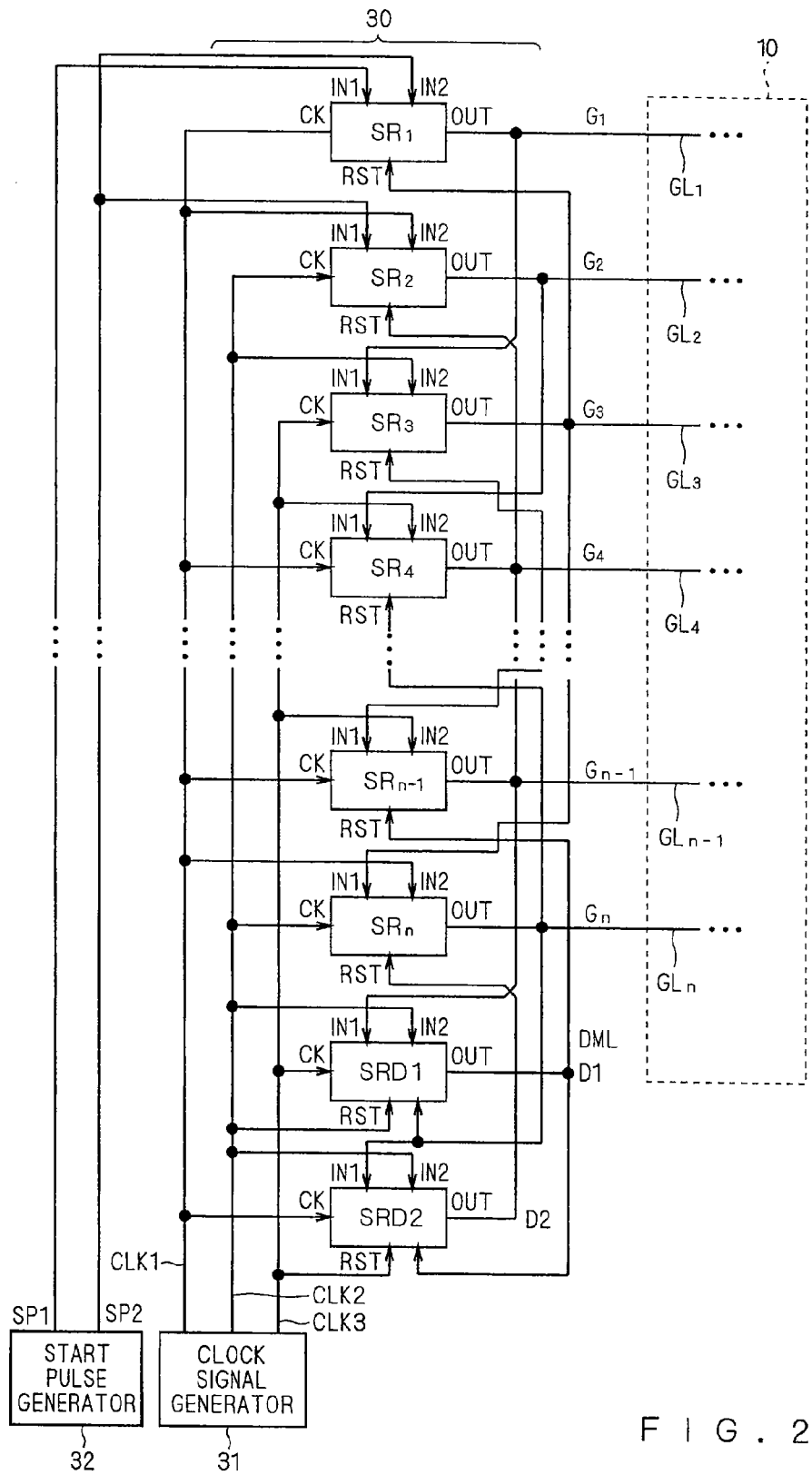
F I G. 2 2

ELECTRO-OPTICAL DEVICE, SHIFT REGISTER CIRCUIT, AND SEMICONDUCTOR DEVICE

CROSS-REFERENCE TO RELATED APPLICATIONS

This application is a divisional of U.S. application Ser. No. 12/705,235, filed Feb. 12, 2010, which is based upon and claims the benefit of priority from prior Japanese Patent Application Nos. 2009-027244, filed Feb. 9, 2009 and 2010-002580, filed Jan. 8, 2010. U.S. application Ser. No. 12/705,235 is incorporated herein by reference.

BACKGROUND OF THE INVENTION

1. Field of the Invention

The present invention relates to an electro-optical device such as an image display device and an image capturing apparatus and more particularly, to a scanning line drive circuit only composed of a same conductivity type field-effect transistor, and a shift register circuit used therein.

2. Description of the Background Art

An electro-optical device having a scanning line drive circuit to scan pixels connected to a scanning line has been widely known. For example, an image display device (referred to as the "display device" hereinafter) such as a liquid crystal display device is configured such that a gate line (scanning line) is provided with respect to each pixel row (pixel line) of a display element (display panel) in which a plurality of pixels are arranged in a form of a matrix, and a display image is updated by sequentially selecting and driving the gate line every horizontal period of a display signal. The gate line drive circuit (scanning line drive circuit) to sequentially select and drive the pixel line, that is, the gate line employs a shift register to perform a shift operation which goes through a cycle for one frame period of the display signal.

In addition, pixels of the imaging elements used in the image capturing apparatus are also arranged in the form of a matrix, and data of a taken image is extracted when the gate line drive circuit scans those pixels. The shift register can be used in the gate line drive circuit of the image capturing apparatus.

The shift register used in the gate line drive circuit is desirably composed of only the same conductivity type field-effect transistor to reduce the number of steps in a production process of the display device. Therefore, various kinds of shift registers composed of only an N-type or P-type field-effect transistor and display devices having them are proposed (in the following Japanese Patent Application Laid-Open Nos. 2000-347628, 2004-78172, 2007-257813, and 2008-287753, for example).

The shift register serving as the gate line drive circuit is composed of a plurality of cascaded shift register circuits each provided in one pixel line, that is, one gate line. In this specification, each of the shift register circuits constituting the gate line drive circuit is referred to as the "unit shift register".

Japanese Patent Application Laid-Open No. 2000-347628 discloses a gate line drive circuit in which a stage (odd driver) to scan pixels in odd rows of multi-stage shift registers, and a stage (even driver) to scan pixels in even rows thereof are arranged so as to sandwich a display element or an imaging element. When the odd driver and the even driver are arranged in such a manner, a region for the gate line drive circuit can be efficiently used.

FIGS. 3 and 4 of the above document show a unit shift register used in the gate line drive circuit and a signal waveform thereof, respectively. In FIG. 3, a start signal IN inputted to a unit shift register RSlo (1) in a first stage of an odd driver 2o is temporally shifted by the unit shift register RSlo (1) and outputted as a selection signal OUT1 of a gate line GL1 of a first row of a liquid crystal display element. The selection signal OUT1 is inputted to a unit shift register RS1e (1) in a first stage of an even driver 2e through the gate line GL1 and temporally shifted by the unit shift register RSle (1), and outputted as a selection signal OUT2 of a gate line GL2 of a second row. The same operation is performed in the unit shift registers in the following stages, so that the gate lines are sequentially selected.

As shown in FIG. 3 of the above document, although the unit shift register in each stage has the same circuit configuration, here, attention is paid to the unit shift register RS1e (1) in the first stage of the even driver 2e. The selection signal OUT2 outputted from the unit shift register RS1e (1) is activated when a clock signal/CK is transmitted to an output terminal by a transistor 204 which is turned on in response to activation of a selection signal OUT of the previous stage (unit shift register RS1o(1)).

While the transistor 204 is turned on when wiring capacitances C2 and C4 of its control electrode is charged by the selection signal OUT1, the selection signal OUT1 outputted from the previous stage is supplied to the unit shift register RS1e(1) through the gate line GL1, so that it is affected by a resistance component and a capacitance component of the gate line GL1. That is, rising speed of the selection signal OUT1 decreases in proportion to a time constant based on the product of a sum of the resistance components and a sum of the capacitance components (this is described in paragraph 0043 in Japanese Patent Application Laid-Open No. 2004-78172).

As a result, since charging speed of the control electrode of the transistor 204 slows down, there is a concern that the control electrode of the transistor 204 is not sufficiently charged when the shift register is operated at high speed. When the control electrode of the transistor 204 is not sufficiently charged, on-resistance of the transistor 204 increases, and charging speed of the output terminal, that is, rising speed of the selection signal OUT2 decreases.

The selection signal OUT2 is supplied to the next stage (unit shift register RS1o (2) of the second stage in the odd driver 2o) through the gate line GL2 and affected by a resistance component and a capacitance component of the gate line GL2 at this time, so that its rising speed further decreases.

When this phenomenon is repeated every time the selection signal is sequentially transmitted to the unit shift register in each stage, the rising speed decreases as the selection signal goes through the latter stages, and the selection signal could not be activated in the middle stage and the selection signal could not be transmitted to the final stage. This problem arises prominently in an electro-optical device having a long gate line such as a display device having a large screen.

SUMMARY OF THE INVENTION

It is an object of the present invention to provide an electro-optical device capable of using a region of a gate line drive circuit efficiently and preventing the rising speed of a gate line selection signal from decreasing (rising delay), and a shift register circuit composed of a single conductivity type transistor which is suitable for the device.

An electro-optical device according to a first aspect of the present invention includes a scanning line drive circuit having an odd driver including a plurality of cascaded unit shift registers to drive odd lines of a plurality of scanning lines, and an even driver including a plurality of cascaded unit shift registers to drive even lines of the plurality of scanning lines. The odd and even drivers are formed on the same substrate as the plurality of pixels and the plurality of scanning lines so as to sandwich the pixels. Each of the unit shift registers of the odd and even drivers has a first input terminal receiving an output signal of the unit shift register positioned in the second previous line and operates so as to activate its own output signal delayed by a scanning period for two lines from an active period of the signal received by the first input terminal. A phase of the output signal of the odd driver is different from a phase of the output signal of the even driver by a scanning period for one line.

An electro-optical device according to a second aspect of the present invention includes a scanning line drive circuit having an odd driver including a plurality of cascaded unit shift registers to drive odd lines of a plurality of scanning lines and capable of switching a shift direction of a signal, and an even driver including a plurality of cascaded unit shift registers to drive even lines of the plurality of scanning lines and capable of switching the shift direction of the signal. The odd and even drivers are formed on the same substrate as the plurality of pixels and the plurality of scanning lines so as to sandwich the pixels. Each of the unit shift registers of the odd and even drivers has a first input terminal receiving an output signal of the unit shift register positioned in the second previous line, and a third input terminal receiving an output signal of the unit shift register positioned in the second next line. Each shift register operates so as to activate its own output signal delayed by a scanning period for two lines from an active period of the signal received by the first input terminal at a time of forward shift, and operates so as to activate its own output signal delayed by the scanning period for two lines from an active period of the signal received by the third input terminal at a time of backward shift. A phase of the output signal of the odd driver is different from a phase of the output signal of the even driver by a scanning period for one line.

According to the electro-optical device of the first and second aspects of the present invention, the odd and even drives are arranged so as to sandwich pixels, whereby the region of the scanning line drive circuit can be used efficiently. In addition, even in such a case, the output signal can be shifted without passing through a gate line. Therefore, the selection signal can be prevented from being delayed in rise because it is not affected by a resistance component and a capacitance component of the gate line.

An electro-optical device according to a third aspect of the present invention includes a scanning line drive circuit having an odd driver including a plurality of cascaded unit shift registers to drive odd lines of the plurality of scanning lines, and an even driver including a plurality of cascaded unit shift registers to drive even lines of the plurality of scanning lines. Each of the unit shift registers of the odd and even drivers includes an output terminal, first and second input terminals, a clock terminal, first and second transistors and a boosting unit, which are described below. The output terminal outputs an output signal of the unit shift register itself. The first input terminal receives an output signal of the unit shift register positioned in the second previous line. The second input terminal receives a first clock signal delayed in phase by a scanning period for one line with respect to the output signal of the unit shift register positioned in the second previous line. The clock terminal receives a second clock signal delayed in phase by the scanning period for one line from the first clock signal. The first transistor supplies the second clock signal to the output terminal. The second transistor supplies the first clock signal to a first node connected to a control electrode of the first transistor. The boosting unit boosts a second node connected to a control electrode of the second transistor to a voltage higher than an amplitude of the first clock signal when the first clock signal is activated following the activation of the signal received by the first input terminal. A phase of the output signal of the odd driver is different from a phase of the output signal of the even driver by a scanning period for one line.

An electro-optical device according to a fourth aspect of the present invention includes a scanning line drive circuit having an odd driver including a plurality of cascaded unit shift registers to drive odd lines of the plurality of scanning lines and capable of switching a shift direction of a signal, and an even driver including a plurality of cascaded unit shift registers to drive even lines of the plurality of scanning lines and capable of switching the shift direction of the signal. Each of the unit shift registers of the odd and even drivers has an output terminal, first to fourth input terminals, a clock terminal, first to third transistors, and first and second boosting units, which are described below. The output terminal outputs an output signal of the unit shift register itself. The first input terminal receives an output signal of the unit shift register positioned in the second previous line. The third input terminal receives an output signal of the unit shift register positioned in the second next line. The second input terminal receives a first clock signal having the same phase as that of an output signal of the unit shift register positioned in the previous line. The fourth input terminal receives a second clock signal having the same phase as that of an output signal of the unit shift register positioned in the next line. The clock terminal receives a third clock signal delayed in phase by the scanning period for one line from the first clock signal at the time of forward shift and delayed in phase by the scanning period for one line from the second clock signal at the time of backward shift. The first transistor supplies the third clock signal to the output terminal. The second transistor supplies the first clock signal to a first node connected to a control electrode of the first transistor. The third transistor supplies the second clock signal to the first node. The first boosting unit boosts a second node connected to a control electrode of the second transistor to a voltage higher than an amplitude of the first clock signal when the first clock signal is activated following the activation of the signal received by the first input terminal at the time of forward shift. The second boosting unit boosts a third node connected to a control electrode of the third transistor to a voltage higher than an amplitude of the second clock signal when the second clock signal is activated following the activation of the signal received by the third input terminal at the time of backward shift. At the time of forward shift, the third transistor of each of the unit shift registers of the odd and even drivers is kept in an off state. At the time of backward shift, the second transistor of each of the unit shift registers of the odd and even drivers is kept in an off state. A phase of the output signal of the odd driver is different from a phase of the output signal of the even driver by a scanning period for one line.

According to the electro-optical device of the third and fourth aspects of the present invention, in each shift register circuit, the boosting unit allows the transistor charging the first node to operate in the unsaturated region. Accordingly, the voltage between the gate and the source of the first transistor can be further increased at high speed. Therefore, even when the frequency of the first clock signal is high, the driving capability of the first transistor, that is, the driving capability of the shift register circuit can be kept high, which contributes to higher speed operation. In addition, even when the odd and even drives are arranged so as to sandwich pixels to use the region of the scanning line drive circuit efficiently, the output signal can be shifted without passing through a gate line. Therefore, the selection signal can be prevented from being delayed in rise because it is not affected by a resistance component and a capacitance component of the gate line.

A shift register circuit according to a fifth aspect of the present invention includes first to fourth input terminals, an output terminal, and a clock terminal, first and second voltage signal terminals supplied with mutually complementary first and second voltage signals, respectively, first to seventh transistors, and first and second MOS capacitor elements. The first transistor supplies a clock signal inputted to the clock terminal to the output terminal. The second transistor supplies the first voltage signal to a first node connected to a control electrode of the first transistor. The third transistor supplies the second voltage signal to the first node. The fourth transistor has a control electrode connected to the first input terminal and supplies the first voltage signal to a second node connected to a control electrode of the second transistor. The first MOS capacitor element is connected between the second input terminal and the second node. The fifth transistor has a control electrode connected to the third input terminal and supplies the second voltage signal to a third node connected to a control electrode of the third transistor. The second MOS capacitor element is connected between the fifth transistor, and the fourth input terminal and the third node. The sixth transistor has a control electrode connected to the first input terminal and supplies the first voltage signal to the first node. The seventh transistor has a control electrode connected to the third input terminal and supplies the second voltage signal to the first node.

According to the shift register circuit of the present invention, since the second or third transistor charging the gate of the first transistor operates in the unsaturated region, the voltage between the gate and the source of the first transistor can be further increased at high speed. Therefore, even when the frequency of the first clock signal is high, the driving capability of the first transistor, that is, the driving capability of the shift register circuit can be kept high, which contributes to higher speed operation.

A semiconductor device according to a sixth aspect of the present invention includes a MOS capacitor element composed of an a-Si (amorphous silicon) transistor. The a-Si transistor serving as the MOS capacitor element has a gate functioning as one terminal of the MOS capacitor element, and at least one current electrode functioning as the other terminal of the MOS capacitor element. The gate length of the a-Si transistor is longer than the gate width thereof.

A semiconductor device according to a seventh aspect of the present invention includes a MOS capacitor element composed of an a-Si (amorphous silicon) transistor. The a-Si transistor serving as the MOS capacitor element has a gate functioning as one terminal of the MOS capacitor element, and two current electrodes having different widths. Only the current electrode having a longer width of the two current electrodes is used as a terminal of the MOS capacitor element.

According to the semiconductor device of the present invention, the a-Si transistor serving as the MOS capacitor element can be high in gate capacitance functioning as the capacitor element and small in channel resistance while keeping its overlap capacitance between the gate and the drain low. Therefore, the power consumption of the MOS capacitor element can be cut and the response speed thereof can be increased.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram showing a configuration of a display device according to the present invention;

FIG. 3 is a circuit diagram of a unit shift register according to the first embodiment;

FIG. 12 is a block diagram showing a configuration of a gate line drive circuit according to a second embodiment;

FIG. 14 is a circuit diagram of a unit shift register according to a third embodiment;

FIG. 22 is a block diagram showing a configuration of a gate line drive circuit according to an eighth embodiment.

DESCRIPTION OF THE PREFERRED EMBODIMENTS

Figure 2:
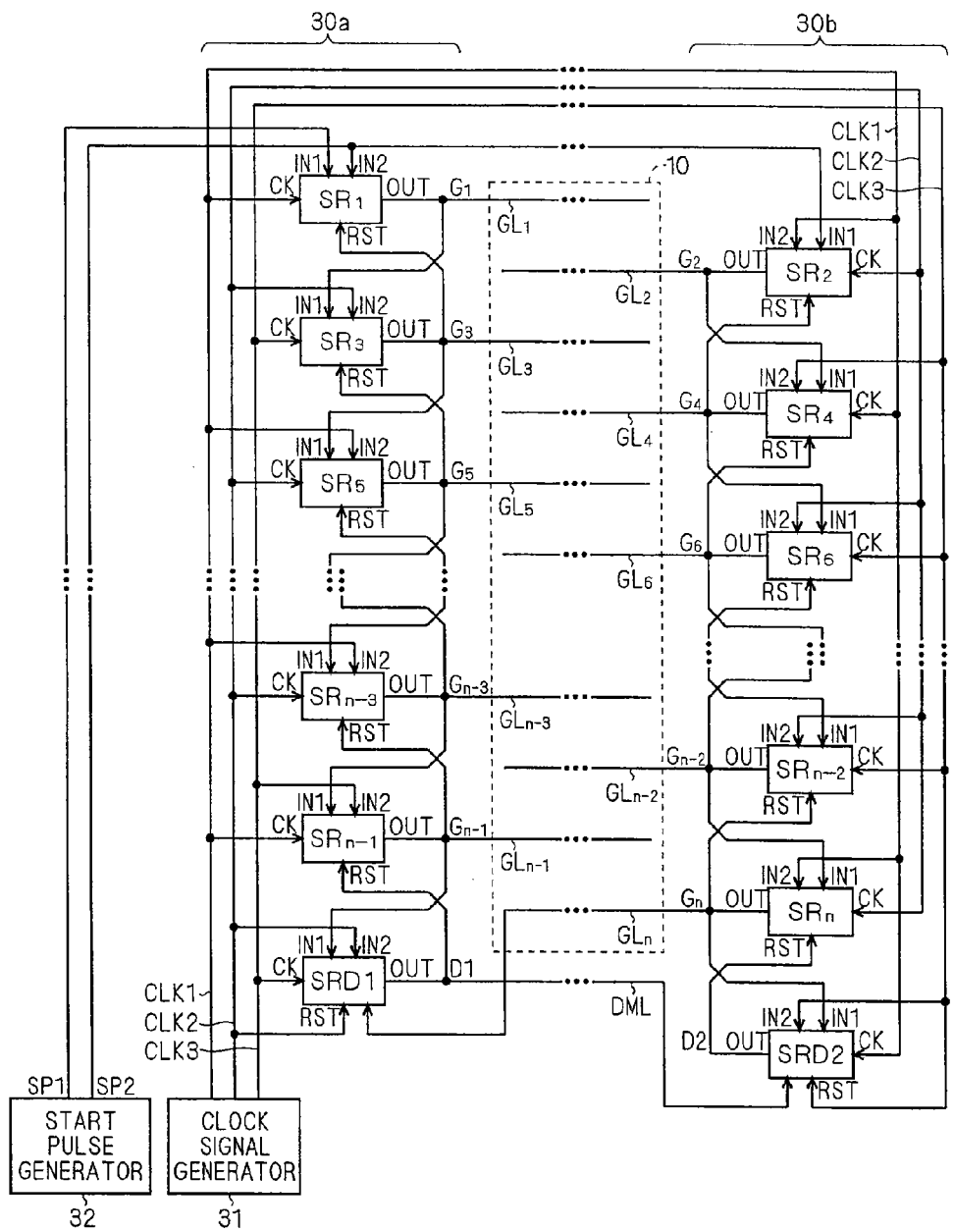
FIG. 2 is a block diagram showing a configuration of a gate line drive circuit according to a first embodiment.

Embodiments of the present invention will be described hereinafter with reference to the drawings. In addition, to avoid the description from being reduplicated and redundant, the same reference is allocated to a component having the same or corresponding function in the drawings.

In addition, a transistor used in each embodiment is an insulated gate field-effect transistor. In the insulated gate field-effect transistor, electric conductivity between a drain region and a source region in a semiconductor layer is controlled by an electric field in a gate insulating film. The semiconductor layer in which the drain region and the source region are formed may be made of an organic semiconductor such as polysilicon, amorphous silicon, and pentacene, and an oxide semiconductor such as single-crystal silicon or IGZO (In—Ga—Zn—O).

As is well known, a transistor has at least three electrodes including a control electrode (gate (electrode) in a more limited sense), one current electrode (drain (electrode) or source (electrode) in a more limited sense), and the other current electrode (source (electrode) or drain (electrode) in a more limited sense). The transistor functions as a switching element in which a channel is formed between the drain and source when a predetermined voltage is applied to the gate. The drain and the source of the transistor have the same structure basically, and their names are switched depending on an applied voltage condition. For example, in a case of an N-type transistor, an electrode having a relatively high potential (also referred to as the "level" hereinafter) is called the drain, and an electrode having a relatively low potential is called the source (vice versa in a case of a P-type transistor).

Those transistors may be formed on a semiconductor substrate, and may be a thin film transistor (TFT) formed on an insulating substrate such as glass unless otherwise stated. The substrate on which the transistor is formed may be a single-crystal substrate or an insulating substrate such as SOI, glass, and a resin.

A gate line drive circuit according to the present invention only uses a single conductivity type transistor. For example, the N-type transistor becomes the active state (on state, or conductive state) when the voltage between the gate and the source becomes the H (high) level which is higher than the threshold voltage of the transistor, and becomes the inactive state (off state, or non-conductive state) when the voltage between them becomes the L (low) level which is lower than the above threshold voltage. Therefore, in a circuit using the N-type transistor, the H level of a signal is the "active level" and the L level thereof is the "inactive level". In addition, each node of the circuit using the N-type transistor changes from the inactive level to the active level when charged to the H level, and changes from the active level to the inactive level when discharged to the L level.

On the other hand, the P-type transistor becomes the active state (on state, or conductive state) when the voltage between the gate and the source becomes the L level which is lower than the threshold voltage (a negative value based on the source) of the transistor, and becomes the inactive state (off state, or non-conductive state) at the high level which is higher than the above threshold voltage. Therefore, in a circuit using the P-type transistor, the L level of a signal is the "active level" and the H level thereof is the "inactive level". In addition, each node of the circuit using the P-type transistor changes from the inactive level to the active level when charged to the L level, and changes from the active level to the inactive level when discharged to the H level, which is opposite in relationship between charge and discharge to the case of the N-type transistor.

In this specification, the change from the inactive level to the active level and the change from the active level to the inactive level are defined as "pull-up" and "pull-down", respectively. In other words, the change from the L level to the H level and the change from the H level to the L level in the circuit using the N-type transistor are defined as "pull-up" and "pull-down", respectively, and the change from the H level to the L level and the change from the L level to the H level in the circuit using the P-type transistor are defined as "pull-up" and "pull-down", respectively.

Furthermore, in this specification, a description is made assuming that the "connection" between two elements, two nodes, or one element and one node includes a state which is equivalent to substantially direct connection even when the connection is provided through another element (element or switch). For example, even when the two elements are connected through the switch, the two elements are described as being "connected" as long as they can function similarly to the case where they are directly connected.

In the present invention, clock signals (multiphase clock signals) having different phases are used. Hereinafter, to simplify the description, a predetermined interval is provided between the active period of one clock signal and the active period of another signal to be activated next (interval between times $t_2$ and $t_3$ in FIG. 4, for example). However, the above interval may not be provided as long as the active period of each clock signal does not overlap substantially in the present invention. For example, when the active level is the H level, the falling timing of one clock signal may coincide with the rising timing of the next clock signal.

First Embodiment

FIG. 1 is a schematic block diagram showing a configuration of a display device according to the present invention, and shows an entire configuration of a liquid crystal display device as a representative example of the display device. In addition, the present invention is not limited to the liquid crystal display device, and it may be widely applied to display devices to convert an electric signal to brightness of light, such as an electroluminescence (EL), organic EL, plasma display, and electronic paper, or electro-optical devices to convert intensity of light to an electric signal, such as an image capturing apparatus (imaging sensor).

A liquid crystal display device 100 includes a liquid crystal array section 10, a gate line drive circuit 30, and a source driver 40. The liquid crystal array section 10 includes a plurality of pixels 15 arranged in the form a matrix. Gate lines $GL_1$, $GL_2$ . . . (referred to as the "gate line GL" collectively) are provided for rows of the pixels (also referred to as the "pixel line" hereinafter), respectively, and data lines $DL_1$, $DL_2$, . . . (referred to as the "data line DL" collectively) are provided for columns of the pixels (also referred to as the "pixel column" hereinafter), respectively. More specifically, the pixel 15 is formed in the vicinity of the cross point between the gate line GL and the data line DL which intersect at right angles to each other. FIG. 1 shows the pixels 15 in the first and second columns along the first row, and corresponding gate lines $GL_1$ and $GL_2$, and the data lines $DL_1$ and $DL_2$, representatively.

Each pixel 15 has a pixel switch element 16 provided between the corresponding data line DL and a pixel node Np, and a capacitor 17 and a liquid crystal display element 18 connected in parallel between the pixel node Np and a common electrode node Nc. The orientation of the liquid crystal in the liquid crystal display element 18 changes based on a voltage difference between the pixel node Np and the common electrode node Nc, and accordingly, the display brightness of the liquid crystal display 18 changes. Thus, the brightness of the pixel can be controlled by a display voltage transmitted through the data line DL and the pixel switch element 16. That is, intermediate brightness can be obtained by applying an intermediate voltage difference between a voltage difference corresponding to a maximum brightness and a voltage difference corresponding to a minimum brightness, to between the pixel node Np and the common electrode node Nc. Therefore, gradational brightness can be obtained by setting the above display voltage in stages.

The gate line drive circuit 30 is composed of an odd gate line drive circuit (odd driver) 30a to drive the gate lines $GL_1$, $GL_3$, $GL_5$ . . . in the odd rows, and an even gate line drive circuit (even driver) 30b to drive the gate lines $GL_2$, $GL_4$, $GL_6$ . . . in the even rows, and sequentially selects and activates the gate lines GL, based on a predetermined scanning cycle. The gate electrode of the pixel switch element 16 is connected to the corresponding gate line GL. While the specific gate line GL is selected, the pixel switch element 16 is in the conductive state in the pixel connected thereto and the pixel node Np is connected to the corresponding data line DL. Thus, the display voltage transmitted to the pixel node Np is kept in the capacitor 17. In general, the pixel switch element 16 is composed of a TFT formed on the same insulating substrate (glass substrate, resin substrate, and the like) as the liquid crystal display element 18.

The source driver 40 outputs the display voltage set in stages by a display signal SIG serving as an N-bit digital signal to the data line DL. Here, as one example, it is assumed that the display signal SIG is a 6-bit signal composed of display signal bits DB0 to DB5. Based on the 6-bit display signal SIG, gradation display in $2^6=64$ stages can be provided in each pixel. Furthermore, when one color display unit is formed of three pixels of R (Red), G (Green), and B (Blue), about 260,000 colors can be displayed.

In addition, as shown in FIG. 1, the source driver 40 is composed of a shift register 50, data latch circuits 52 and 54, a gradational voltage generation circuit 60, a decode circuit 70, and an analog amplifier 80.

The display signal bits DB0 to DB5 corresponding to the display brightness of each pixel are serially generated in the display signal SIG. That is, the display signal bits DB0 to DB5 at each timing show the display brightness in one pixel 15 in the liquid crystal array section 10.

The shift register 50 orders the data latch circuit 52 to load the display signal bits DB0 to DB5 at a timing synchronized with a cycle when the setting of the display signal SIG is switched. The data latch circuit 52 sequentially loads the serially generated display signal SIG and stores the display signal SIG for the one pixel line.

A latch signal LT inputted to the data latch circuit 54 is activated when the display signal SIG for the one pixel line is loaded by the data latch circuit 52. In response to this, the data latch circuit 54 loads the display signal SIG for the one pixel line stored in the data latch circuit 52.

The gradational voltage generation circuit 60 is composed of 63 voltage dividing resistors connected between a high voltage VDH and a low voltage VDL in series, and generates 64-stage gradational voltages V1 to V64.

The decode circuit 70 decodes the display signal SIG stored in the data latch circuit 54, and selects the voltage from the gradational voltages V1 to V64 based on the above decoded result and outputs it to the decode output nodes $Nd_1$, $Nd_2$ . . . (referred to as the "decode output node Nd" correctively).

As a result, the display voltage (one of the gradational voltages V1 to V64) corresponding to the display signal SIG for the one pixel line stored in the data latch circuit 54 is outputted to the decode output node Nd at the same time (in parallel). In addition, in FIG. 1, the decode output nodes $Nd_1$ and $Nd_2$ corresponding to the data lines $DL_1$ and $DL_2$ in the first and second columns, respectively are representatively shown.

The analog amplifier 80 amplifies a current of an analog voltage corresponding to the display voltage outputted from the decode circuit 70 to each of the decode output nodes $Nd_1$, $Nd_2$ . . . and outputs it to each of the data lines $DL_1$, $DL_2$ . . . .

The source driver 40 repeatedly outputs the display voltage corresponding to the series of display signal SIG to the data line DL with respect to each pixel line, based on a predetermined scanning cycle, and the gate line drive circuit 30 sequentially drives the gate lines $GL_1$, $GL_2$ . . . in synchronization with the scanning cycle, whereby an image is displayed in the liquid crystal array section 10 based on the display signal SIG.

In addition, while FIG. 1 illustrates the configuration of the liquid crystal display device 100 in which the gate line drive circuit 30 and the source driver 40 are integrated with the liquid crystal array section 10, as another configuration, the gate line drive circuit 30 and the liquid crystal array section 10 may be formed integrally and the source driver 40 may be provided as an external circuit outside the liquid crystal array section 10, or both of the gate line drive circuit 30 and the source driver 40 may be provided as external circuits outside the liquid crystal array section 10.

FIG. 2 is a drawing showing a configuration of the gate line drive circuit 30 according to the present invention. The gate line drive circuit 30 has unit shift registers $SR_1$, $SR_2$, $SR_3$ . . . (the unit shift registers $SR_1$, $SR_2$, $SR_3$ . . . are also referred to as the "unit shift register SR" collectively) provided with respect to each pixel line, that is, each gate line GL.

As described above, the gate line drive circuit 30 includes the odd driver 30a and the even driver 30b. The odd driver 30a includes the cascaded unit shift registers $SR_1$, $SR_3$, $SR_5$ . . . to drive the gate lines $GL_1$, $GL_3$, $GL_5$ . . . in the odd rows. The even driver 30b includes the cascaded unit shift registers $SR_2$, $SR_4$, $SR_6$ . . . to drive the gate lines $GL_2$, $GL_4$, $GL_6$ . . . in the even rows. More specifically, in each of the odd driver 30a and the even driver 30b, when viewed from a kth-stage unit shift register $SR_k$, a "previous stage" means a unit shift register $SR_{k-2}$ in the second previous row, and a "next stage" means a unit shift register $SR_{k+2}$ in the second next row.

The odd driver 30a according to this embodiment is provided with a dummy unit shift register SRD1 (referred to as the "first dummy stage" hereinafter) connected to a dummy gate line DML which does not drive the pixel, at the next stage of the last-stage unit shift register $SR_{n-1}$. On the other hand, the even driver 30b according to this embodiment is provided with a dummy unit shift register SRD2 (referred to as the "second dummy stage" hereinafter) which is not connected to the gate line, at the next stage of the last-stage unit shift register $SR_n$. The first and second dummy stages SRD1 and SRD2 have the same circuit configuration as the other unit shift register SR basically, and their detailed configurations will be described below.

In addition, a clock signal generator 31 shown in FIG. 2 supplies three clock signals CLK1, CLK2, and CLK3 having different phases from each other, to the unit shift registers SR in the gate line drive circuit 30. The active periods of the clock signals CLK1 to CLK3 do not overlap with each other and the CLK1, CLK2, CLK3, CLK1, CLK2 . . . are controlled so as to be repeatedly activated in this order at the timing synchronized with the scanning cycle of the display device.

Each unit shift register SR has a first input terminal IN1, a second input terminal IN2, an output terminal OUT, a clock terminal CK, and a reset terminal RST. As shown in FIG. 2, the clock terminal CK of each unit shift register SR is supplied with a predetermined one of the clock signals CLK1, CLK2, and CLK3 outputted from the clock signal generator 31.

More specifically, the clock signal CLK1 is supplied to the unit shift registers $SR_1$, $SR_4$, $SR_7$ ... which drive the gate lines $GL_{3m-2}$ in the [3m−2]th rows (m is a natural number and the same is applied hereinafter). The clock signal CLK2 is supplied to the unit shift registers $SR_2$, $SR_5$, $SR_8$ ... which drive the gate lines $GL_{3m-1}$ in the [3m−1]th rows. The clock signal CLK3 is supplied to the unit shift registers $SR_3$, $SR_6$, $SR_9$ ... which drive the gate lines $GL_{3m}$ in the [3m]th rows. Since the clock signals CLK1, CLK2, and CLK3 are activated in this order, the clock terminals CK of the shift registers $SR_1$, $SR_2$, $SR_3$ ... are activated in this order.

In addition, since the number of scanning lines of the general display device is not multiples of three, in the shift register controlled by the three clock signals CLK1 to CLK3, the clock signal supplied to the clock terminal CK of the last unit shift register $SR_n$ in the last nth row (the last stage of the even driver 30b) differs depending on the number of the scanning lines of the display device. In FIG. 2, the clock signal CLK2 is supplied to the clock terminal CK of the unit shift register $SR_n$. Therefore, the clock signals CLK3 and CLK1 are supplied to the clock terminals CK of the first and second dummy stages SRD1 and SRD2, respectively.

First and second start pulses SP1 and SP2 are inputted to the first and second input terminals IN1 and IN2 of the unit shift register $SR_1$ in the first row (first stage of the odd driver 30a), respectively. According to this embodiment, while both of the first and second start pulses SP1 and SP2 are activated (become the H level) at the timing corresponding to the head of each frame period of the image signal, the second start pulse SP2 is delayed in phase with respect to the first start pulse SP1 by one horizontal period (1H), that is, by the scanning period for the one line.

Therefore, the first start pulse SP1 becomes the H level earlier than the second start pulse SP2, and the second start pulse SP2 is controlled so as to become the H level after the first start pulse SP1 has returned to the L level. Here, it is assumed that the first start pulse SP1 has the same phase as the clock signal CLK2, and the second pulse SP2 has the same phase as the clock signal CLK3 (refer to FIG. 4).

In addition, the second start pulse SP2 is inputted to the first input terminal IN1 of the unit shift register $SR_2$ in the second row (first stage of the even driver 30b). Then, the clock signal CLK1 activated after one horizontal period has elapsed from the second start pulse SP2 is inputted to the second input terminal IN2 thereof.

In the unit shift register $SR_k$ after the third row, the first input terminal IN1 is connected to the output terminal OUT of the unit shift register $SR_{k-2}$ positioned in the second previous row thereof (the previous stage in the odd driver 30a or the even driver 30b). In addition, the second input terminal IN2 is supplied with the clock signal delayed in phase by one horizontal period with respect to the signal inputted to the first input terminal IN1 (outputted from the unit shift register $SR_{k-2}$) (this is advanced in phase by one horizontal period with respect to the one supplied to the clock signal CK).

Similarly, in the first and second dummy stages SRD1 and SRD2, the first input terminal IN1 of the first dummy stage SRD1 is supplied with an output signal $G_{n-1}$ of the unit shift register $SR_{n-1}$ positioned in the second previous row, and the second input terminal IN2 thereof is supplied with the clock signal CLK2 delayed in phase by one horizontal period with respect to the output signal $G_{n-1}$. In addition, the first input terminal IN1 of the second dummy stage SRD2 is supplied with an output signal $G_n$ of the unit shift register $SR_n$ positioned in the second previous row, and the second input terminal IN2 thereof is supplied with the clock signal CLK3 delayed in phase by one horizontal period with respect to the output signal G.

The reset terminal RST of the unit shift register $SR_k$ is connected to the output terminal OUT of the unit shift register $SR_{k+2}$ positioned in the second next row (the next row in the odd driver 30a or the even driver 30b) (the reset terminal RST may be connected to the output terminal OUT of the unit shift register $SR_{k+1}$ positioned in the next row, but it is preferable that it is connected to the output terminal OUT of the unit shift register $SR_{k+2}$ positioned in the second next row. This reason will be described below).

The reset terminal RST of the unit shift register $SR_{n-1}$ in the next-to-last row (last stage of the odd driver 30a) is connected to the output terminal OUT of the first dummy stage SRD1 positioned in the second next row. In addition, the reset terminal RST of the last unit shift register $SR_n$ (last stage of the even driver 30b) is connected to the output terminal OUT of the second dummy stage SRD2.

Furthermore, the reset terminal RST of the first dummy stage SRD1 is supplied with the clock signal CLK2 delayed in phase by two horizontal periods with respect to the clock signal CLK3 supplied to the clock terminal CK. The reset terminal RST of the second dummy stage SRD2 is supplied with the clock signal CLK3 delayed in phase by two horizontal periods with respect to the clock signal CLK1 supplied to the clock terminal CK.

As described above, the output signal $G_k$ outputted from the output terminal OUT of the unit shift register $SR_k$ is supplied to the corresponding gate line $GL_k$ as a selection signal (vertical (or horizontal) scanning pulse), and also supplied to the first input terminal IN1 of the unit shift register $SR_{k+2}$ in the second next row and to the reset terminal RST of the unit shift register $SR_{k-2}$ in the second previous row. Hereinafter, the output signal G of the unit shift register SR is referred to as the "selection signal".

FIG. 3 is a circuit diagram showing a configuration of the unit shift register according to the first embodiment of the present invention. Since the configuration of the unit shift register SR of the gate line drive circuit 30 is substantially the same, the unit shift register $SR_k$ in the kth row is representatively shown. As all transistors of the unit shift register $SR_k$ according to this embodiment are the same conductivity type field-effect transistors, it is assumed that the N-type TFT is used in the following embodiments and variation.

Figure 6:
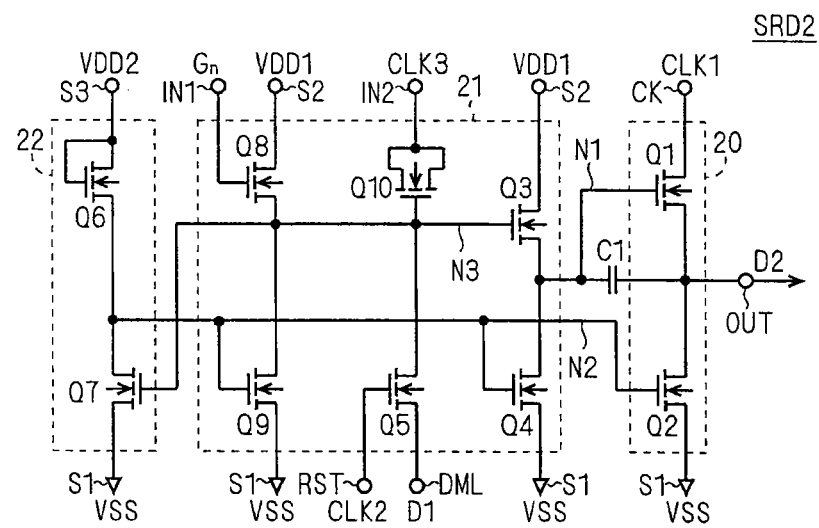
FIG. 6 is a circuit diagram of a dummy unit shift register (second dummy stage) in an even driver according to the first embodiment.

The unit shift register $SR_k$ shown in FIG. 3 is provided by applying the circuit in FIG. 6 in Japanese Patent Application Laid-Open No. 2007-257813 according to the idea of the inventor of this application, to the present invention. The unit shift register $SR_k$ has a first power supply terminal S1 supplied with a low potential side power supply potential (low side power supply potential) VSS and second and third power supply terminals S2 and S3 supplied with high potential side power supply potentials (high side power supply potentials) VDD1 and VDD2, respectively, as well as the first and second input terminals IN1 and IN2, the output terminal OUT, the clock terminal CK and the reset terminal RST shown in FIG. 2.

The high side power supply potentials VDD1 and VDD2 may be at the same level. The description will be made assuming that the low side power supply potential VSS is set to a reference potential (VSS=0V) of the circuit, but in practice, the reference potential is set based on the voltage of data to be written in the pixel, and the high side power supply potentials VDD1 and VDD2 are set to 17 V and the low side power supply potential VSS is set to −12 V, for example.

The unit shift register $SR_k$ is composed of an output circuit 20, a pull-up drive circuit 21, and a pull-down drive circuit 22. The output circuit 20 activates and inactivates the selection signal $G_k$ outputted from the unit shift register $SR_k$, and includes a transistor Q1 (output pull-up transistor) which puts the selection signal $G_k$ into the active state (H level) while the gate line $GL_k$ is selected and a transistor Q2 (output pull-down transistor) which keeps the selection signal $G_k$ in the inactive state (L level) while the gate line $GL_k$ is not selected.

The transistor Q1 is connected between the output terminal OUT and the clock terminal CK, and activates the selection signal $G_k$ by supplying the clock signal inputted to the clock terminal CK to the output terminal OUT. In addition, the transistor Q2 is connected between the output terminal OUT and the first power supply terminal S1, and keeps the selection signal $G_k$ at the inactive level by discharging the output terminal OUT to the potential VSS. Here, a node connected to the gate (control electrode) of the transistor Q1 is defined as a "node N1" and a node connected to the gate of the transistor Q2 is defined as a "node N2".

A capacitor element C1 is provided between the gate and the source of the transistor Q1 (that is, between the output terminal OUT and the node N1). This capacitor element C1 capacitively couples the output terminal OUT with the node N1 to enhance a boost effect of the node N1 associated with the elevation in level of the output terminal OUT. Here, it is to be noted that the capacitor element C1 can be replaced with the transistor Q1 when the capacitance between the gate and the channel is sufficiently high, so that it may be omitted in that case.

In general, since a thickness of an insulating film serving as a dielectric layer of a capacitor element is the same as that of a gate insulating film of a transistor in one semiconductor integrated circuit, the capacitor element can be replaced with the transistor having the same gate area as that of the capacitor element when the capacitor element is substituted with the gate capacitance of the transistor. Thus, when the capacitor element C1 shown in FIG. 3 is replaced with the capacitance between the gate and the channel of the transistor Q1, the gate width of the transistor Q1 is to be increased by a corresponding amount.

The pull-up drive circuit 21 drives the transistor Q1 (output pull-up transistor), and puts the transistor Q1 in the on state while the gate line $GL_k$ is selected, and puts the transistor Q1 in the off state while it is not selected. The pull-up drive circuit 21 charges the node N1 (the gate of the transistor Q1) in response to the activation of the selection signal $G_{k-2}$ inputted from the second previous row to the first input terminal IN1 (or the first or second start pulse SP1 or SP2) and the clock signal (CLK1, CLK2, or CLK3) inputted to the second input terminal IN2, and discharges the node N1 in response to the activation of the selection signal $G_{k+2}$ in the second next row, serving as the reset signal supplied to the reset terminal RST (or the output signal D1 or D2 of the first dummy stage SRD1 or the second dummy stage SRD2).

The pull-up drive circuit 21 is composed of transistors Q3 to Q5 and Q8 to Q10. The transistor Q3 is connected between the node N1 and the second power supply terminal S2, and supplies the potential of the second power supply terminal S2 to the node N1. Here, a node connected to the gate of the transistor Q3 is defined as a "node N3".

The transistor Q4 is connected between the node N1 and the first power supply terminal S1, and its gate is connected to the node N2. The transistor Q8 is connected between the node N3 and the second power supply terminal S2, and its gate is connected to the first input terminal IN1. In addition, the drain of the transistor Q8 may be connected to the first input terminal IN1 (that is, the transistor Q8 may be diode-connected between the first input terminal IN1 and the node N3).

The transistor Q10 has a gate connected to the node N3 and two current electrodes (source and drain) connected to the second input terminal IN2. The field-effect transistor is an element which is turned on when the drain and source thereof are electrically connected through the conductive channel formed just under the gate electrode through the gate insulating film in the semiconductor substrate when a voltage higher than the threshold voltage is applied to the gate electrode. Therefore, the on-state field-effect transistor has certain electrostatic capacitance (gate capacitance) between the gate and the channel. That is, it can function as a capacitor element in which the channel in the semiconductor substrate and the gate electrode serve as both terminals and the gate insulating film serves as a dielectric layer. Therefore, the transistor Q10 selectively serves as the capacitor element based on the voltage between the node N3 and the second input terminal IN2 (functions as the capacitor element only while the node N3 is at the H level).

In addition, since the second start pulse SP2 supplied to the second input terminal IN2 of the unit shift register $SR_1$ in the first row is activated only once for one frame period, it does not necessarily serve as the capacitor element selectively (or may always function as the capacitor element). Therefore, a usual capacitor element may be used instead of the MOS capacitor element (transistor Q10) in the unit shift register $SR_1$.

The transistor Q5 is connected between the node N3 and the first power supply terminal S1, and its gate is connected to the reset terminal RST. The transistor Q9 is connected between the node N3 and the first power supply terminal S1, and its gate is connected to the node N2.

On the other hand, the pull-down drive circuit 22 drives the transistor Q2 (output pull-down transistor) and its input end is the node N3 and its output end is the node N2 (the gate of the transistor Q2). That is, the pull-down drive circuit 22 charges/discharges the node N2 in response to the level change of the node N3. More specifically, it discharges the node N2 when the node N3 becomes the H level, and charges the node N2 when the node N3 becomes the L level. Thus, the transistor Q2 is in the off state while the gate line $GL_k$ is selected and in the on state while it is not selected. In addition, as described above, the node N2 serving as the output end of the pull-down drive circuit 22 is connected to the gates of the transistors Q4 and Q9 in the pull-up drive circuit 21.

The pull-down drive circuit 22 is composed of transistors Q6 and Q7 connected in series between the third power supply terminal S3 and the first power supply terminal S1. The transistor Q6 is connected between the node N2 and the third power supply terminal S3 and its gate is connected to the third power supply terminal S3 (that is, the transistor Q6 is diode-connected). The transistor Q7 is connected between the node N2 and the first power supply terminal S1 and its gate is connected to the node N3.

The transistor Q7 is set such that its on-resistance is sufficiently small (that is, driving capability is high) as compared with the transistor Q6. Therefore, when the gate (node N3) of the transistor Q7 becomes the H level and the transistor Q7 is turned on, the node N2 is discharged to the L level, while when the node N3 becomes the L level and the transistor Q7 is turned off, the node N2 becomes the H level.

That is, the pull-down drive circuit 22 serves as a ratio-type inverter whose operation is defined by a ratio between the on-resistance values of the transistor Q6 and the transistor Q7. In this inverter, the transistor Q6 functions as a load element, and the transistor Q7 functions as a drive element.

A description will be made of a specific operation of the unit shift register SR according to this embodiment. Since the operations of each of the unit shift registers SR and the dummy stage SRD in the gate line drive circuit 30 are substantially the same, the operation of the unit shift register $SR_k$ in the kth row will be described representatively. It is assumed that the clock signal CLK1 is inputted to the clock terminal CK in the unit shift register $SR_k$ (for example, this corresponds to the unit shift registers $SR_1$, $SR_4$ ... at 3m−2 stages in FIG. 2).

To simplify the description, it is assumed that potentials at the H level of the clock signals CLK1 to CLK3, and the first and second start pulses SP1 and SP2 are all the same and the level is set to VDD unless otherwise stated. In addition, the VDD is also equal to the levels of the high side power supply potentials VDD1 and VDD2 (that is, VDD=VDD1=VDD2). In addition, potentials at the L level of the clock signals CLK1 to CLK3, and the first and second start pulses SP1 and SP2 are equal to the low side power supply potential VSS and their potentials are set to 0V (VSS=0). Furthermore, it is assumed that the threshold voltages of the transistors are all equal to each other, and its value is set to Vth. Still furthermore, the clock signals CLK1 to CLK3 are repetition signals having phase differences of one horizontal period (1H) as shown in FIG. 4).

Figure 4:
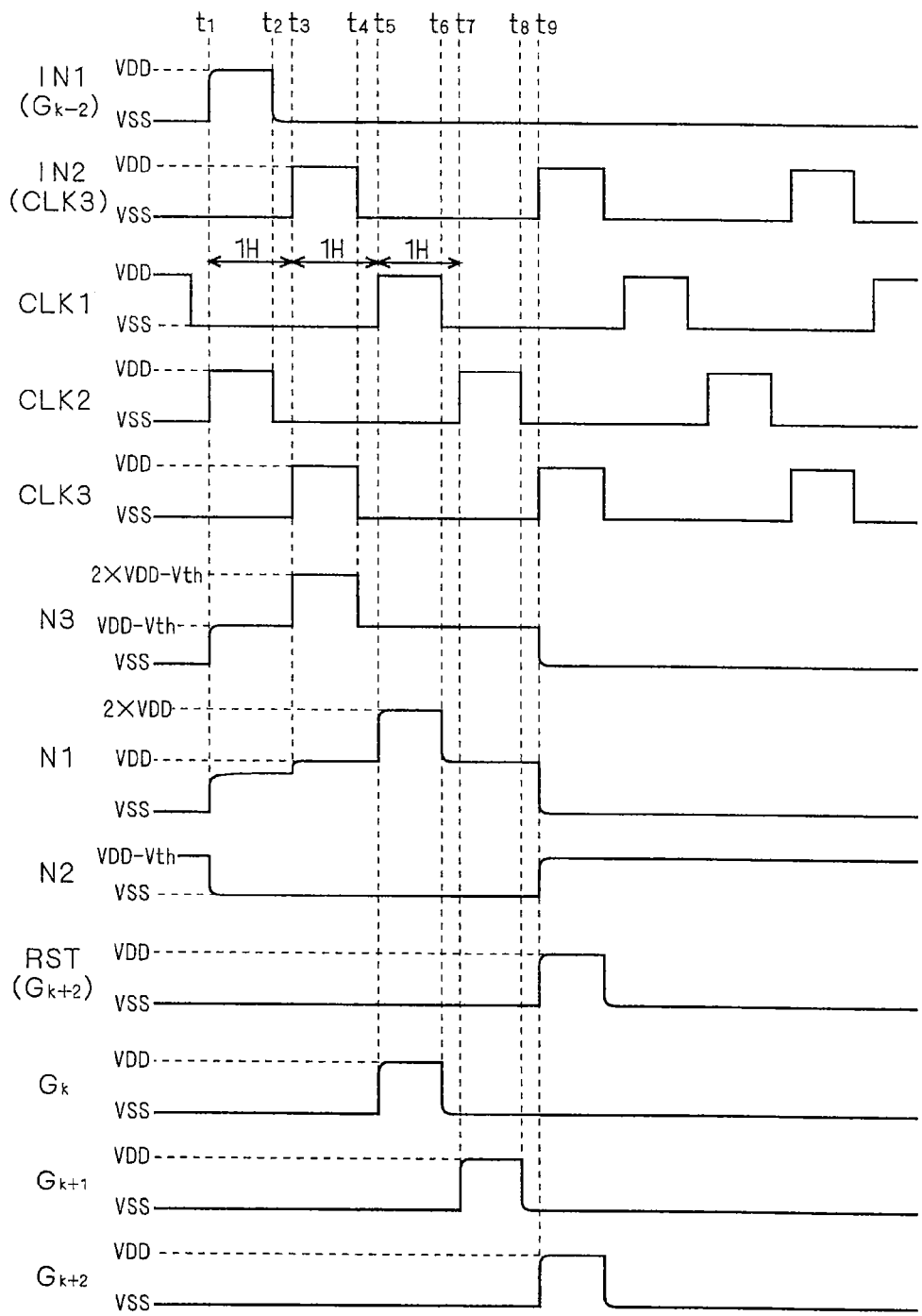
FIG. 4 is a timing chart to describe an operation of the unit shift register according to the first embodiment.

FIG. 4 is a timing chart to describe the operation of the unit shift register according to the first embodiment. The operation of the unit shift register $SR_k$ will be described with reference to the drawing.

It is assumed that as an initial state, the nodes N1 and N3 are at the L level (VSS), and the node N2 is at the H level (VDD−Vth) (this state is referred to as the "reset state" hereinafter). In addition, it is assumed that the first input terminal IN1 (selection signal $G_{k−2}$ in the second previous row), the second input terminal IN2 (clock signal CLK3), the clock terminal CK (clock signal CLK1), and the reset terminal RST (selection signal $G_{k+2}$ in the second next row) are all at the L level.

Since the transistor Q1 is in the off state (cut-off state) and the transistor Q2 is in the on state (conductive state) in the reset state, the output terminal OUT (selection signal $G_k$) is kept at the L level regardless of the level of the clock terminal CK (clock signal CLK1). That is, in this initial state, the gate line $GL_k$ corresponding to the unit shift register $SR_k$ is in the unselected state.

When the selection signal $G_{k−2}$ in the second previous row (the first start pulse SP1 in the case of the unit shift register $SR_1$ in the first row) becomes the H level at a time $t_1$ from the above state, the transistor Q8 of the unit shift register $SR_k$ is turned on. At this time, the transistor Q9 is also on because the node N2 is at the H level, but since the on-resistance of the transistor Q8 is set so as to be sufficiently lower than that of the transistor Q9, the node N3 is charged with electric charges supplied through the transistor Q8 and its level rises. That is, the transistor Q8 functions as a charge circuit to charge the node N3 connected to the gate of the transistor Q3, based on the signal inputted to the first input terminal IN1.

When the level of the node N3 rises, the transistor Q7 becomes conductive and the level of the node N2 falls. This causes the resistance of the transistor Q9 to increase and the level of the node N3 rises rapidly. Accordingly, the transistor Q7 is sufficiently turned on. As a result, the node N2 becomes the L level (VSS), and the transistor Q9 is turned off, and the node N3 becomes the H level.

It is necessary to charge the capacitances between the gates and the channels (gate capacitances) of the transistor Q10 and transistor Q3 to raise the level of the node N3, but since their capacitance values are as small as about one-fifth to one-tenth of the gate capacitance of the transistor Q1 of the output circuit 20 and the capacitor element C1, the node N3 can be charged at high speed. Therefore, the level of the node N3 rises to a theoretical value at high speed even though the transistor Q8 operates in a source follower mode in which it is no good at high-speed charging. That is, a potential V3a of the node N3 after charged by the transistor Q8 is as follows.

$$V3a = VDD - Vth \quad (1)$$

When the node N3 becomes the H level, the transistor Q3 is turned on in response to it. At this time, since the node N2 is at the L level, the transistor Q4 is in the off state and the level of the node N1 rises.

It is necessary to charge the capacitor element C1 and the gate capacitance of the transistor Q1 in order to raise the level of the node N1, but since their capacitance values are relatively great as described above, it is difficult to charge the node N1 at high speed. Furthermore, since the transistor Q3 operates in the source follower mode, it is difficult to raise the level of the node N1 to a theoretical value (VDD−2×Vth) for a short time. Therefore, when a pulse width of the selection signal $G_{k−2}$ in the second previous row is not sufficiently large, the level of the node N1 at that time only rises to a level lower than the theoretical value.

When the selection signal $G_{k−2}$ in the second previous row returns to the L level at a time $t_2$, the nodes N1 and N3 become a floating state while the transistor Q8 is turned off, and the transistors Q7 and Q9 serve as flip-flop elements, so that the levels of the nodes N1 and N3 are maintained.

Then, when the clock signal CLK3 (the second start pulse SP2 in the case of the unit shift register $SR_1$ in the first row) becomes the H level at a time $t_3$, the second input terminal IN2 of the unit shift register $SR_k$ becomes the H level. At this time, since the node N3 is at the H level, a channel is formed between the source and the drain (on the side of IN2) of the transistor Q10. Therefore, the transistor Q10 serves as the capacitor element, and the node N3 is boosted by the capacitive coupling through it. That is, the transistor Q10 functions as a booster circuit in which the charged node N3 is boosted, based on the signal inputted to the first input terminal IN1.

When it is assumed that the parasitic capacitance of the node N3 is sufficiently lower than the capacitance value of the transistor Q10 serving as the MOS capacitor element, the node N3 after boosted by the transistor Q10 rises from the potential V3a before boosted by the amplitude VDD of the clock signal CLK3. That is, the potential V3b of the node N3 after boosted is as follows.

$$V3b = 2 \times VDD - Vth \quad (2)$$

Additionally, since the node N3 is boosted according to the clock signal CLK3 which is an external signal having high rising speed, the rising speed of the potential of the node N3 is as high as the rising speed of the clock signal CLK3.

When the node N3 is boosted, the voltage between the gate (node N3) and the source (node N1) of the transistor Q3 becomes sufficiently high, so that the transistor Q3 operates in an unsaturated region instead of operating in the source follower mode and charges the node N1. Thus, the node N1 is charged at high speed and the node N1 reaches the potential VDD without losing the threshold voltage (Vth) of the transistor Q3. Thus, when the nodes N1 and N3 become the H level, and the node N2 becomes the L level (this state is referred to as the "set state" hereinafter), the transistor Q1 is turned on and the transistor Q2 is turned off.

When the clock signal CLK3 returns to the L level at a time $t_4$, the potential of the node N3 is lowered by the transistor Q10 serving as the MOS capacitor element, and returns to the VDD−Vth before boosted. At this time, since the node N1 is at the potential VDD, the node N1 is in the floating state and maintained at the potential VDD while the transistor Q3 is turned off. Therefore, the set state of the unit shift register $SR_k$ is maintained.

When the clock signal CLK1 becomes the H level at a time $t_5$, that potential change is transmitted to the output terminal OUT through the transistor Q1 in the on state, and the level of the selection signal $G_k$ rises. At this time, the level of the node N1 is boosted by a specific amount by capacitive coupling through the capacitor element C1 and the gate capacitance of the transistor Q1 (therefore, the node N1 is sometimes called a "booster node").

Therefore, even while the level of the selection signal $G_k$ is rising, the voltage between the gate and the source of the transistor Q1 is kept high, and the transistor Q1 operates in the unsaturated region. Thus, the output terminal OUT is charged at high speed, and the level of the selection signal $G_k$ rises at high speed following the rise of the clock signal CLK1. As a result, the level of the selection signal $G_k$ reaches the VDD similarly to the clock signal CLK1 without losing the threshold voltage Vth of the transistor Q1.

In addition, when it is assumed that the parasitic capacitance value of the node N1 is sufficiently small as compared with the sum of capacitance values of the gate capacitance of the transistor Q1 and the capacitor element the boost width of the node N1 is VDD which is the same as the amplitude of the clock signal CLK1 and the selection signal $G_k$. Therefore, the potential of the node N1 after boosted is 2×VDD.

Then, while the clock signal CLK1 is at the H level (for times $t_5$ to $t_6$), the selection signal $G_k$ is kept at the H level. Therefore, during that period, the gate line $GL_k$ is activated and becomes the selected state.

Then, when the clock signal CLK1 returns to the L level at the time $t_6$, the output terminal OUT is discharged through the transistor Q1, and the selection signal $G_k$ becomes the L level. Thus, the gate line $GL_k$ is inactivated and returns to the unselected state. At this time, the level of the node N1 also returns to the VDD before boosted.

Then, while the clock signal CLK2 is at the H level for times $t_7$ to $t_8$, the clock signal CLK2 is not supplied to the unit shift register $SR_k$, so that there is no level change of each node of that unit shift register $SR_k$.

However, at this time, since the selection signal $G_{k+1}$ outputted from the unit shift register $SR_{k+1}$ positioned in the next row is activated, the unit shift register $SR_{k+2}$ positioned in the second next row moves to the set state. Thus, when the clock signal CLK3 becomes the H level at a time $t_9$, the selection signal $G_{k+2}$ in the second next row becomes the H level.

Thus, in the unit shift register $SR_k$ at the time $t_9$, the reset terminal RST becomes the H level and the transistor Q5 is turned on. Then, the node N3 is discharged and becomes the L level and the transistor Q7 is turned off, so that the node N2 becomes the H level. Accordingly, the transistors Q4 and Q9 are turned on and the nodes N1 and N3 become the L level. That is, the unit shift register $SR_k$ returns to the reset state and the transistor Q1 is turned off and the transistor Q2 is turned on.

In addition, when the clock signal CLK3 rises at the time $t_9$, the level of the node N3 tries to rise through the transistor Q10 serving as the MOS capacitor element, but since the transistor Q5 is turned on almost at the same time, the level rises just momentarily and the node N3 is kept roughly at the L level.

On and after the time $t_9$, the transistors Q7 and Q9 function as flip-flop elements and the node N2 is kept at the H level, and the node N3 is kept at the L level. In addition, since the transistor Q10 does not form the channel and does not function as the capacitor element while the node N3 is at the L level, the node N3 is not boosted and kept at the L level even when the clock signal CLK3 of the second input terminal IN2 is activated after that. Therefore, the unit shift register $SR_k$ is kept in the reset state until the selection signal $G_{k-2}$ in the second previous row is activated in the next frame period.

The above is summarized as follows. The unit shift register $SR_k$ is kept in the reset state until the signal of the first input terminal IN1 is activated, and the selection signal $G_k$ is kept at the L level. Then, when the signal of the first input terminal IN1 becomes the H level, the node N3 is charged and the transistor Q3 is turned on to charge the node N1, so that the unit shift register $SR_k$ moves to the set state. Then, when the signal of the second input terminal IN2 becomes the H level, the node N3 is boosted and the transistor Q3 operates in the unsaturated region, so that the potential of the node N1 rises to VDD. Then, when the signal of the clock terminal CK becomes the H level, the output terminal OUT is charged by the transistor Q1 in the on state, and the selection signal $G_k$ is activated. Then, when the signal of the reset terminal RST becomes the H level, the unit shift register $SR_k$ returns to the reset state and the selection signal $G_k$ is kept at the L level again.

When the odd driver 30a and the even driver 30b are configured as shown in FIG. 2, in each unit shift register $SR_k$, the first input terminal IN1 is supplied with the selection signal $G_{k-2}$ in the second previous row, the second input terminal IN2 is supplied with the clock signal which is activated one horizontal period later than the selection signal $G_{k-2}$ in the second previous row (the clock signal having the same phase as the selection signal $G_{k-1}$ in the previous row (the same signal as that of the clock terminal CK of the unit shift register $SR_{k-1}$ in the previous row)), and the clock terminal CK is supplied with the clock signal which is activated two horizontal periods later than the selection signal $G_{k-2}$ in the second previous row. In addition, the reset terminal RST is supplied with the selection signal $G_{k+2}$ in the second next row.

Thus, each unit shift register $SR_k$ in the odd driver 30a and the even driver 30b becomes the set state in response to the activation of the selection signal $G_{k-2}$ in the second previous row, and the potential of the node N1 is raised to VDD after one horizontal period, and the selection signal $G_k$ is activated after two horizontal periods. That is, each unit shift register $SR_k$ operates to activate its selection signal $G_k$ two horizontal periods later than the selection signal $G_{k-2}$ in the second previous row.

Therefore, the odd driver 30a sequentially activates the selection signals $G_1$, $G_3$, $G_5$ . . . in the odd rows every two horizontal periods in the wake of the activation of the first start pulse SP1 inputted to the first-stage unit shift register $SR_1$ of the odd driver 30a. On the other hand, the even driver 30b sequentially activates the selection signals $G_2$, $G_4$, $G_6$ . . . in the even rows every two horizontal periods in the wake of the activation of the second start pulse SP2 inputted to the first-stage unit shift register $SR_2$ of the even driver 30b.

Since the second start pulse SP2 is delayed in phase by one horizontal period with respect to the first start pulse SP1, the even driver 30b starts its operation one horizontal period later than the odd driver 30a. Therefore, in the gate line drive circuit 30 composed of the odd driver 30a and the even driver $30b$ as a whole, after the activation of the first and second start pulses SP1 and SP2, the selection signals $G_1, G_2, G_3, G_4 \ldots$ are activated in this order every one horizontal period, and the gate lines $GL_1, GL_2, GL_3, GL_4 \ldots$ are sequentially selected.

As described above, although the selection signal $G_{k+1}$ in the next row may be inputted to the reset terminal RST of the unit shift register $SR_k$ according to this embodiment, it is preferable that the selection signal $G_{k+2}$ in the second next row is inputted. Hereinafter, the reason will be described.

In order to enhance the resolution of the display panel in the display device having the gate line drive circuit using the shift register, it is necessary to increase the frequency of the clock signal to drive the shift register and speed up the operation of the shift register. However, as the frequency of the clock signal increases, its pulse width narrows and an operation margin of the shift register decreases. Consequently, the pulse width of the clock signal is widely set as much as possible to prevent the margin from decreasing. That is, the interval between the active periods of the clock signals (the interval between the times $t_2$ and $t_3$ in FIG. 4, for example) is set to be considerably short.

When the interval between the active periods of the clock signals is considerably short, the level of the selection signal $G_{k+1}$ in the next row sometimes starts rising before the level of the selection signal $G_k$ of the unit shift register $SR_k$ becomes sufficiently low because it takes a certain time to discharge the output terminal OUT. In this case, when the selection signal $G_{k+1}$ in the next row has been inputted to the reset terminal RST, the transistor Q5 is turned on before the output terminal OUT is sufficiently discharged, so that the level of the node N3 falls. In this case, the resistance value of the transistor Q7 becomes high, and the level of the node N2 rises, so that the transistor Q4 is turned on, the level of the node N1 falls, and the resistance value of the transistor Q1 rises. As a result, the falling speed of the selection signal $G_k$ (discharge speed of the output terminal OUT) problematically decreases (this problem arises conspicuously in the following fourth variation of the first embodiment).

In order to solve the problem, it is considered that the on-resistance value of the transistor Q2 is set low, and the output terminal OUT is immediately discharged in response to the rise of the selection signal $G_{k+1}$ in the next row. However, in order to lower the on-resistance of the transistor Q2, it is necessary to increase its gate width, which is not preferable because a circuit area increases.

In this respect, when the selection signal $G_{k+2}$ in the second next row is inputted to the reset terminal RST, a margin about one horizontal period can be secured from the start of the discharge of the output terminal OUT until the start of the discharge of the node N3, so that the above problem can be avoided.

Next, a description will be made of the first dummy stage SRD1 provided in the odd driver $30a$ and the second dummy stage SRD2 provided in the even driver $30b$.

Figure 5:
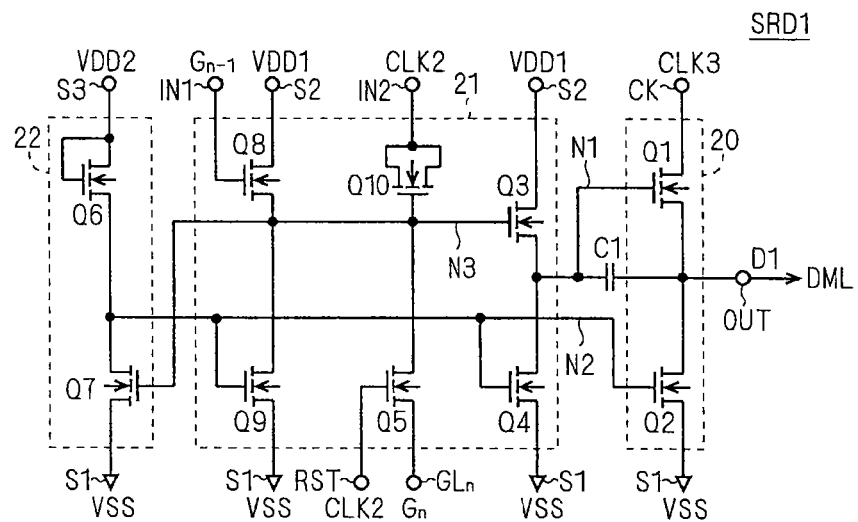
FIG. 5 is a circuit diagram of a dummy unit shift register (first dummy stage) in an odd driver according to the first embodiment.

FIG. 5 is a circuit diagram of the first dummy stage SRD1. A basic circuit configuration is about the same as that of the unit shift register $SR_k$ shown in FIG. 3 except that the selection signal $G_n$ of the gate line $GL_n$ positioned in the previous row is supplied to the source of the transistor Q5 to discharge the node N3. In addition, as described above, in the first dummy stage SRD1, the first input terminal IN1 is supplied with the selection signal $G_{n-1}$, the second input terminal IN2 is supplied with the clock signal CLK2, the clock terminal CK is supplied with the clock signal CLK3, and the reset terminal RST is supplied with the clock signal CLK2.

The operation of the first dummy stage SRD1 shown in FIG. 5 is the same as that of the unit shift register $SR_k$ shown in FIG. 3 and described in the above. However, it is to be noted that since the clock signal CLK2 is supplied to the reset terminal RST (the gate of the transistor Q5), the transistor Q5 is turned on every time the clock signal CLK2 is activated. Therefore, when the source of the transistor Q5 of the first dummy stage SRD1 is fixed to the potential VSS like the circuit in FIG. 3, the node N3 cannot be boosted with the clock signal CLK2 of the second input terminal IN2. Thus, in the first dummy stage SRD1, the source of the transistor Q5 is put to the H level by the selection signal $G_n$ only when the node N3 is boosted to prevent the transistor Q5 from being turned on.

FIG. 6 is a circuit diagram of the second dummy stage SRD2. A basic circuit configuration of the second dummy stage SRD2 is also about the same as that of the unit shift register $SR_k$ shown in FIG. 3 except that the output signal D1 of the first dummy stage SRD1 positioned in the previous row is supplied to the source of the transistor Q5. In addition, as described above, in the second dummy stage SRD2, the first input terminal IN1 is supplied with the selection signal $G_n$, the second input terminal IN2 is supplied with the clock signal CLK3, the clock terminal CK is supplied with the clock signal CLK1, and the reset terminal RST is supplied with the clock signal CLK3.

The operation of the first dummy stage SRD1 shown in FIG. 6 is the same as that of the unit shift register $SR_k$ shown in FIG. 3, and the reason why the output signal D1 of the first dummy stage SRD1 is supplied to the source of the transistor Q5 is the same as the reason of the transistor Q5 of the second dummy stage SRD2. That is, in the second dummy stage SRD2, since the transistor Q5 is turned on every time the clock signal CLK3 is activated, the source of the transistor Q5 is put to the H level by the output signal D1 of the first dummy stage SRD1 only when the node N3 is boosted to prevent the transistor Q5 from being turned on.

As described above, in the gate line drive circuit 30 according to this embodiment, the plurality of shift registers SR belonging to the odd driver $30a$ are cascaded and the plurality of shift registers SR belonging to the even driver $30b$ are cascaded, separately. Even when the odd driver $30a$ and the even driver $30b$ are arranged to sandwich the liquid crystal array section 10 between them, it is not necessary to supply the selection signal G to the next-stage unit shift register SR through the gate line GL. As a result, the rising speed of the selection signal G is prevented from decreasing due to a resistance component and a capacitance component of the gate line GL.

While the first and second dummy stages SRD1 and SRD2 are used as means for putting the last stages (unit shift register $SR_{n-1}$ and $SR_n$) of the odd driver $30a$ and the even driver $30b$ to the reset state, respectively in the above description, first and second end pulses EP1 and EP2 corresponding to the output signals D1 and D2 may be externally supplied to the reset terminals RST of the unit shift register $SR_{n-1}$ and $SR_n$, respectively.

Figure 7:
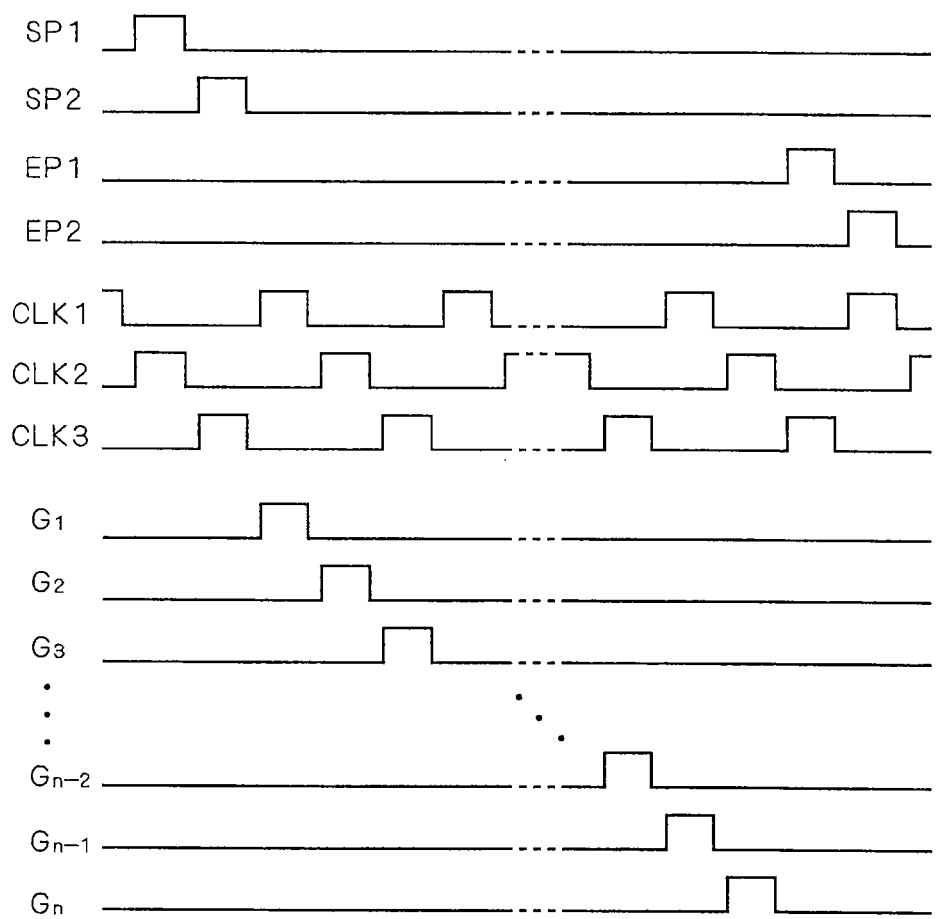
FIG. 7 is a timing chart showing an operation when the gate line drive circuit according to the first embodiment is controlled with an end pulse.

FIG. 7 is a timing chart showing an operation when the gate line drive circuit 30 according to this embodiment is controlled with the end pulses. The first end pulse EP1 is a pulse signal activated one horizontal period later than the selection signal $G_n$ in the last row, and the second end pulse EP2 is a pulse signal activated further one horizontal period later. When the first end pulse EP1 is supplied to the reset terminal RST of the unit shift register $SR_{n-1}$, and the second end pulse EP2 is supplied to the reset terminal of the unit shift register $SR_n$, the same operation as that of the gate line drive circuit 30 in FIG. 2 can be implemented without providing the first and second dummy stages SRD1 and SRD2.

In this case, although it is not necessary to provide the first and second dummy stages SRD1 and SRD2 in the gate line drive circuit 30, it is necessary to separately provide a generation circuit of the first and second end pulses EP1 and EP2 instead.

[First Variation]

The transistor Q6 of the pull-down drive circuit 22 serves as the load element of the inverter in the unit shift register $SR_k$ in FIG. 3. The load element of the inverter may be any kind as long as it can keep the node N2 at the H level while the gate line $GL_k$ is not selected. Therefore, any kind of current drive element such as a constant current element and a resistor element may be used instead of the transistor Q6.

While the constant high side power supply potential VDD2 is supplied to the gate of the transistor Q6 in FIG. 3, the clock signal CLK3 (or CLK2) having the same phase as that of the selection signal $G_{k+2}$ in the second next row (or selection signal $G_{k+1}$ in the next row) supplied to the reset terminal RST may be supplied instead. When the unit shift register $SR_k$ activates the selection signal $G_k$, the transistor Q7 is in the on state during four horizontal periods (time $t_1$ to time $t_9$ in FIG. 4) (or three horizontal periods). While a through current flows through the transistors Q6 and Q7 for those periods in the circuit in FIG. 3, the transistor Q6 is in the off state for three-fourths (two-thirds) periods thereof when the clock signal CLK3 (or CLK2) is supplied to the gate of the transistor Q7, so that the through current can be reduced to one-fourth (one-third). Alternatively, both of the gate and drain of the transistor Q6 may be supplied with the clock signal CLK3 (or CLK2) having the same phase as that of the selection signal $G_{k+2}$ in the second next row (or the selection signal $G_{k+1}$ in the next row) supplied to the reset terminal RST.

This variation can be applied to the following all embodiments and their variations.

[Second Variation]

Figure 8:
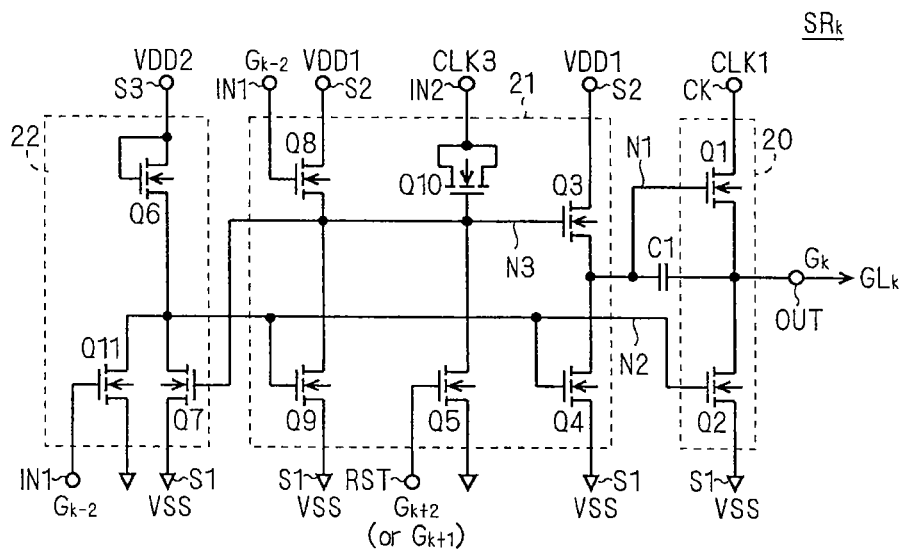
FIG. 8 is a circuit diagram of a unit shift register according to a second variation of the first embodiment.

FIG. 8 is a circuit diagram of a unit shift register $SR_k$ according to a second variation of the first embodiment. The unit shift register $SR_k$ has a transistor Q11 in the pull-down drive circuit 22 with respect to the circuit in FIG. 3. The transistor Q11 has a gate connected to the first input terminal IN1, and is connected between the node N2 and the first power supply terminal S1. In addition, the transistor Q11 is set such that its on-resistance is sufficiently lower than that of the transistor Q6.

In the circuit in FIG. 8, at the point when the selection signal $G_{k-2}$ in the second previous row is activated and the transistor Q8 starts charging the node N3, the transistor Q9 is in the on state. The transistor Q9 is turned off when the node N3 is further charged and the transistor Q7 is turned on and then the node N2 becomes the L level. Therefore, the on-resistance of the transistor Q8 has to be sufficiently lower than that of the transistor Q9.

Meanwhile, in the unit shift register $SR_k$ in FIG. 8, the transistor Q11 is turned on at the point when the selection signal $G_{k-2}$ in the second previous row is activated, and puts the node N2 to the L level. Therefore, the transistor Q9 is turned off almost as soon as the transistor Q8 is turned on, and charges the node N3 in that state. Therefore, the node N3 can be precharged regardless of the on-resistance values of the transistors Q8 and Q9. That is, since the output of the pull-down drive circuit 22 can be inverted without increasing the driving capability of the transistor Q8, the parasitic capacitance caused by the source of the transistor Q8 connected to the node N3 can be small. Therefore, the boost width of the node N3 by the transistor Q10 (MOS capacitor element) can be larger.

[Third Variation]

Figure 9:
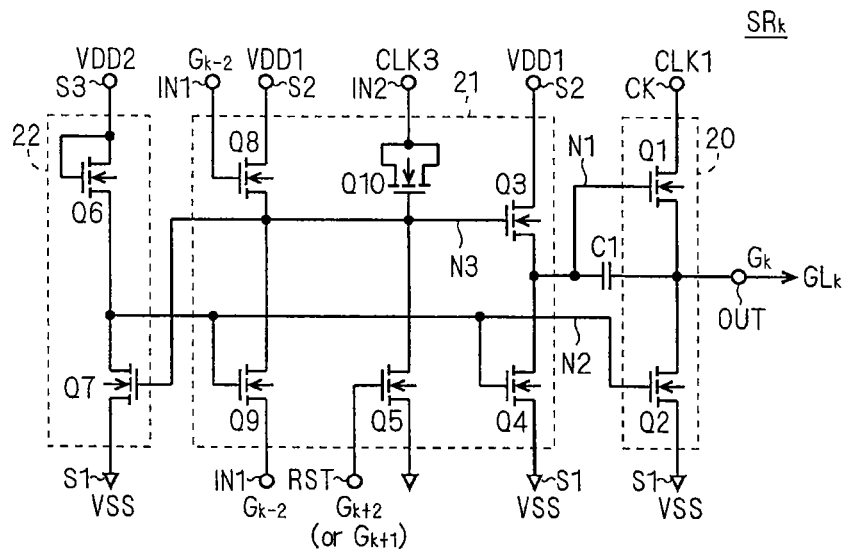
FIG. 9 is a circuit diagram of a unit shift register according to a third variation of the first embodiment.

FIG. 9 is a circuit diagram of a unit shift register $SR_k$ according to a third variation of the first embodiment. In this unit shift register $SR_k$, the source of the transistor Q9 in the pull-up drive circuit 21 is connected to the first input terminal IN1 with respect to the circuit in FIG. 3. That is, the source of the transistor Q9 is supplied with the selection signal $G_{k-2}$ in the second previous row.

In the unit shift register $SR_k$ in FIG. 9, when the selection signal $G_{k-2}$ in the second previous row is activated, the transistor Q9 is turned off because its source potential increases. That is, the transistor Q8 is turned off almost as soon as the transistor Q8 is turned on, and charges the node N3 in that state. Therefore, the node N3 can be precharged regardless of the on-resistance values of the transistors Q8 and Q9. This makes circuit designing easy. In addition, there is no through current flowing from the second power supply terminal S2 to the first power supply terminal S1 through the transistors Q8 and Q9, so that power consumption can be reduced.

[Fourth Variation]

Figure 10:
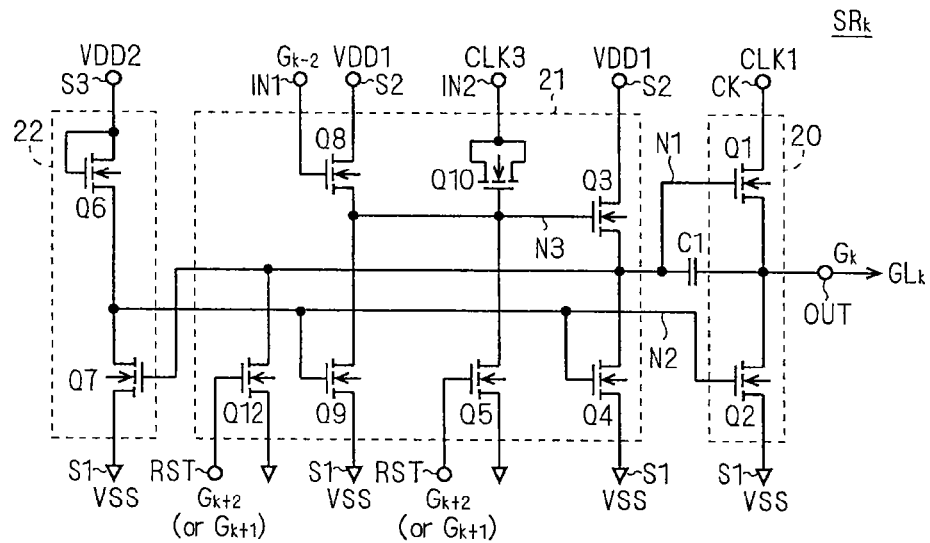
FIG. 10 is a circuit diagram of a unit shift register according to a fourth variation of the first embodiment.

FIG. 10 is a circuit diagram of a unit shift register $SR_k$ according to a fourth variation of the first embodiment. In this unit shift register $SR_k$, the input end of the inverter in the pull-down drive circuit 22 is connected to the node N1, and a transistor Q12 which is connected between the node N1 and the first power supply terminal S1 is provided, with respect to the circuit in FIG. 3. The gate of the transistor Q12 is connected to the reset terminal RST.

An operation of the unit shift register $SR_k$ in FIG. 10 is almost the same as the operation (FIG. 4) of the circuit in FIG. 3. However, it is to be noted that since the transistor Q5 cannot discharge the input end of the pull-down drive circuit 22 (inverter), the transistor Q12 is provided instead to discharge it and to put the unit shift register $SR_k$ into the reset state.

According to this variation, since the input end of the pull-down drive circuit 22 (inverter) is separated from the node N3, the parasitic capacitance of the node N3 decreases as compared with the circuit in FIG. 3. Therefore, the boost width of the node N3 by the transistor Q10 (MOS capacitor element) can be larger.

However, it is to be noted that since the parasitic capacitance of the node N1 increases, the boost width of the node N1 by the capacitor element C1 is smaller than that of the circuit in FIG. 3. In which configuration in FIG. 3 or FIG. 10 the rising speed of the selection signal $G_k$ is higher depends on the conditions such as the transistor dimension and circuit layout. The one which is higher in speed of the selection signal $G_k$ is to be selected based on those conditions. Furthermore, the above first to third variations may be applied to this variation.

[Fifth Variation]

Figure 11:
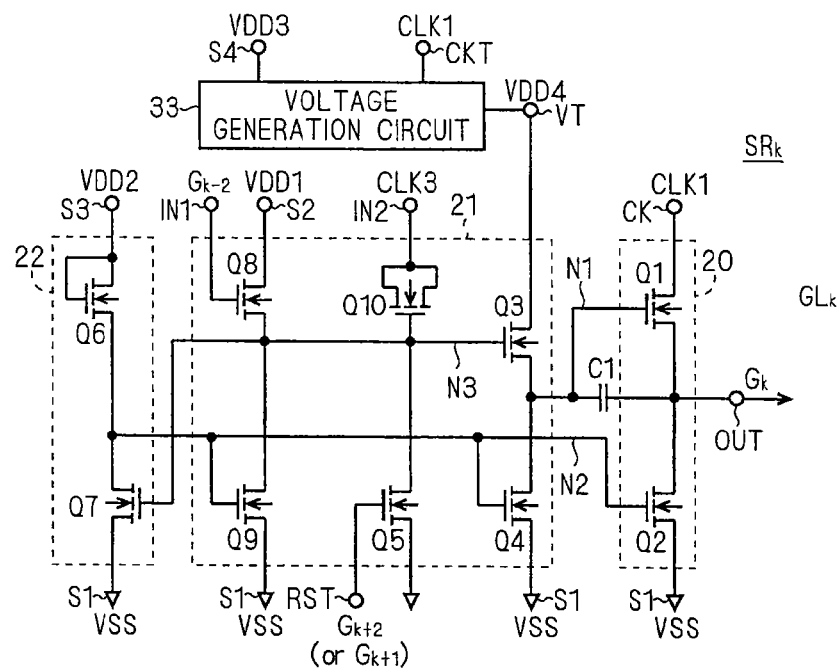
FIG. 11 is a circuit diagram of a unit shift register according to a fifth variation of the first embodiment.

FIG. 11 is a circuit diagram showing a unit shift register according to the first embodiment. According to this variation, an output terminal VT of a voltage generation circuit 33 to generate a predetermined potential VDD4 is connected to the drain of the transistor Q3, with respect to the unit shift register $SR_k$ according to the first embodiment. While this variation may be applied to any unit shift register $SR_k$ in the above first to fourth variations, FIG. 11 shows a case where this variation is applied to the unit shift register $SR_k$ in FIG. 3.

The voltage generation circuit 33 generates the potential VDD4 higher than the H level (VDD) of the clock signals CLK1 to CLK3. The voltage generation circuit 33 includes a charge pump circuit driven by the given clock signal to generate the output potential VDD4 higher than the power supply potential VDD3 by boosting the predetermined power supply potential VDD3 (FIG. 11 shows a fourth power supply terminal S4 supplied with the power supply potential VDD3, and a clock input terminal CKT supplied with the clock signal CLK1 representatively). In addition, a configuration example of the charge pump circuit is specifically disclosed in FIGS. 17 to 20 in Japanese Patent Application Laid-Open No. 2007-257813, for example.

It is assumed that the output potential VDD4 of the voltage generation circuit 33 is higher than the potential V3b (formula (2)) of the node N3 after boosted by the transistor Q10 (MOS capacitor element) by the threshold voltage Vth of the transistor Q3 or more. In this case, since the transistor Q3 also operates in the saturated region to charge the node N1 when the node N3 is boosted, a potential V1a of the node N1 after boosted is as follows.

$$V1a = V3b - Vth \quad (3)$$

In general, since the potential VDD is set to be sufficiently higher than the threshold voltage Vth of the transistor, the potential V3b is higher than VDD by Vth or more. That is, the following relationship is established.

$$V3b = 2 \times VDD - Vth > VDD + Vth \quad (4)$$

Based on the formulas (3) and (4), the following relationship is provided.

$$V1a > VDD \quad (5)$$

That is, the configuration in FIG. 11 increases the gate voltage of the transistor Q1 and enhances the driving capability of the unit shift register $SR_k$ as compared with the circuit in FIG. 3.

Second Embodiment

According to a second embodiment, a shift register capable of changing a shift direction of a signal is applied to the present invention. A gate line drive circuit 30 using such shift register is capable of bidirectional scanning. A direction from head to bottom (order of gate lines $GL_1$, $GL_2$, $GL_3$ . . . ) is defined as a "forward direction", and a direction from bottom to head (order of gate lines $GL_n$, $GL_{n-1}$, $GL_{n-2}$ . . . ) is defined as a "backward direction".

FIG. 12 is a drawing showing a configuration of the gate line drive circuit 30 according to the second embodiment. This gate line drive circuit 30 is also composed of an odd driver 30a having cascaded unit shift registers $SR_1$, $SR_3$, $SR_5$ . . . to drive the gate lines $GL_1$, $GL_3$, $GL_5$ . . . in the odd rows, and an even driver 30b having cascaded unit shift registers $SR_2$, $SR_4$, $SR_6$ . . . to drive the gate lines $GL_2$, $GL_4$, $GL_6$ . . . in the even rows.

In addition, control signals (first and second voltage signals Vn and Vr as will be described below) to determine the shift direction of the signal (scanning direction) are supplied to each unit shift register SR according to this embodiment, and each unit shift register SR has terminals (first and second voltage signals Vn and Vr) to receive them, but they are omitted in FIG. 12.

As shown in FIG. 12, the unit shift register SR in this embodiment has first to fourth input terminals IN1 to IN4, an output terminal OUT, a clock terminal CK, a first voltage signal terminal T1, and a second voltage signal terminal T2. The clock terminal CK of the unit shift register SR is supplied with one of the clock signals CLK1 to CLK3 by the same rule as in FIG. 2. That is, the clock signal CLK1 is supplied to the unit shift registers $SR_1$, $SR_4$, $SR_7$ . . . in [3m−2]th rows, the clock signal CLK2 is supplied to the unit shift registers $SR_2$, $SR_5$, $SR_8$ . . . in [3m−1]th rows, and the clock signal CLK3 is supplied to the unit shift registers $SR_3$, $SR_6$, $SR_9$ . . . in [3m]th rows.

While the clock signal supplied to the clock terminal CK of the unit shift register $SR_n$ (the last stage of the even driver 30b) in the last nth row varies depending on the number of scanning lines of the display device, the clock signal CLK2 is supplied to the clock terminal CK of the unit shift register $SR_n$ in the example shown in FIG. 12.

A clock signal generator 31 in this embodiment can change the order (phase relationship) of activation of the clock signals CLK1, CLK2, and CLK3 to be outputted, based on the shift direction of the signal, by a switch, a program, or changing wiring connection. More specifically, the clock signals CLK1 to CLK3 are activated in the order of CLK1, CLK2, CLK3, CLK1 . . . in the case of the forward shift and activated in the order of CLK3, CLK2, CLK1, CLK3 . . . in the case of the backward shift. Therefore, the clock terminals CK of the shift registers $SR_1$, $SR_2$, $SR_3$ . . . are activated in this order at the time of forward shift, and activated in reverse order at the time of backward shift.

The means for changing the activation order of the clock signals CLK1 to CLK3 implemented by changing the wiring connection is effective when the shift direction is fixed to one direction before the production of the electro-optical device. In addition, the means using the switch or the program is effective when the shift direction is fixed to one direction after the production of the electro-optical device or when the shift direction can be changed while the electro-optical device is used.

According to this embodiment, an operation of the gate line drive circuit 30 is controlled with first to fourth control pulses STn1, STn2, STr1, and STr2 functioning as start pulses and end pulses without providing a dummy stage unit shift register. The first to fourth control pulses STn1, STn2, STr1, and STr2 are generated in a start/end pulse generator 34. As a matter of course, a dummy stage to output a signal corresponding to the end pulse may be provided and in this case, the first to fourth control pulses STn1, STn2, STr1, and STr2 only have to function as the start pulses.

In the case of the forward shift, the first and second control pulses STn1 and STn2 function as the start pulses, and the third and fourth control pulses STr1 and STr2 function as the end pulses. When the first and second control pulses STn1 and STn2 function as the start pulses, the second control pulse STn2 is activated one horizontal period later than the first control pulse STn1 (they behave like the first and second start pulses SP1 and SP2 respectively in FIG. 7). In addition, when the third and fourth control pulses STr1 and STr2 function as the end pulses, the third control pulse STr1 is activated one horizontal period later than the fourth control pulse STr2 (they behave like the first and second end pulses EP1 and EP2 respectively in FIG. 7).

On the other hand, in the case of the backward shift, the third and fourth control pulses STr1 and STr2 function as the start pulses, and the first and second control pulses STn1 and STn2 function as the end pulses. Here, it is to be noted that their phase relationship is opposite to that of the forward shift. More specifically, when the first and second control pulses STn1 and STn2 function as the end pulses, the first control pulse STn1 is activated one horizontal period later than the second control pulse STn2. In addition, when the third and fourth control pulses STr1 and STr2 function as the start pulses, the fourth control pulse STr2 is activated one horizontal period later than the third control pulse STr1.

When the bidirectional shift register is provided in the gate line drive circuit 30 of the image display device like in this embodiment, the start pulse is activated in response to the head of each frame period of an image signal. The end pulse is activated in response to the end of each frame period.

The first and second input terminals IN1 and IN2 of the unit shift register $SR_1$ in the first row (the first stage of the odd driver 30a) is supplied with the first and second control pulses STn1 and STn2, respectively. In addition, the first input terminals IN1 of the unit shift register $SR_2$ in the second row (the first stage of the even driver 30b) is supplied with the second control pulse STn2. In addition, its second input terminal IN2 is supplied with the clock signal CLK1 which is activated one horizontal period later than the second control pulse STn2 at the time of forward shift.

In the unit shift register $SR_k$ on and after the third row, the first input terminal IN1 is connected to the output terminal OUT of the unit shift register $SR_{k-2}$ positioned in the second previous row thereof (previous stage in the odd driver 30a or even driver 30b). In addition, the second input terminal IN2 is supplied with the clock signal delayed in phase by one horizontal period with respect to the selection signal $G_{k-2}$ in the second previous row at the time of forward shift (that is, the clock signal having the same phase as that of the selection signal $G_{k-1}$ in the previous row (the same as that of the clock terminal CK of the unit shift register $SR_{k-1}$ in the previous row)). The clock signal of the second input terminal IN2 is advanced in phase by one horizontal period with respect to the one to be supplied to the clock terminal CK at the time of forward shift.

On the other hand, the third and fourth input terminals IN3 and IN4 of the unit shift register $SR_n$ in the last row (the last stage of the even driver 30b) are supplied with the third and fourth control pulses STr1 and STr2, respectively. In addition, the third input terminal IN3 of the unit shift register $SR_{n-1}$ in the next-to-last row (the last stage of the odd driver 30a) is supplied with the fourth control pulse STr2. In addition, its fourth input terminal IN4 is supplied with the clock signal CLK2 which is activated one horizontal period later than the fourth control pulse STr2 at the time of backward shift.

In the unit shift register $SR_k$ on and before the third row from the last, the first input terminal IN1 is connected to the output terminal OUT of the unit shift register $SR_{k+2}$ positioned in the second next row thereof (the next stage in the odd driver 30a or even driver 30b). In addition, the fourth input terminal IN4 is supplied with the clock signal delayed in phase by one horizontal period with respect to the selection signal $G_{k+2}$ in the second next row at the time of backward shift (that is, the clock signal having the same phase as that of the selection signal $G_{k+1}$ in the next row (the same as the that of the clock terminal CK of the unit shift register $SR_{k-1}$ in the previous row)). The clock signal of the fourth input terminal IN4 is advanced in phase by one horizontal period with respect to the one supplied to the clock terminal CK at the time of backward shift.

Thus, the clock terminal CK of the unit shift register $SR_k$ is supplied with the clock signal which is delayed in phase by one horizontal period with respect to the clock signal of the second input terminal IN2 at the time of forward shift, and with the clock signal which is delayed in phase by one horizontal period with respect to the clock signal of the fourth input terminal IN4 at the time of backward shift. This switching is implemented by a clock signal generator 31 such that the order of the activation of the clock signals CLK1 to CLK3 is reversed between the forward shift and the backward shift as described above.

Figure 13:
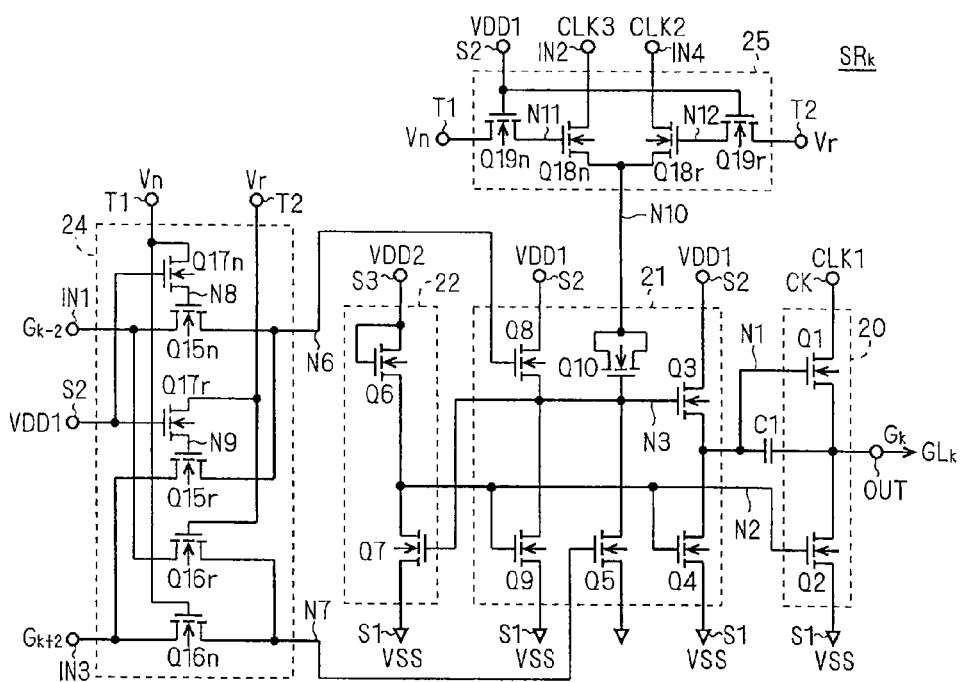
FIG. 13 is a circuit diagram of a unit shift register according to the second embodiment.

FIG. 13 is a circuit diagram of the unit shift register $SR_k$ according to this embodiment. In this unit shift register $SR_k$, switching circuits 24 and 25 to switch the shift direction of the signal are provided, with respect to the circuit in FIG. 3.

The unit shift register $SR_k$ according to this embodiment has the first and second voltage signals Vn and Vr supplied with the first and second voltage signals Vn and Vr serving as control signals to determine the shift direction (scanning direction) of the signal. When the forward shift is performed in the unit shift register $SR_k$, the first voltage signal Vn is set to the active level (H level), and the second voltage signal Vr is set to the inactive level (L level). In addition, when the backward shift is performed in the unit shift register $SR_k$, the first voltage signal Vn is set to the L level, and the second voltage signal Vr is set to the H level.

In the circuit in FIG. 3, the gate (first input terminal IN1) of the transistor Q8 is supplied with the selection signal $G_{k-2}$ in the second previous row, and the gate (reset terminal RST) of the transistor Q5 is supplied with the selection signal $G_{k+2}$ in the second next row, while in the circuit in FIG. 13, the switching circuit 24 can switch the two signals based on the levels of the first and second voltage signals Vn and Vr. That is, the switching circuit 24 connects the gates of the transistors Q5 and Q8 to the first and third input terminals IN1 and IN3, respectively, and can switch the connection.

Similarly, in the circuit in FIG. 3, the drain/source of the transistor Q10 is fixedly connected to the second input terminal IN2, while in the circuit in FIG. 13, the switching circuit 25 can switch the connection of the drain/source of the transistor Q10 between the second input terminal IN2 and the fourth input terminal IN4 based on the levels of the first and second voltage signals Vn and Vr.

As shown in FIG. 13, the switching circuit 24 is composed of transistors Q15r, Q15n, Q16r, Q16n, Q17r, and Q17n.

In addition, the switching circuit 24 has input ends of the first and third input terminals IN1 and IN3 receiving the selection signal $G_{k-2}$ in the second previous row and the selection signal $G_{k+2}$ in the second next row, respectively, and two output ends. The two output ends of the switching circuit 24 are defined as a "node N6" and a "node N7", respectively. Here, the gate of the transistor Q8 is connected to the node N6, and the gate of the transistor Q5 is connected to the node N7. The node N6 corresponds to the first input terminal IN1 of the circuit in FIG. 3, and the node N7 corresponds to the reset terminal RST of the circuit in FIG. 3. That is, the switching circuit 24 performs the switch operation such that either one of the selection signal $G_{k-2}$ in the second previous rows or selection signal $G_{k+2}$ in the second next row is supplied to either one of the first input terminal IN1 in FIG. 3 (node N6) or the reset terminal RST in FIG. 3 (node N7).

As shown in FIG. 13, the transistor Q15n is connected between the first input terminal IN1 and the node N6, and the transistor Q15r is connected between the third input terminal IN3 and the node N6. When nodes connected to the gates of the transistors Q15n and Q15r are defined as a "node N8" and a "node N9", respectively, the transistor Q17n is connected between the node N8 and the first voltage signal terminal T1, and the transistor Q17n is connected between the node N9 and the second voltage signal terminal T2. The gates of the transistors Q17n and Q17r are both connected to the second power supply terminal S2.

In addition, the transistor Q16n is connected between the third input terminal IN3 and the node N7, and its gate is connected to the first voltage signal terminal T1. The transistor Q16r is connected between the third input terminal IN3 and the node N7, and its gate is connected to the second voltage signal terminal T2.

The switching circuit 25 is composed of transistors Q18r, Q18n, Q19r, and Q19n. The switching circuit 25 has the second and fourth input terminals IN2 and IN4 supplied with predetermined clock signals as its input ends, and has the gate of the transistor Q10 as its output end.

As shown in FIG. 13, a node connected to the gate of the transistor Q10 is defined as a "node N10", the transistor Q18n is connected between the node N10 and the second input terminal IN2, and the transistor 18r is connected between the node N10 and the fourth input terminal IN4. In addition, when nodes connected to the gates of the transistors Q18n and Q18r are defined a "node N11" and a "node N12", respectively, the transistor Q19n is connected between the node N11 and the first voltage signal terminal T1, and the transistor Q19r is connected between the node N12 and the second voltage signal terminal T2. The gates of the transistors Q19r and Q19n are both connected to the second power supply terminal S2.

A description will be made of operations of the switching circuits 24 and 25 provided in the unit shift register SR in FIG. 13, hereinafter. Here, it is assumed that the potentials of the H levels of the first and second voltage signals Vn and Vr, and the selection signal $G_{k-2}$ in the second previous row and the selection signal $G_{k+2}$ in the second next row (that is, the H level of the clock signals CLK1 to CLK3) are all VDD. In addition, high side power supply potentials VDD1 and VDD2 are also equal to VDD.

When the first voltage signal Vn is at the H level (VDD) and the second voltage signal Vr is at the L level (VSS), the transistor Q16n is in the on state and the transistor Q16r is in the off state in the switching circuit 24. In addition, since the gate potentials of the transistors Q17n and Q17r are fixed to the H level of VDD, both are in the on state. When it is assumed that the selection signal $G_k$ of the unit shift register $SR_k$, the selection signals $G_{k-2}$ in the second previous row and the selection signals $G_{k+2}$ in the second next row are all at the L level, the node N8 is at the H level of the potential VDD−Vth, and the node N9 is at the L level of the potential VSS. Therefore, the transistor Q15n is in the on state, and the transistor Q15r is in the off state.

Therefore, the selection signal $G_{k-2}$ inputted from the second previous row to the first input terminal IN1 is supplied to the node N6, and the selection signal $G_{k+2}$ inputted from the second next row to the second input terminal IN2 is supplied to the node N7.

In the switching circuit 25, since the gate potentials of the transistors Q19n and Q19r are fixed to the H level of VDD, they are both in the on state. Therefore, when the first voltage signal Vn is at the H level (VDD) and the second voltage signal Vr is at the L level (VSS), the node N11 is at the H level of the potential VDD−Vth, and the node N12 is at the L level of the potential VSS. Thus, the transistor Q18n is in the on state and the transistor Q18r is in the off state, and the node N10 is supplied with the clock signal of the second input terminal IN2 (the clock signal CLK3 in FIG. 13).

In this case, the unit shift register $SR_k$ in FIG. 13 is equivalent to that in FIG. 3. Therefore, the selection signal G can be shifted from the previous row to the subsequent row (forward direction) in the gate line drive circuit 30 composed of the odd driver 30a and the even driver 30b having the plurality of cascaded unit shift registers $SR_k$ in FIG. 13.

In addition, in the case of the forward shift, the first and second control pulses STn1 and STn2 function as the start pulses, and at this time, the second control pulse STn2 is activated one horizontal period later than the first control pulse STn1. Therefore, the even driver 30b to which the first row (gate line $GL_1$) does not belong starts the operation later than the even driver 30b to which the first row belongs by one line scanning period. Thus, the selection signals $G_1$, $G_2$, $G_3$ . . . are activated in this order in the gate line drive circuit 30.

In the switching circuit 24 in FIG. 13, when the selection signal $G_{k-2}$ in the second previous row rises and the potential of the node N6 rises, the node N8 is boosted due to coupling through the capacitance between the gate and the channel of the transistor Q15n. At this time, since the transistor Q17 is turned off, the node N8 rises to the level high enough to operate the transistor Q25n in the unsaturated region. Therefore, the potential of the node N6 becomes VDD which is the same as the H level of the selection signal $G_{k-2}$ in the second previous row. That is, the selection signal $G_{k-2}$ in the second previous row is transmitted to the node N6 without losing the threshold voltage of the transistor Q15n.

Similarly, in the switching circuit 25, when the clock signal (clock signal CLK3) of the second input terminal IN2 rises and the potential of the node N10 rises, the node N11 is boosted due to coupling through the capacitance between the gate and the channel of the transistor Q18n. At this time, since the transistor Q19n is turned off, the node N11 rises to the level high enough to operate the transistor Q18n in the unsaturated region. Therefore, the potential of the node N10 becomes VDD which is the same as the H level of the clock signal CLK3. That is, the clock signal of the second input terminal IN2 is transmitted to the node N10 without losing the threshold voltage of the transistor Q18n.

On the other hand, when the first voltage signal Vn is at the L level (VSS), and the second voltage signal Vr is at the H level (VDD), the transistor Q16n is in the off state and the transistor Q16r is in the on state in the switching circuit 24. In addition, the transistors Q17n and Q17r are both in the on state, and when it is assumed that the selection signal $G_k$ of the unit shift register $SR_k$, the selection signal $G_{k-2}$ in the second previous row and the selection signal $G_{k+2}$ in the second next row are all at the L level, the node N8 is at the L level of the potential VSS, and the node N9 is at the H level of the potential VDD−Vth. Therefore, the transistor Q15n is in the off state, and the transistor Q15r is in the on state.

Therefore, the selection signal $G_{k-2}$ inputted from the second previous row to the first input terminal IN1 is supplied to the node N7, and the selection signal $G_{k+2}$ from the second next row to the second input terminal IN2 is supplied to the node N6. In this case, the unit shift register $SR_k$ in FIG. 13 becomes the set state in response to the activation of the selection signal $G_{k+2}$ in the second next row and becomes the reset state in response to the activation of the selection signal $G_{k-2}$ in the second previous row.

In addition, in the switching circuit 25, when the first voltage signal Vn is at the L level (VSS) and the second voltage signal Vr is at the H level (VDD), the node N11 is at the L level of the potential VSS, and the node N12 is at the H level of the potential VDD−Vth. Thus, the transistor Q18n is in the off state and the transistor Q18r is in the on state, and the node N10 is supplied with the clock signal of the fourth input terminal IN4 (the clock signal CLK2 in FIG. 13).

As a result, the selection signals are activated in a direction from the subsequent row to the previous row (backward direction), that is, the selection signals $G_n$, $G_{n-1}$, $G_{n-2}$ . . . are activated in this order in the gate line drive circuit 30 composed of the odd driver 30a and the even driver 30b having the plurality of cascaded unit shift registers $SR_k$ in FIG. 13.

As a result, the selection signal G can be shifted in the direction from the subsequent row to the previous row (backward direction) in the gate line drive circuit 30 composed of the odd driver 30a and the even driver 30b having the plurality of cascaded unit shift registers $SR_k$ in FIG. 13.

In the case of the backward shift, the third and fourth control pulses STr1 and STr2 function as the start pulses, and at this time, the fourth control pulse STr2 is activated one horizontal period later than the third control pulse STr1. Therefore, the odd driver 30a to which the last row (gate line $GL_n$) does not belong starts the operation later than the even driver 30b to which the last row belongs by one line scanning period. Thus, the selection signals $G_n$, $G_{n-1}$, $G_{n-2}$ ... are activated in this order in the gate line drive circuit 30.

Since the node N9 is boosted by the coupling through the capacitance between the gate and the channel of the transistor Q15r when the selection signal $G_{k+2}$ in the second next row rises in the unit shift register $SR_k$, the transistor Q15r operates in the unsaturated region. Thus, the selection signal $G_{k+2}$ in the second next row is transmitted to the node N7 without losing the threshold voltage of the transistor Q15r.

Similarly, since the node N12 is boosted by the coupling through the capacitance between the gate and the channel of the transistor Q18r when the clock signal of the fourth input terminal IN4 (clock signal CLK2) rises, the transistor Q18r operates in the unsaturated region. Thus, the clock signal of the fourth input terminal IN4 is transmitted to the node N10 without losing the threshold voltage of the transistor Q18r.

In addition, since operations of an output circuit 20, a pull-up drive circuit 21, and a pull-down drive circuit 22 in FIG. 13 are same as those in FIG. 3, the same effect as that in the first embodiment can be provided in the unit shift register $SR_k$ according to this embodiment. Here, it is to be noted that since the signal is supplied to the pull-up drive circuit 21 of the unit shift register $SR_k$ through the switching circuits 24 and 25, the response to the input signal is a little delayed as compared with the circuit in FIG. 3.

In addition, this embodiment can be applied to any unit shift register $SR_k$ in the first embodiment and its variations.

Third Embodiment

According to a third embodiment, the present invention is applied to a gate line drive circuit composed of unit shift registers SR capable of bidirectional scanning without using a switching circuit. Since a signal delay due to the switching circuit is not generated in each unit shift register, the same response speed as that of a usual unit shift register (performing only one directional shift) can be obtained. Such unit shift register is disclosed in Japanese Patent Application Laid-Open No. 2008-287753 according to the idea of the inventor of the present invention.

FIG. 14 is a circuit diagram of a unit shift register $SR_k$ according to the third embodiment, in which the present invention is applied to the circuit in FIG. 3 of Japanese Patent Application Laid-Open No. 2008-287753. The unit shift register $SR_k$ is also composed of an output circuit 20, a pull-up drive circuit 21, and a pull-down drive circuit 22, and the pull-up drive circuit 21 includes a forward pull-up drive circuit 21n to drive a transistor Q1 at the time of forward shift and a backward pull-up drive circuit 21r to drive the transistor Q1 at the time of backward shift.

The output circuit 20 has the same configuration as that in FIG. 3, and it is composed of the transistor Q1 to put a selection signal $G_k$ into the active state (H level) while a gate line $GL_k$ is selected, and a transistor Q2 to keep the selection signal $G_k$ at the inactive state (L level) while the gate line $GL_k$ is not selected, and a capacitor element C1 is provided between the gate and the source of the transistor Q1. Here also, a node connected to the gate (control electrode) of the transistor Q1 is defined as a "node N1", and a node connected to the gate of the transistor Q2 is defined as a "node N2".

The pull-up drive circuit 21 is composed of a transistor Q4, the forward pull-up drive circuit 21n, and the backward pull-up drive circuit 21r. The transistor Q4 has a gate connected to the node N2, and is connected between the node N1 and a first power supply terminal S1 similar to FIG. 3.

The forward pull-up drive circuit 21n is composed of following transistors Q3n, Q5n, and Q8n to Q10n. The transistor Q3n is connected between the node N1 and a first voltage signal terminal T1 to supply a first voltage signal Vn to the node N1. Here, a node connected to the gate of the transistor Q3n is defined as a "node N3n". The transistor Q8n is connected between the node N3n and the first voltage signal terminal T1, and its gate is connected to a first input terminal IN1. The transistor Q10n has a gate connected to the node N3n and two current electrodes (source and drain) both connected to a second input terminal IN2. That is, the transistor Q10n selectively functions as a capacitor element based on the voltage between the node N3n and the second input terminal IN2.

In addition, the transistor Q5n is connected between the node N3n and the first power supply terminal S1, and its gate is connected to a third input terminal IN3. The transistor Q9n is connected between the node N3n and the first power supply terminal S1 and its gate is connected to the node N2.

The backward pull-up drive circuit 21r is composed of following transistors Q3r, Q5r, and Q8r to Q10r. The transistor Q3r is connected between the node N1 and a second voltage signal terminal T2 to supply a second voltage signal Vr to the node N1. Here, a node connected to the gate of the transistor Q3r is defined as a "node N3r". The transistor Q8r is connected between the node N3r and the second voltage signal terminal T2, and its gate is connected to the third input terminal IN3. The transistor Q10r has a gate connected to the node N3r and two current electrodes (source and drain) both connected to a fourth input terminal IN4. That is, the transistor Q10r selectively functions as a capacitor element based on the voltage between the node N3r and the fourth input terminal IN4.

In addition, the transistor Q5r is connected between the node N3r and the first power supply terminal S1, and its gate is connected to the third input terminal IN3. The transistor Q9r is connected between the node N3r and the first power supply terminal S1, and its gate is connected to the node N2.

The pull-down drive circuit 22 is composed of following transistors Q6, Q7n, and Q7r. The transistor Q6 is connected between the node N2 and a third power supply terminal S3, and its gate is connected to the third power supply terminal S3 (that is, the transistor Q6 is diode-connected). The transistor Q7n has a gate connected to the node N3n, and is connected between the node N2 and the first power supply terminal S1. The transistor Q7r has a gate connected to the node N3r, and is connected between the node N2 and the first power supply terminal S1.

The transistors Q7n and Q7r are set such that their on-resistances are sufficiently lower than that of the transistor Q6. Therefore, while the node N2 is at the H level while both of the nodes N3 and N3r are at the low level, it becomes the L level when at least one of the nodes N3n and N3r becomes the H level. That is, the pull-down drive circuit 22 according to this embodiment is a NOR circuit in which the nodes N3n and N3r are input ends and the node N2 is an output end.

A description will be made of an operation of the unit shift register $SR_k$ in FIG. 14, hereinafter. At the time of forward shift, the first voltage signal Vn is set at the H level (VDD), and the second voltage signal Vr is set at the L level (VSS). In this case, the first voltage signal Vn serves as a power supply of the active level, and the forward pull-up drive circuit 21n becomes the active state. Since the drains (first voltage signal terminal T1) of the transistors Q3n and Q8n are fixed to the H level (VDD), the forward pull-up drive circuit 21n and the transistor Q4 configure a circuit equivalent to the pull-up drive circuit 21 in FIG. 3.

On the other hand, the backward pull-up drive circuit 21r is not supplied with the power supply of the active level and it is in the resting state. In this case, an electric charge is not supplied to the node N1 through the transistor Q3r. The transistor Q8r cannot charge the node N3r, and a channel is not formed in the transistor Q10r (MOS capacitor element) and the node N3r cannot be boosted. Thus, the node N3r is kept at the L level, and the transistors Q3r and Q7r are kept in the off state.

As a result, the pull-up drive circuit 21 and the pull-down drive circuit 22 in FIG. 14 are equivalent to the pull-up drive circuit 21 and pull-down drive circuit 22 in FIG. 3, respectively. Therefore, the unit shift register SR in FIG. 14 can make the forward shift of the selection signal by the same operation as that of the circuit in FIG. 3.

At the time of backward shift, the first voltage signal Vn is set at the L level (VSS) and the second voltage signal Vr is set at the H level (VDD). In this case, the forward pull-up drive circuit 21n is in the resting state, and the backward pull-up drive circuit 21r is in the active state. In addition, the node N3n is kept at the L level, and the transistors Q3n and Q7n are kept in the off state.

As a result, the pull-up drive circuit 21 and the pull-down drive circuit 22 in FIG. 14 are equivalent to the pull-up drive circuit 21 and the pull-down drive circuit 22 in FIG. 3, respectively. Here, it is to be noted that the backward pull-up drive circuit 21r operates so as to put the unit shift register $SR_k$ into the set state according to the selection signal $G_{k+2}$ from the second next row to the third input terminal IN3, and put it into the reset state according to the selection signal $G_{k-2}$ inputted from the second previous row to the first input terminal IN1. Therefore, the unit shift register SR in FIG. 14 can make backward shift of the selection signal.

Thus, since the unit shift register $SR_k$ according to this embodiment can implement the bidirectional scanning without using the switching circuit, the same response speed as that of the usual unit shift register (performing only the one directional shift) can be obtained.

[Variation]

Figure 15:
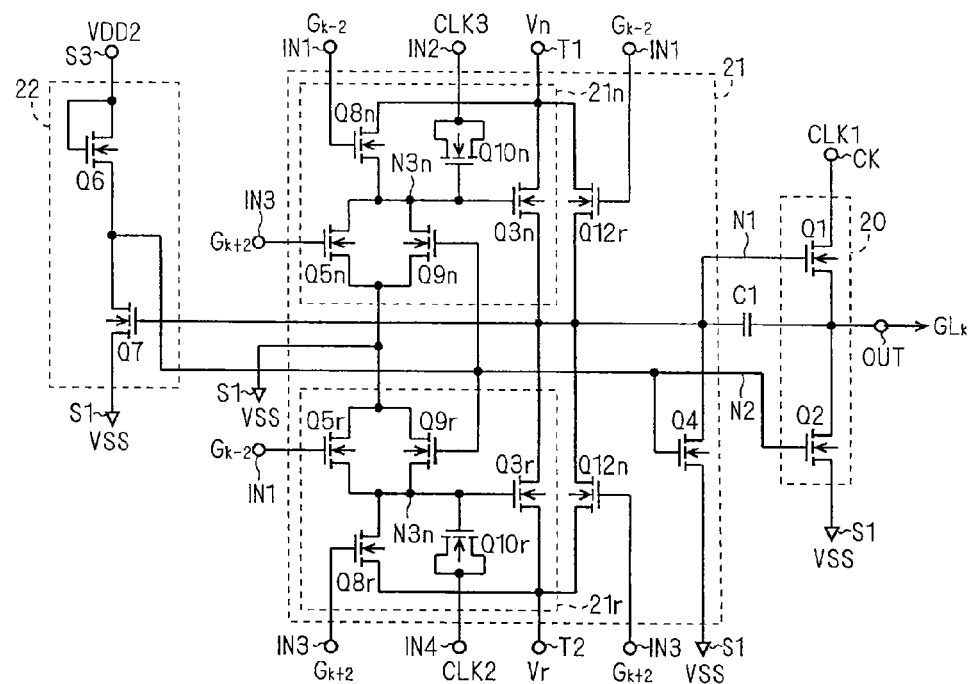
FIG. 15 is a circuit diagram of a unit shift register according to a variation of the third embodiment.

FIG. 15 is a circuit diagram showing a unit shift register $SR_k$ according to a variation of the third embodiment. The unit shift register $SR_k$ is provided by applying the technique of the fourth variation of the first embodiment, to the circuit in FIG. 14.

That is, the unit shift register $SR_k$ in FIG. 15, in which the pull-down drive circuit 22 is the inverter having the node N1 as its input end similar to that in FIG. 10, further includes a transistor Q12n connected between the node N1 and the second voltage signal terminal T2, and a transistor Q12r connected between the node N1 and the first voltage signal terminal T1. The gate of the transistor Q12r is connected to the third input terminal IN3, and the gate of the transistor Q12n is connected to the first input terminal IN1.

For example, at the time of forward shift (the first voltage signal Vn is at the H level, and the second voltage signal Vr is at the L level), the transistor Q5n cannot discharge the input end of the pull-down drive circuit 22 (inverter) in the configuration in FIG. 15. In addition, a channel is not formed in the transistor Q10r (MOS capacitor element), and the node N3r cannot be boosted, so that the input end of the pull-down drive circuit 22 is not discharged by the transistor Q3r, either. Therefore, the transistor Q12n is provided instead to discharge it and to put the unit shift register SR into the reset state.

Similarly, the transistor Q12r is to discharge the input end of the pull-down drive circuit 22 (inverter) and put the unit shift register $SR_k$ into the reset state at the time of backward shift.

Thus, the transistors Q12n and Q12r in FIG. 15 function similarly to the transistor Q12 in FIG. 10. Here, it is to be noted that while the transistor Q12 in FIG. 10 only discharges the node N1, the transistors Q12n and Q12r in FIG. 15 also contribute to charging of the node N1. For example, at the time of forward shift, the transistor Q12r can charge the node N1 up to VDD−Vth in response to the activation of the selection signal $G_{k-2}$ in the second previous row, and at the time of backward shift, the transistor Q12n can charge the node N1 up to VDD−Vth in response to the activation of the selection signal $G_{k+2}$ in the second next row.

According to this variation, since the pull-down drive circuit 22 is separated from the nodes N3n and N3r, parasitic capacitances of the nodes N3n and N3r are lower than that of the circuit in FIG. 14. Thus, boost widths of the node N3n and N3r by the transistors Q10n and Q10r (MOS capacitor elements) can be larger.

Here, it is to be noted that since the parasitic capacitance of the node N1 increases, the boost width of the node N1 by the capacitor element C1 is smaller than that of the circuit in FIG. 14. In which configuration in FIG. 14 or FIG. 15 the rising speed of the selection signal $G_k$ is higher depends on the conditions such as the transistor dimension and circuit layout. Thus, the one having the high-speed selection signal $G_k$ may be employed based on those conditions.

Fourth Embodiment

A fourth embodiment proposes a more desirable structure of the MOS capacitor element (transistors Q10, Q10n, and Q10r) in the unit shift register SR according to the above first to third embodiments.

In general, the a-Si transistor is high in overlap capacitance between a gate and a drain. When the a-Si transistor is used as the unit shift register SR, AC power consumption increases due to the overlap capacitance in the MOS capacitor element because a high frequency clock signal is supplied to the drain of each MOS capacitor element in the above unit shift register SR.

The overlap capacitance of the transistor is proportional to its gate width. In addition, the gate capacitance value of the transistor as the capacitance value of the MOS capacitor element is proportional to its gate area, and the gate area is determined by the product of the gate width and a gate length. Therefore, in the MOS capacitor element, in order to obtain the great capacitance value while suppressing the AC power consumption caused by the overlap capacitance, the gate width is to be narrowed and the gate length is to be increased in the transistor used as the MOS capacitor element. Therefore, the transistor having a structure in which the gate length is longer than the gate width is preferably used.

Here, it is to be noted that as the gate length increases, the on-resistance (channel resistance) of the transistor increases, so that a time required for a boost operation increases. Thus, it is preferable that the gate width and the gate length are set to appropriate values in view of the boost speed and the power consumption.

When the MOS capacitor element is composed of the transistor, the on-resistance can be lowered and the time required for the boost operation can be shortened in the transistor by connecting the two current electrodes (drain and source) of the transistor and using them as one terminal of the MOS capacitor element like the transistor Q10 shown in FIG. 3, for example. However, since both of the two current electrodes contribute to the overlap capacitance, the overlap capacitance increases and the power consumption increases.

In addition, even when only one of the two current electrodes of the transistor is used as the terminal of the MOS capacitor element and the other is made to be in the floating state, the transistor can function as the capacitor element. In this case, since only one current electrode contributes to the overlap capacitance, the overlap capacitance decreases while the on-resistance increases.

Figure 16A:
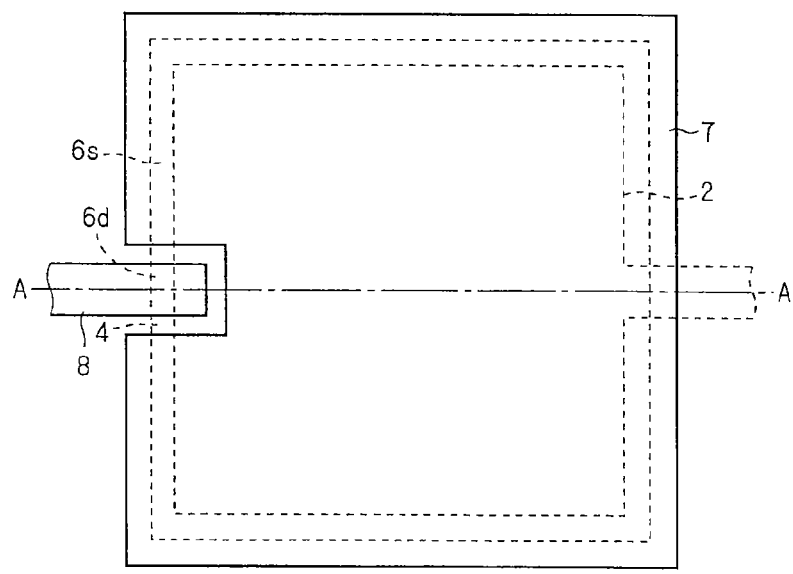
FIGS. 16A and 16B are drawings showing a structure of a transistor serving as a MOS capacitor element according to a fourth embodiment.
Figure 16B:
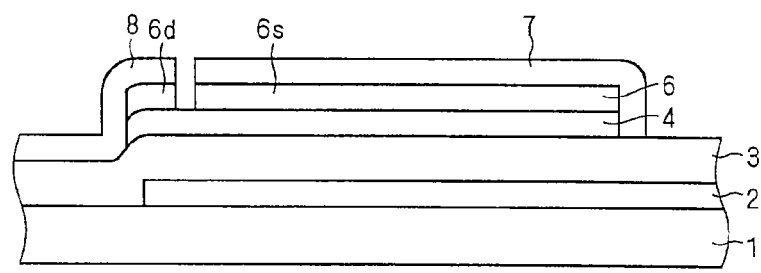

FIGS. 16A and 16B are drawings showing a transistor structure as the MOS capacitor element according to the fourth embodiment. FIG. 16A is a top view of the transistor, and FIG. 16B is a cross-sectional view taken along a line A-A in FIG. 16A.

As shown in FIGS. 16A and 16B, the transistor is composed of a glass substrate 1, a gate electrode 2, a gate insulating film 3, an active layer (i layer) 4, an ohmic layer (n layer) 6, a source electrode 7, and a drain electrode 8. The gate electrode 2 is formed on the glass substrate 1 and the gate insulating film 3 is formed thereon and the ohmic layer 6 is formed thereon through the active layer 4. The ohmic layer 6 is divided into a part of a source region 6s and a part of a drain region 6d, and the source electrode 7 and the drain electrode 8 are formed on the source region 6s and the drain region 6d, respectively.

In the MOS capacitor element according to this embodiment, only the drain electrode 8 of the two current electrodes is used as a terminal of the MOS capacitor element, and the source electrode 7 is made to be in the floating state. That is, in the MOS capacitor element, the gate electrode 2 is used as one terminal, and the drain electrode 8 is used as the other terminal.

Since the source electrode 7 is in the floating state in the MOS capacitor element in FIGS. 16A and 16B, overlap capacitance which consumes an AC power exists only at a region overlapped with the gate electrode 2 and the drain region 6d (drain electrode 8). Since the drain region 6d is formed smaller than the source region 6s (source electrode 7) in this MOS capacitor element, so that the overlap capacitance is low. When the dimension of the drain region 6d is set to a value as minimum as it can be formed in its production process, the overlap capacitance can be minimum.

In the MOS capacitor element shown in FIGS. 16A and 16B, a part functioning as the capacitor element is a region overlapped with the active layer 4 and the gate electrode 2, that is, a region (channel region) in which the channel is formed. The area of the channel region is increased in the MOS capacitor element in FIGS. 16A and 16B when it is roughly a square in shape. As a result, the channel resistance becomes low, so that the time required for the boost operation is shortened in the MOS capacitor element, and transmission delay is hardly generated.

As described above, in the transistor according to this embodiment, the drain electrode 8 serving as one terminal of the MOS capacitor element is narrower in width than that of the source electrode 7 in the floating state. Since the drain electrode 8 is small, the overlap capacitance is low. In addition, since the source electrode 7 and the gate electrode 2 are large, the channel region can be large, so that the channel resistance can be small and the great capacitance value can be ensured. Therefore, the MOS capacitor element composed of the above transistor can be superior in characteristics in view of the boost speed and power consumption.

As the drain electrode 8 can be formed at any position, the drain electrode 8 may be formed at a corner of the gate electrode 2, for example. However, the drain electrode 8 is preferably arranged in the center of one side of the gate electrode 2 as shown in FIGS. 16A and 16B so that the channel resistance can be easily lowered. In addition, the plurality of drain electrodes 8 may be provided and each may be arranged in each center of a pair of opposite sides (two opposed sides) of the gate electrode 2, for example. In addition, each may be arranged in the center of each side of the gate electrode 2. Here, it is to be noted that a gate wiring (a part extending outside from the gate electrode 2) has to be formed based on the position of the drain electrode 8. Although the channel resistance can be further lowered by providing the plurality of drain electrodes 8, it is to be noted that the overlap capacitance of the gate and the drain increases according to the number of the drain electrodes 8.

A production method of the transistor in FIGS. 16A and 16B will be described. First, a Cr film is formed to be 0.3 μm in thickness on the glass substrate 1 by sputtering, and it is patterned with a photoresist mask, whereby the gate electrode 2 and the gate wiring are formed. Then, an SiN film is formed to be 0.2 μm in thickness thereon by CVD (Chemical Vapor Deposition), whereby the gate insulating layer 3 is formed.

Then, an i-type amorphous silicon layer serving as the active layer 4 is formed to be 0.1 μm in thickness by CVD, and an n-type amorphous silicon layer serving as the ohmic layer 6 is formed to be 0.05 μm in thickness by CVD. Then, those films are patterned, whereby the ohmic layer 6 and the active layer 4 are formed.

Then, a metal layer such as a Cr layer is formed to be 0.1 μm in thickness by sputtering, and patterned, whereby the source electrode 7 and the drain electrode 8 are formed. Then, the ohmic layer 6 between the source electrode 7 and the drain electrode 8 is etched away with the source electrode 7 and the drain electrode 8 used as a mask. Thus, the ohmic layer 6 is divided into the source region 6s and the drain region 6d.

The source electrode 7 is in the floating state in the transistor as the MOS capacitor element in FIGS. 16A and 16B. When the transistor is used as the transistor Q10 of the unit shift register $SR_k$ in FIG. 3, for example, the drain electrode 8 is connected to the second input terminal IN2, and the gate electrode 2 is connected to the node N3. In this case, when the clock signal supplied to the second input terminal IN2 becomes the H level, a positive electric charge is gradually accumulated in the source electrode 7 due to a leak current from the drain electrode 8. Therefore, when it takes a long time in the operation of the unit shift register $SR_k$, the potential of the source electrode 7 becomes high and there is a concern that the channel cannot be formed between the gate electrode 2 and the source electrode 7 when the node N3 becomes the H level. Therefore, the source electrode 7 is preferably fixed to the potential at the L level.

Figure 17:
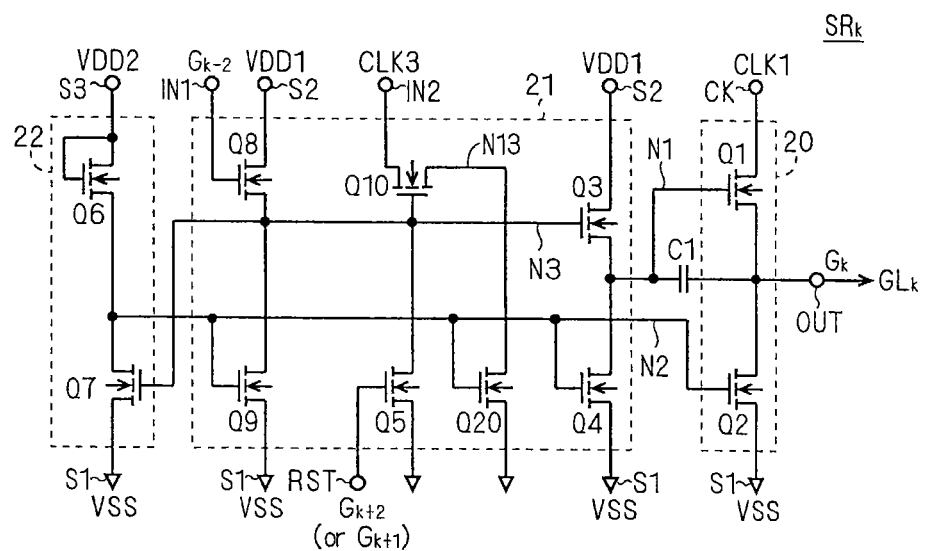
FIG. 17 is a circuit diagram showing an example of a unit shift register using a MOS transistor according to the fourth embodiment.

FIG. 17 is an example of a unit shift register $SR_k$ using the MOS transistor according to the fourth embodiment. In this unit shift register $SR_k$, the source (corresponding to the source electrode 7 in FIGS. 16A and 16B) of the transistor Q10 is connected to a first power supply terminal S1 through a transistor Q20, with respect to the circuit in FIG. 3. The gate of the transistor Q20 is connected to a node N2. Here, a node connected to the source of the transistor Q10 is defined as a "node N13".

In the configuration in FIG. 17, while the unit shift register $SR_k$ is not selected (period in the reset state), an electric charge entering the node N13 due to the leak current of the transistor Q10 is discharged to the power supply terminal S1 through the transistor Q20, so that the node N13 is kept at the L level. Therefore, the above problem in the transistor Q10 can be solved.

In addition, while the unit shift register $SR_k$ is selected (period in the set state), the transistor Q20 is in the off state, so that the node N13 is in the floating state. Thus, a through current is prevented from being generated in the transistors Q10 and Q20 while the node N3 is boosted.

The MOS capacitor element (transistor Q10) in FIG. 17 can be applied to any unit shift register SR according to the first to third embodiments and their variations. In addition, while the channel-etch type a-Si transistor is shown in FIGS. 16A and 16B, this embodiment can be applied to an etch-stopper type or top-gate type a-Si transistor as a matter of course.

Fifth Embodiment

A fifth embodiment proposes a technique to improve the quality of a captured image and a displayed image in the electro-optical device according to the present invention.

For example, through wiring paths of the clock signals CLK1 to CLK3 in the gate line drive circuit 30 in FIG. 2, the clock signal CLK1 outputted from the clock signal generator 31 drives the unit shift register $SR_{n-1}$ at first and drives the unit shift register $SR_{n-4}$ (not shown) at last (except for the first and second dummy stages SRD1 and SRD2). Similarly, the clock signal CLK2 drives the unit shift register $SR_{n-3}$ at first and drives the unit shift register $SR_n$ at last. In addition, the clock signal CLK3 drives the unit shift register $SR_{n-5}$ (not shown) at first and drives the unit shift register $SR_{n-2}$ at last. Thus, there is a large difference in wiring length (roughly corresponding to a length of three sides of the display panel) from the clock signal generator 31 between the unit shift registers SR to be driven at first and at last regarding each of the clock signals CLK1 to CLK3.

In general, the wiring has a parasitic resistance component and a parasitic capacitance component and they increase in proportion to the wiring length. Therefore, as the wiring length of the clock signal increases, the rising time and the falling time of the clock signal increase due to the parasitic components of the wiring. This causes an increase in rising and falling times of the selection signal of the gate line.

This phenomenon also appears in the same clock wiring, and the rising and falling times of the clock signal is delayed with the distance from the clock signal generator 31. Therefore, the wiring path in FIG. 2 has a difference in rising and falling speed of the outputted selection signal G between the unit shift registers $SR_{n-1}$, $SR_{n-3}$, and $SR_{n-5}$, and the unit shift registers $SR_{n-4}$, $SR_{n-2}$, and $SR_n$. As a result, there is a certain difference in written signal voltage between the pixels connected to the gate lines $GL_{n-1}$, $GL_{n-3}$, and $GL_{n-5}$, and pixels connected to the gate lines $GL_{n-4}$, $GL_{n-2}$, and $GL_n$.

As can be seen from FIG. 2, the gate lines $GL_{n-1}$, $GL_{n-3}$, and $GL_{n-5}$, and the gate lines $GL_{n-4}$, $GL_{n-2}$, and $GL_n$ are all arranged in the vicinity of the last row. In general, when the plurality of pixels show the same color, it is difficult to recognize the difference on the display with the naked eye in the case where the pixels are apart from each other even when there is a small difference in signal voltage in the pixels. However, the difference can be recognized when the pixels are close to each other, so that the above difference in rising and falling speed of the selection signal G is problematic.

Figure 18:
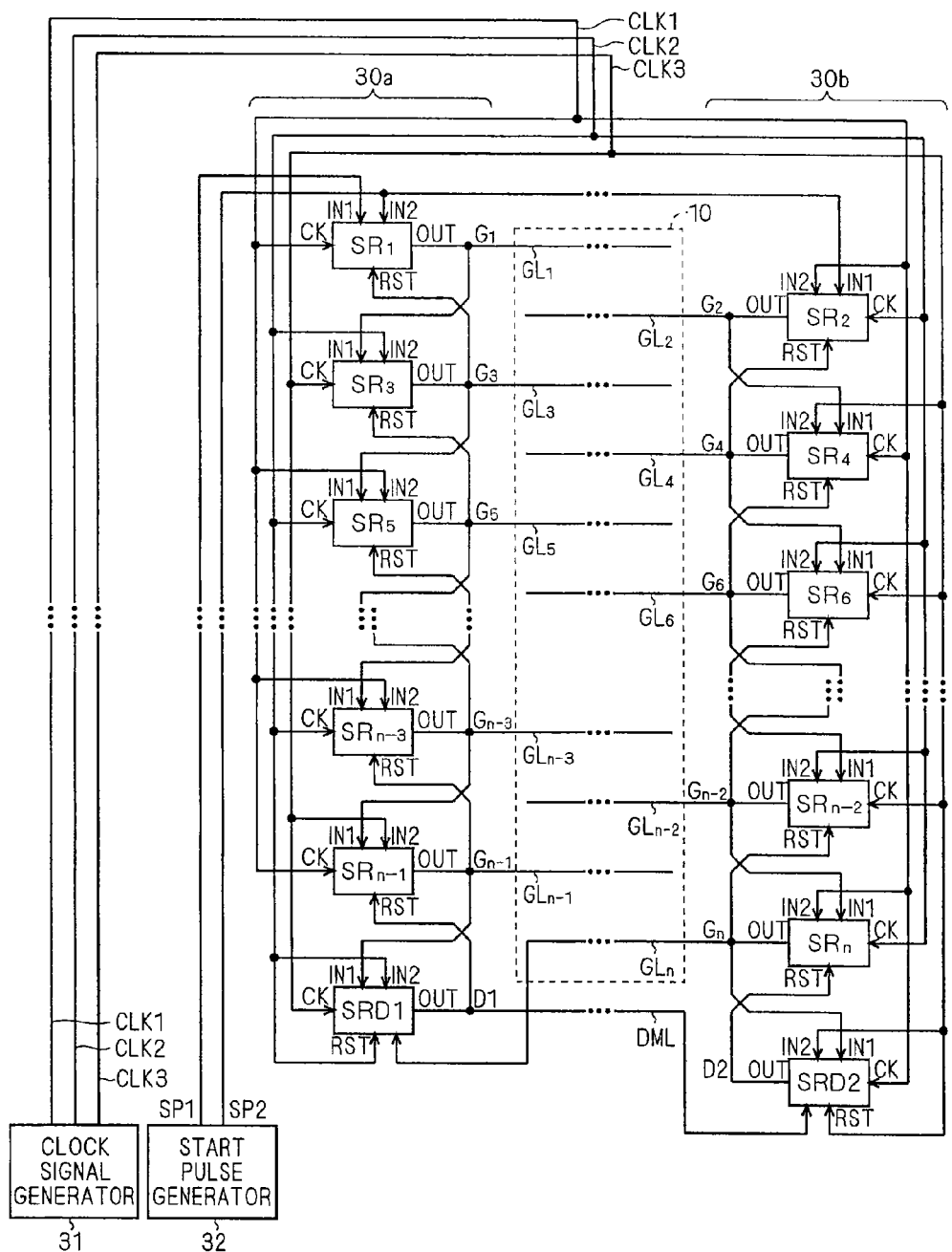
FIG. 18 is a block diagram showing a configuration of a gate line drive circuit according to a fifth embodiment.

FIG. 18 is a drawing showing a configuration of a gate line drive circuit 30 according to the fifth embodiment, in which clock wirings are arranged so that the clock signals CLK1 to CLK3 from the clock signal generator 31 can be supplied to the odd driver 30a and the even driver 30b with almost the same wiring length, with respect to the configuration in FIG. 2.

As shown in FIG. 18, each wiring of the clock signals CLK1 to CLK3 extending from the clock signal generator 31 is drawn to the upper side (top row) of the liquid crystal array section 10 without being connected to the unit shift register SR, and branched to the odd driver 30a side and the even driver 30b side. The clock wirings on the odd driver 30a side are sequentially connected to the unit shift registers SR from the top (in the order of unit shift registers $SR_1$, $SR_3$, and $SR_5$) at the positions close to branch points of the clock wirings. Similarly, the clock wirings on the even driver 30b side are sequentially connected to the unit shift registers SR from the top (in the order of unit shift registers $SR_2$, $SR_4$, and $SR_6$) at the positions close to branch points of the clock wirings. As a result, the unit shift registers SR to drive the adjacent rows have almost the same wiring distance from the clock signal generator 31.

As a matter of course, although the rising and falling speed of the clock signal decreases according to the wiring distance even in the wiring layout in FIG. 18, the clock signals having almost the same rising and falling speed are supplied to the unit shift registers SR arranged in the adjacent rows. Therefore, there is no difference in signal voltage caused by the difference in rising and falling speed of the clock signals between the pixels in the adjacent rows. As a result, the difference on the display is prevented from being recognized with the naked eye.

In addition, it is assumed that the source driver 40 described in FIG. 1 is arranged on the lower side (bottom row side) of the liquid crystal array section 10 in FIG. 18. Although the wiring layout in FIG. 18 can be applied to the arrangement in which the source driver 40 is disposed on the upper side (top row side) as shown in FIG. 1, this is not preferable because the wirings of the clock signals CLK1 to CLK3 intersect with the data line DL. When both wirings intersect with each other, the problem is that as well as causing the load capacitance of the data line D1 to increase, both of the wirings are capacitively coupled at the intersection point, and the level change of the clock signals CLK1 to CLK2 having large amplitude is problematically superimposed on the fine signal of the data line DL as a noise.

Sixth Embodiment

In the unit shift register SR shown in the first to fourth embodiments, the transistor Q3 is operated in the unsaturated region by boosting the gate (node N3) of the transistor Q3 (or Q3n or Q3r) which charges the gate (node N1) of the transistor Q1, with the transistor Q10 (or Q10n or Q10r) serving as the MOS capacitor element. Thus, the node N1 is charged (precharged) to the potential VDD.

However, since it is necessary to ensure a relatively large gate area in the MOS capacitor element, there is a problem that its area increases. Thus, according to this embodiment, a unit shift register SR in which the gate of the transistor Q3 is boosted when the node N1 is charged is implemented without using the MOS capacitor element. Thus, the display device can be smaller in area.

Figure 19:
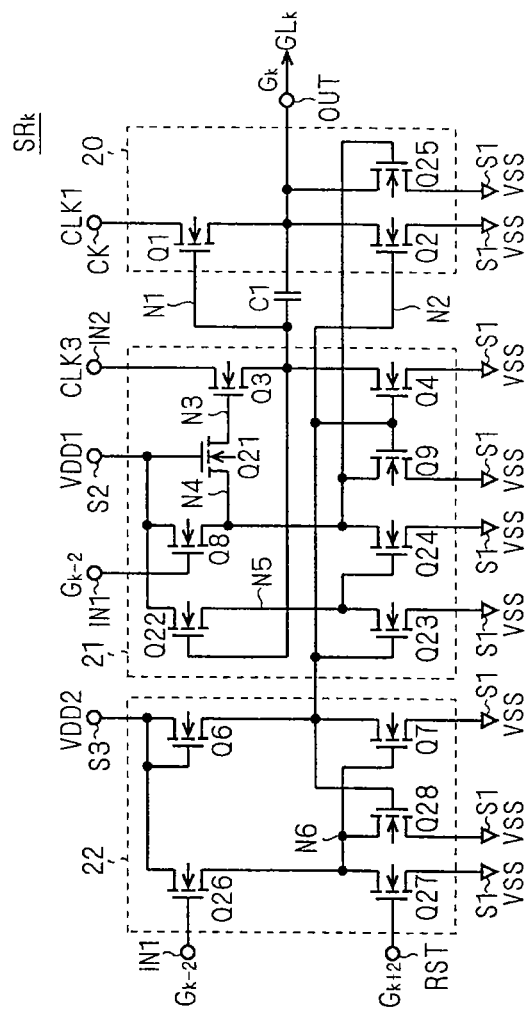
FIG. 19 is a circuit diagram of a unit shift register according to a sixth embodiment.

FIG. 19 is a circuit diagram showing a configuration of the unit shift register SR according to a sixth embodiment. The unit shift register $SR_k$ in the kth stage will be representatively described. As shown in FIG. 19, the unit shift register $SR_k$ has also a first input terminal IN1, a second input terminal IN2, an output terminal OUT, a clock terminal CK, and a reset terminal RST similar to the circuit in FIG. 3, and it can be used as the unit shift registers $SR_1$ to $SR_n$ in FIG. 2, for example.

The unit shift register $SR_k$ according to this embodiment is also composed of an output circuit 20, a pull-up drive circuit 21 and a pull-down drive circuit 22. The output circuit 20 includes a transistor Q1 (output pull-up transistor) to put the selection signal $G_k$ to the active state (H level) while the gate line $GL_k$ is selected, and transistors Q2 and Q25 (output pull-down transistors) to keep the selection signal $G_k$ in the inactive state (L level) while the gate line $GL_k$ is not selected.

The transistor Q1 is connected between the output terminal OUT and the clock terminal CK, and when the clock signal inputted to the clock terminal CK is supplied to the output terminal OUT, the selection signal $G_k$ is activated. In addition, the transistors Q2 and Q25 are connected between the output terminal OUT and a first power supply terminal S1 and when the output terminal OUT is discharged to the potential VSS, the selection signal $G_k$ is kept at the inactive level. Here, a node connected to the gate (control electrode) of the transistor Q1 is defined as a "node N1". The gate of the transistor Q2 is connected to an output end (defined as a "node N2") of the pull-down drive circuit 22 as will be described below.

A capacitor element C1 is provided between the gate and the source of the transistor Q1 (that is, between the output terminal OUT and the node N1). The capacitor element C1 is provided to enhance the boost effect of the node N1 associated with an increase in level of the output terminal OUT. The capacitor element C1 can be replaced with the transistor Q1 when the capacitance between the gate and the channel of the transistor Q1 is sufficiently high, so that it may be omitted in that case.

The pull-up drive circuit 21 drives the transistor Q1 (output pull-up transistor) and operates so as to put the transistor Q1 to the on state while the gate line $GL_k$ is selected and to put it to the off state while the gate line $GL_k$ is not selected. Therefore, the pull-up drive circuit 21 charges the node N1 (transistor Q1) in response to the activation of a selection signal $G_{k-2}$ inputted from the second previous row to the first input terminal IN1 (or a first or second start pulse SP1 or SP2) and the clock signal inputted to the second input terminal IN2 (the clock signal CLK3 in the case in FIG. 19), and discharges the node N1 in response to the activation of a selection signal $G_{k+2}$ inputted from the second next row to the reset terminal RST as a reset signal (or output signals D1 or D2 of dummy stages SRD1 or SRD2).

In the pull-up drive circuit 21, a transistor Q3 is connected between the node N1 and the second input terminal IN2 to charge the node N1 by supplying the H level potential VDD of the second input terminal IN2 to the node N1. In addition, a transistor Q4 is connected between the node N1 and the first power supply terminal S1 to discharge the node N1 by supplying the potential VSS of the first power supply terminal S1 to the node N1. The gate of the transistor Q4 is connected to the node N2.

A node connected to the gate of the transistor Q3 is defined as a "node N3". The pull-up drive circuit 21 has a transistor Q21 having one current electrode connected to the node N3, and a gate connected to the second power supply terminal S2. The other current electrode of the transistor Q21 is defined as a "node N4".

A transistor Q8 is connected between a second power supply terminal S2 and the node N4, and its gate is connected to the first input terminal IN1. The drain of the transistor Q8 may be connected to the first input terminal IN1 together with the gate. In addition, transistors Q9 and Q24 are connected between the node N4 and the first power supply terminal S1. The gate of the transistor Q9 is connected to the node N2. In addition, the gate of the transistor Q24 is defined as a "node N5".

A transistor Q22 is connected between the node N5 and the second power supply terminal S2, and its gate is connected to the node N1. A transistor Q23 is connected between the node N5 and the first power supply terminal S1, and its gate is connected to the node N2.

The gate of the transistor Q25 of the output circuit 20 described above is connected to the node N4 of the pull-up drive circuit 21 as shown in FIG. 19.

The pull-down drive circuit 22 has an inverter composed of transistors Q6 and Q7 connected between the third power supply terminal S3 and the first power supply terminal S1 in series, and the output end of the inverter serves as the output end (node N2) of this pull-down drive circuit 22. The transistor Q6 is connected between the node N2 and the third power supply terminal S3, and its gate is connected to the third power supply terminal S3. The transistor Q7 is connected between the node N2 and the first power supply terminal S1. A node connected to the gate of the transistor Q7 serves as the input end of the inverter and this is defined as a "node N6".

The input level of the inverter (level of the node N6) is controlled by an input circuit composed of transistors Q26 and Q27. The transistor Q26 is connected between the node N6 and the third power supply terminal S3, and its gate is connected to the first input terminal IN1. The transistor Q27 is connected between the node N6 and the first power supply terminal S1, and its gate is connected to the reset terminal RST. This input circuit puts the node N6 to the H level in response to the activation of the selection signal $G_{k-2}$ in the second previous row, and puts the node N6 to the L level in response to the activation of the selection signal $G_{k+2}$ in the second next row. Therefore, the output level of the inverter (level of the node N2) becomes the L level in response to the activation of the selection signal $G_{k-2}$ in the second previous row, and becomes the H level in response to the activation of the selection signal $G_{k+2}$ in the second next row.

In addition, the pull-down drive circuit 22 has a transistor Q28 that has a gate connected to the node N2 and is connected between the node N6 and the first power supply terminal S1. The transistor Q28 is turned on when the node N2 becomes the H level, and keeps the node N6 at the L level of low impedance. The transistor Q28 prevents the node N6 from becoming a floating state after the input circuit sets the node N6 at the L level, and functions to prevent an error operation of the pull-down drive circuit 22. In addition, the Q 28 is set such that its on-resistance is sufficiently lower than the transistor Q26.

Figure 20:
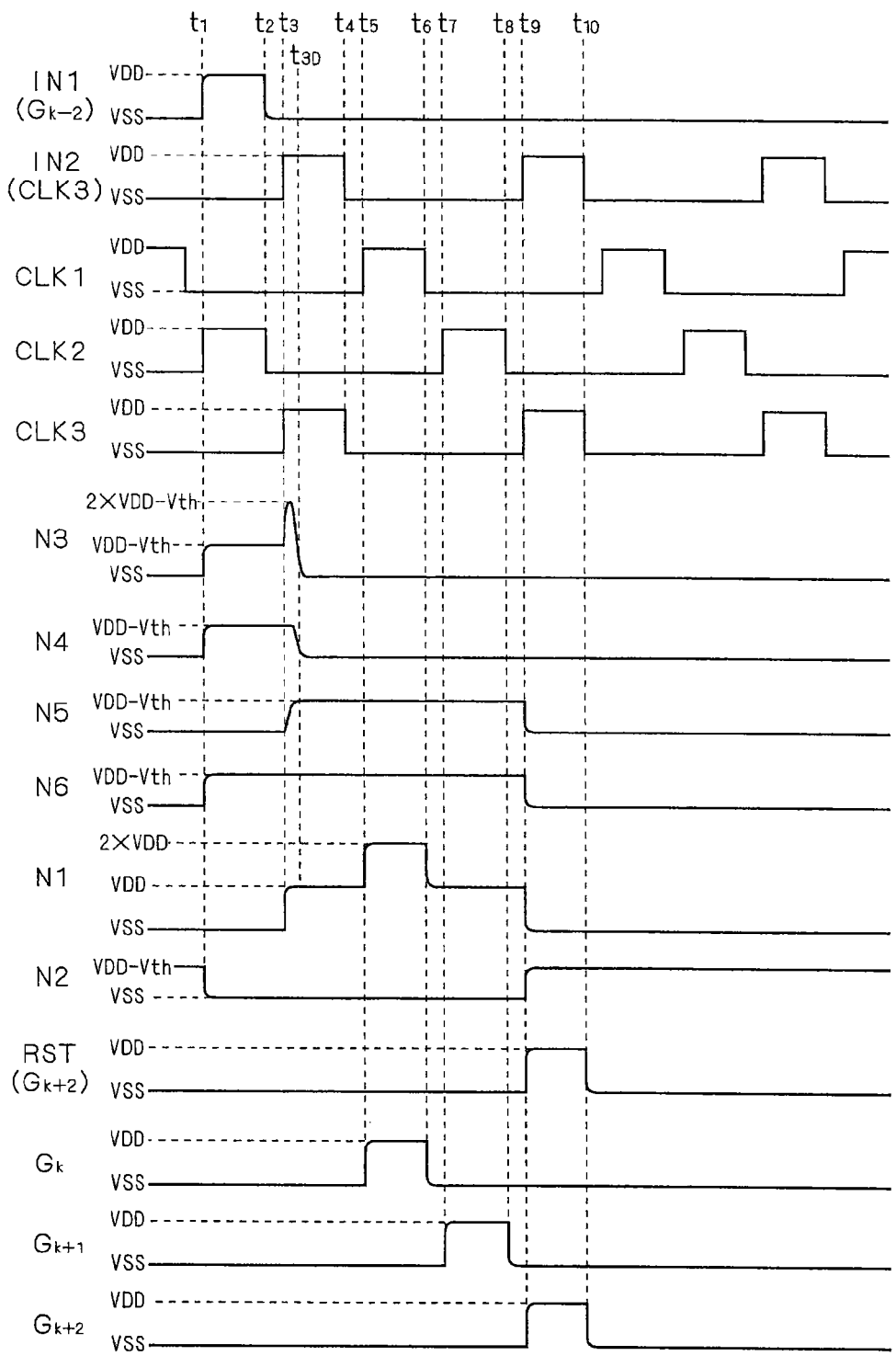
FIG. 20 is a timing chart to describe an operation of the unit shift register according to the sixth embodiment.

FIG. 20 is a timing chart to describe an operation of the unit shift register $SR_k$ according to the sixth embodiment. The operation of the unit shift register $SR_k$ will be described with reference to the drawing hereinafter.

Here, it is assumed that the clock signal CLK1 is inputted to the clock terminal CK of the unit shift register $SR_k$. Similar to the first embodiment, since the second input terminal IN2 is supplied with the clock signal advanced in phase by one horizontal period with respect to the one supplied to the clock terminal CK, the second input terminal IN2 of the unit shift register $SR_k$ is supplied with the clock signal CLK3.

As an initial state of the unit shift register $SR_k$ (just before a time $t_1$), it is assumed that the nodes N1, N3, N4, N5, and N6 are set to the L level (VSS) and the node N2 is set at the H level (VDD−Vth) (reset state). In this state, since the transistor Q1 is in the off state and the transistor Q2 is in the on state, the output terminal OUT (selection signal $G_k$) is at the L level of low impedance regardless of the level of the clock signal CLK1.

In addition, just before the time $t_1$, it is assumed that the clock terminal CK (clock signal CLK1), the first input terminal IN1 (selection signal $G_{k-2}$ in the second previous row), the second input terminal IN2 (clock signal CLK3) and the reset terminal RST (selection signal $G_{k+2}$ in the second next row) are all set to the L level in the unit shift register $SR_k$. In this case, since the node N2 is at the H level, the node N3 is at the L level (VSS) of low impedance through the transistors Q9 and Q21 in the on state. In addition, the transistors Q4 and Q28 are in the on state, and the nodes N1 and N6 are also at the L level (VSS) of low impedance.

From this state, it is assumed that the selection signal $G_{k-2}$ in the second previous row (start pulse SP1 in the case of the unit shift register $SR_1$ in the first stage) is activated at the time $t_1$. Thus, the transistor Q26 is turned on in the pull-down drive circuit 22. Since the on-resistance value of the transistor Q26 is set sufficiently lower than the on-resistance value of the transistor Q28, the level of the node N6 increases. Accordingly, the transistor Q7 is turned on and the level of the node N2 decreases. Then, the transistor Q28 is turned off and the node N6 is rapidly charged to the H level (VDD−Vth). The node N2 becomes the L level potential (roughly VSS) determined by the on-resistance ratio of the transistors Q6 and Q7.

On the other hand, the transistor Q8 is turned on in the pull-up drive circuit 21. In addition, since the on-resistance value of the transistor Q9 becomes high due to the decrease in level of the node N2, the node N4 is charged to the H level (VDD−Vth). The increase in level of the node N4 is transmitted to the node N3 through the transistor Q21, and the node N3 also becomes the H level (VDD−Vth).

When the node N2 becomes the L level, the transistors Q1 and Q2 become the off state as described above, but the transistor Q25 of the output circuit 20 is turned on because the node N4 becomes the H level, so that the output terminal OUT is kept at the L level of low impedance. As will be described below, since the period during which the transistors Q1 and Q2 are both in the off state is roughly equal to one horizontal period (1H), the transistor Q25 may be omitted when the noise of the gate line $GL_k$ is small in this period.

When the selection signal $G_{k-2}$ in the second previous row becomes the L level at a time $t_2$, the transistors Q8 and Q26 are turned off, but since the nodes N3, N4, and N6 are kept in the floating state at the H level, there is no level change in each node of the unit shift register $SR_k$.

When the clock signal CLK3 is activated at a time $t_3$, the node N1 is charged through the transistor Q3 in the on state, and the level of the node N1 increases. At this time, the capacitance is coupled between the second input terminal IN2, and the node N1 and the node N3 by the parasitic capacitance of the transistor Q3 (such as the capacitance between the gate and the channel, and the overlap capacitance between the gate and the source/drain), so that the level of the node N3 increases according to the increase in level of the second input terminal IN2 and the node N1. When the node N3 increases in level, the transistor Q21 is turned off (the operation of the transistor Q21 will be described in detail below), and the node N3 increases in level to be high enough to operate the transistor Q3 in the unsaturated region. Therefore, the node N1 is charged (precharged) at high speed and immediately becomes the H level of the potential VDD following the clock signal CLK3. Accordingly, the transistor Q1 is turned on.

On the other hand, the transistor Q22 is turned on in response to the increase in level of the node N1. Since the transistor Q23 is in the off state, the node N5 is charged to the H level. Accordingly, the transistor Q24 is turned on, and the level of the node N4 decreases. Since the transistor Q21 is turned on in response to the decrease in level of the node N4, the node N3 is discharged to the L level almost at the same time with the node N4. Thus, the transistor Q3 is turned off. In FIG. 19, a time $t_{3D}$ represents the time when the node N3 changes to the L level.

Here, attention is paid to the operation of the transistor Q21 when the node N1 is precharged. Before the node N1 is precharged, the node N4 is at the H level (VDD−Vth), and the gate voltage of the transistor Q21 is fixed to the VDD (=VDD1), so that the transistor Q21 applies a current from the node N4 to the node N3, and charges the node N3 to the H level (VDD−Vth).

Thus, when the clock signal CLK3 rises and the transistor Q3 starts precharging the node N1, the node N3 is boosted, so that the node N4 side becomes the source of the transistor Q21 based on the potential relationship. At this point, since the potential of the node N4 is at VDD−Vth, the voltage between the gate (second power supply terminal S2) and the source (node N4) of the transistor Q21 becomes Vth and the transistor Q21 becomes a boundary state between the on state and the off state. Thus, a sub-threshold current is applied to the transistor Q21 in a direction from the node N3 to the node N4. Since the current is very small, an electric charge discharged from the node N3 for a short period (from time $t_3$ to $t_{3D}$) during which the node N3 is boosted can be as small as negligible.

Thus, when the node N4 becomes the L level after the node N1 has been precharged to the H level (VDD), the transistor Q21 is turned on, and the current flows from the node N3 to the node N4, and the node N3 becomes the L level (VSS). After that, the transistor Q21 is still in the on state while the node N4 is at the L level, and the node N3 is kept at the L level.

As described above, the transistor Q21 serves as a resistance element to transmit the potential of the node N4 to the node N3 at the stage in which the node N4 is at the H level before the precharge of the node N1, and serves as a cut-off element to cut off the transmission between the node N3 and the node N4 at the stage in which the node N3 has been boosted at the time of the precharging start of the node N1. In addition, at the stage in which the node N1 is further precharged and the level of the node N4 is decreasing, and at the stage in which the node N4 is kept at L level after that, the transistor Q21 serves as a resistance element to discharge the electric charge of the node N3 to the node N4. That is, the transistor Q21 serves as a charging/discharging circuit which charges the node N3 after the selection signal $G_{k-2}$ in the second previous row is activated and before the clock signal CLK3 is activated, and then discharges the node N3 before the clock signal CLK3 is inactivated.

While the description has been made assuming that the potential (VDD1) supplied to the gate of the transistor Q21 is at the VDD which is the same potential of the H level of the selection signal G at each stage (the potential of the L level of the clock signals CLK1 to CLK3), the potential supplied to the gate of the transistor Q21 may be any potential as long as the node N3 can be charged to the H level when the node N4 is at the H level, and the current does not flow from the node N3 to the node N4 through the transistor Q21 when the node N3 is boosted. Although this potential may be lower then VDD, in this case, it is to be noted that the charging speed of the node N1 by the transistor Q3 decreases because the level of the node N3 after boosted is low.

FIG. 20 is referred to again. While the clock signal CLK3 becomes the L level at a time $t_4$, the node N1 is kept at the H level of the potential VDD because the transistor Q3 has been already turned off at the time $t_{3D}$.

Thus, when the clock signal CLK1 rises at a time $t_5$, the level change is transmitted to the output terminal OUT through the transistor Q1 in the on state, and the level of the selection signal $G_k$ increases. At this time, the node N1 is boosted due to the coupling through the capacitor element C1, and the transistor Q1 is operated in the unsaturated region.

Thus, the selection signal $G_k$ becomes the H level of the potential VDD which is the same as the H level of the clock signal CLK1.

When the clock signal CLK1 falls at a time $t_6$, a current flows from the output terminal OUT to the clock terminal CK through the transistor Q1 in the on state, and the output OUT is discharged. As a result, the selection signal $G_k$ becomes the L level. At this time, the node N1 returns to the level (VDD) before boosted by the coupling through the capacitor element C1.

The clock signal CLK2 is activated at a time $t_7$, and then the clock signal CLK2 is inactivated at a time $t_8$, but there is no level change in each node of the unit shift register $SR_k$ at this time.

When the clock signal CLK3 rises at a time $t_9$, the selection signal $G_{k+2}$ in the second next row becomes the H level. Thus, the transistor Q27 is turned on and the node N6 becomes the L level in the unit shift register $SR_k$. Accordingly, the transistor Q7 is turned off and the node N2 is charged by the transistor Q6 to the H level.

When the node N2 becomes the H level, the transistor Q4 is turned on and the node N1 is discharged to the L level. Accordingly, the transistor Q1 is turned off, but the output terminal OUT is kept at the L level of low impedance because the transistor Q2 is turned on. In addition, since the transistor Q23 is turned on and the transistor Q22 is turned off, the node N5 is discharged to the L level. Accordingly, the transistor Q24 is turned off, but the transistor Q9 is turned off at this time, so that the nodes N4 and N3 are kept at the L level of low impedance. As a result, the unit shift register $SR_k$ returns to the reset state in which the transistor Q1 is in the off state and the transistor Q2 is in the on state.

Then, although the selection signal $G_{k+2}$ in the second next row returns to the L level at a time $t_{10}$, the unit shift register $SR_k$ is kept in the reset state until the selection signal $G_{k-2}$ in the second previous rows is activated in the next frame period. This is because a half latch circuit composed of the transistors Q6, Q7, and Q28 keeps the level of the nodes N2 and N6. In addition, since the transistor Q2 is in the on state during that period, the output terminal OUT is kept at the L level of low impedance.

In the unit shift register SR according to this embodiment, the parasitic capacitance of the transistor Q3 (such as the capacitance between the gate and the channel, and the overlap capacitance between the gate and the source/drain) functions as a boosting means for boosting the node N3 when the clock signal CLK3 is activated after the selection signal $G_{k-2}$ in the second previous row has been activated. This boosting means increases the gate potential of the transistor Q3 when the node N1 is precharged, and operates the transistor Q3 in the unsaturated region. Thus, it is not necessary to separately provide the MOS capacitor element to boost the node N3. Therefore, the gate line drive circuit which is smaller in area can be implemented.

Seventh Embodiment

Figure 21:
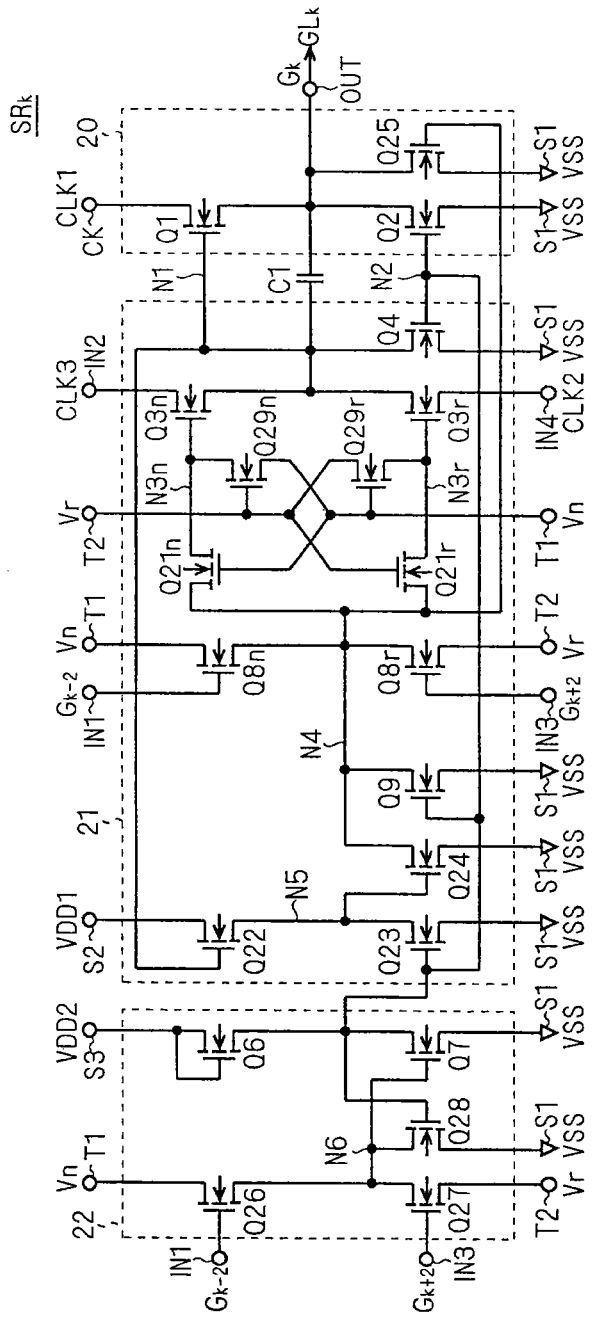
FIG. 21 is a circuit diagram of a unit shift register according to a seventh embodiment.

According to a seventh embodiment, the technique according to the sixth embodiment is applied to the shift register capable of changing the shift direction of the signal. FIG. 21 is a circuit diagram showing a configuration of a unit shift register SR according to the seventh embodiment. Here also, the unit shift register $SR_k$ in the kth stage will be described representatively. The unit shift register $SR_k$ may be used as the unit shift register $SR_1$ to the unit shift register $SR_k$ in FIG. 12, for example.

Similar to the circuit in FIG. 13, the unit shift register $SR_k$ has first to fourth input terminals IN1 to IN4, an output terminal OUT, a clock terminal CK, a first voltage signal terminal T1, and a second voltage signal terminal T2. Signals supplied to these terminals are the same as described in the second embodiment (FIG. 12).

Here, a description will be made assuming that the clock terminal CK is supplied with the clock signal CLK1, the second input terminal IN2 is supplied with the clock signal CLK3, and the fourth input terminal IN4 is supplied with the clock signal CLK2 in the unit shift register $SR_k$ (corresponding to the unit shift register $SR_4$ in FIG. 12).

In the unit shift register $SR_k$ in FIG. 21, an output circuit 20 has the same configuration as that in FIG. 19. That is, the output circuit 20 is composed of a transistor Q1 to supply the clock signal CLK1 to the output terminal OUT, and transistors Q2 and Q25 to discharge the output terminal OUT during an unselected period.

Similar to FIG. 19, a pull-down drive circuit 22 is also composed of an inverter composed of transistors Q6 and Q7, an input circuit composed of transistors Q26 and Q27, and a transistor Q28, and the configuration of the input circuit is different from that in FIG. 19. That is, in the unit shift register $SR_k$ shown in FIG. 21, the transistor Q26 is connected between the first voltage signal terminal T1 and a node N6 (the gate of the transistor Q7), and its gate is connected to the first input terminal IN1. The transistor Q27 is connected between the second voltage signal terminal T2 and the node N6, and its gate is connected to the third input terminal IN3. The transistors Q26 and Q27 are set such that their on-resistances are sufficiently lower than that of the transistor Q28.

Therefore, at the time of forward shift (the first voltage signal Vn is at the H level, and the second voltage signal Vr is at the L level), the input circuit puts the node N6 to the H level in response to the activation of the selection signal $G_{k-2}$ in the second previous row, and puts the node N6 to the L level in response to the activation of the selection signal $G_{k+2}$ in the second next row. Meanwhile, at the time of backward shift (the first voltage signal Vn is at the L level, and the second voltage signal Vr is at the H level), it puts the node N6 to the H level in response to the activation of the selection signal $G_{k+2}$ in the second next row, and puts the node N6 to the L level in response to the activation of the selection signal $G_{k-2}$ in the second previous row.

The gate of the transistor Q2 of the output circuit 20 is connected to a node N2 serving as the output end of the inverter composed of the transistors Q6 and Q7 (the output end of the pull-down drive circuit 22) similar to FIG. 19.

Meanwhile, in a pull-up drive circuit 21, while a part composed of transistors Q4, Q9, Q22, Q23, Q24 is the same circuit as in FIG. 19, remaining part is a circuit composed of the following transistors Q3n, Q3r, Q21n, Q21r, Q29n, Q29r, Q8n, and Q8r. Similar to the case in FIG. 19, a node connected to drains of the transistors Q24 and Q9 is defined as a "node N4". The gate of the transistor Q25 of the output circuit 20 is connected to the node N4.

The transistor Q3n is connected between the second input terminal IN2 and the gate (node N1) of the transistor Q1. When a node connected to the gate of the transistor Q3n is defined as a "node N3n", the transistor Q21n is connected between the node N3n and the node N4, and its gate is connected to the first voltage signal terminal T1. The transistor Q29n is connected between the node N3n and the first voltage signal terminal T1, and its gate is connected to the second voltage signal terminal T2. The transistor Q8n is connected between the first voltage signal terminal T1 and the node N4, and its gate is connected to the first input terminal IN1.

The transistor Q3r is connected between the fourth input terminal IN4 and the node N1. When a node connected to the gate of the transistor Q3r is defined as a "node N3r", the transistor Q21r is connected between the node N3r and the node N4, and its gate is connected to the second voltage signal terminal T2. The transistor Q29r is connected between the node N3r and the second voltage signal terminal T2, and its gate is connected to the first voltage signal terminal T1. The transistor Q8r is connected between the second voltage signal terminal T2 and the node N4, and its gate is connected to the third input terminal IN3.

At the time of forward shift, since the first voltage signal Vn is at the H level (VDD) and the second voltage signal Vr is at the L level (VSS), in the pull-up drive circuit 21, the transistor Q21n is in the on state, the transistor Q21r is in the off state, the transistor Q29n is in the off state, and the transistor Q29r is in the on state. Since the node N3n is charged through the transistor Q21n and becomes the H level (VDD−Vth), the transistor Q3n is turned on. In addition, since the node N3r is kept at the L level (VSS) by the transistor Q29r in the on state, the transistor Q3r is kept in the off state.

In the pull-down drive circuit 22, the potential of the drain (first voltage signal terminal T1) of the transistor Q26 is VDD, and the potential of the source (second voltage signal terminal T2) of the transistor Q27 is VSS.

In this state, the unit shift register $SR_k$ in FIG. 21 is equivalent to the circuit in FIG. 19. That is, the transistors Q3n, Q8n, and Q21n in the pull-up drive circuit 21 perform the same operations as those of the transistors Q3, Q8, and Q21 in FIG. 19, respectively, and the transistors Q3r and Q21r do not contribute to the operation of the unit shift register $SR_k$ (the transistors Q3r and Q21r are kept in the off state. Although the transistor Q8 is in the on state while the selection signal $G_{k+2}$ in the second next row is activated, the node N4 is at the L level at that time (refer to FIG. 20)). Therefore, the transistor Q3n functions as a first charging circuit to charge the node N1 in response to the activation of the selection signal $G_{k-2}$ in the second previous row. In addition, transistor Q21n functions as a first charging/discharging circuit which charges the node N3n after the selection signal $G_{k-2}$ in the second previous row is activated and before the clock signal CLK3 is activated, and then discharges the node N3n before the clock signal CLK3 is inactivated.

In addition, the pull-down drive circuit 22 operates similar to that in FIG. 19. That is, the pull-down drive circuit 22 puts the node N2 to the L level in response to the activation of the selection signal $G_{k-2}$ in the second previous row, and puts the node N2 to the H level in response to the activation of the selection signal $G_{k+2}$ in the second next row. In addition, after the node N2 has been put to the H level, the state is kept by a half latch circuit composed of the transistors Q6, Q7 and Q28 until the selection signal $G_{k-2}$ in the second previous row is activated in the next frame.

Therefore, at the time of forward shift, the unit shift register $SR_k$ becomes the set state (the transistor Q1 is in the on state, and the transistor Q2 is in the off state) in response to the activation of the selection signal $G_{k-2}$ inputted from the second previous row to the first input terminal IN1 and the clock signal CLK3, and becomes the reset state (the transistor Q1 is in the off state, and the transistor Q2 is in the on state) in response to the activation of the selection signal $G_{k+2}$ inputted from the second next row to the third input terminal IN3. Therefore, the unit shift register $SR_k$ functions as the unit shift register performing the forward shift.

At the time of backward shift, since the first voltage signal Vn is at the L level (VSS) and the second voltage signal Vr is at the H level (VDD), in the pull-up drive circuit 21, the transistor Q21n is in the off state, the transistor Q21r is in the on state, the transistor Q29n is in the on sate, and the transistor Q29r is in the off state. Since the node N3r is charged through the transistor Q21r and becomes the H level (VDD−Vth), the transistor Q3r is turned on. In addition, since the node N3n is kept at the L level (VSS) by the transistor Q29n in the on state, the transistor Q3n is kept in the off state.

In the pull-down drive circuit 22, the potential of the drain (first voltage signal terminal T1) of the transistor Q26 is VSS, and the potential of the source (second voltage signal terminal T2) of the transistor Q27 is VDD.

In this state, contrary to the forward shift, the transistors Q3r, Q8r, and Q21r in the pull-up drive circuit 21 of the unit shift register $SR_k$ perform the same operations as those of the transistors Q3, Q8, and Q21 in FIG. 19, respectively, and the transistors Q3n, Q8n, and Q21n do not contribute to the operation of the unit shift register $SR_k$. That is, the transistor Q3r functions as a second charging circuit to charge the node N1 in response to the activation of the selection signal $G_{k+2}$ in the second next row. In addition, transistor Q21r functions as a second charging/discharging circuit which charges the node N3n from when the selection signal $G_{k+2}$ in the second next row is activated till when the clock signal CLK2 is activated, and then discharges the node N3n before the clock signal CLK2 is inactivated.

In addition, contrary to the forward shift, the pull-down drive circuit 22 puts the node N2 to the L level in response to the activation of the selection signal $G_{k+2}$ in the second next row, and puts the node N2 to the H level in response to the activation of the selection signal $G_{k-2}$ in the second previous row. In addition, after the node N2 has been put to the H level, the state is kept by a half latch circuit composed of the transistors Q6, Q7 and Q28 until the selection signal $G_{k-2}$ in the second previous row is activated in the next frame.

Therefore, at the time of backward shift, the unit shift register SR becomes the set state (the transistor Q1 is in the on state, and the transistor Q2 is in the off state) in response to the activation of the selection signal $G_{k+2}$ inputted from the second next row to the third input terminal IN3, and becomes the reset state (the transistor Q1 is in the off state, and the transistor Q2 is in the on state) in response to the activation of the selection signal $G_{k-2}$ inputted from the second previous row to the first input terminal IN1. Therefore, the unit shift register $SR_k$ functions as the unit shift register performing the backward shift.

In the unit shift register SR according to this embodiment, the parasitic capacitances of the transistors Q3n and Q3r (such as the capacitance between the gate and the channel and the overlap capacitance between the gate and the source/drain) functions as a boosting means for the nodes N3n and N3r. Thus, when the transistor Q3n or Q3r precharges the node N1, its gate potential increases, and the transistors Q3n and Q3r operate in the unsaturated region. Thus, it is not necessary to separately provide the MOS capacitor element to boost the nodes N3n and N3r. Therefore, the gate line drive circuit small in area can be implemented. As a result, the gate line drive circuit capable of bidirectional shifting, which is smaller than those in the second and third embodiments, can be implemented.

Eighth Embodiment

As shown in FIG. 2 and FIG. 12, the description above illustrates an example in which the odd driver 30a and the even driver 30b are arranged with the liquid crystal array section 10 sandwiched therebetween. Accordingly, a formation region of the gate line drive circuit 30 on the substrate can be efficiently used. However, a larger length is required for wiring (clock wiring) for supplying the clock signals CLK1 to CLK3 to the unit shift registers SR in the gate line drive circuit 30, which increases a parasitic resistance and a parasitic capacitance of the clock wiring. As a result, if delay is caused in the clock signal, higher speed operation of the gate line drive circuit 30 may be hindered.

Therefore, in this embodiment, assuming a case where high speed operation is emphasized, the unit shift resisters SR in the gate line drive circuit 30 (odd driver 30a and even driver 30b) are all formed on one side of the liquid crystal array section 10, to thereby reduce the length of clock wiring. In particular, the length of the clock wiring can be made shorter by disposing the gate line drive circuit 30 on a side closer to the clock signal generator 31 compared with the position of the liquid crystal array section 10, which is effective.

Figure 23:
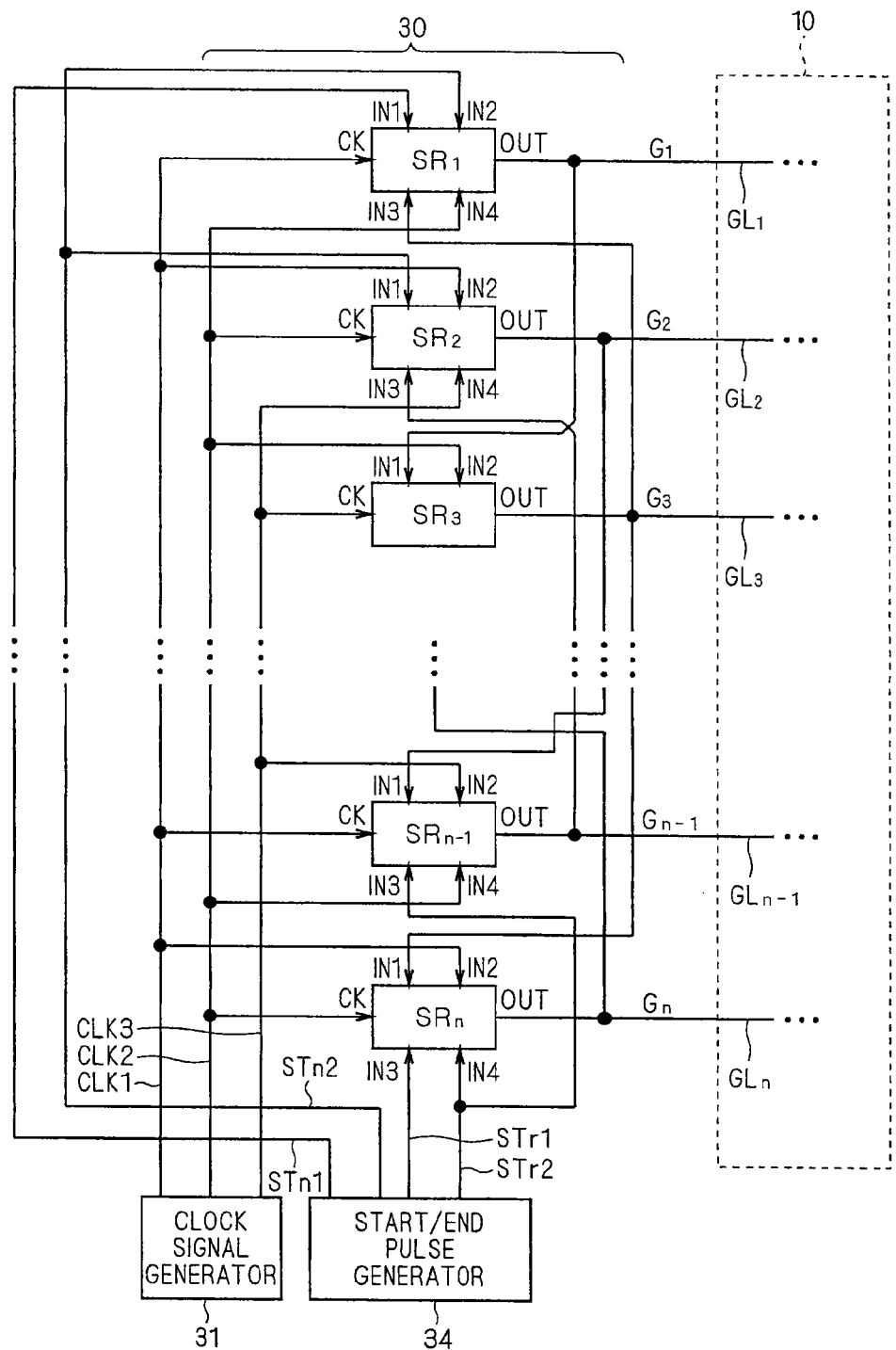
FIG. 23 is another block diagram showing the configuration of the gate line drive circuit according to the eighth embodiment.

FIG. 22 and FIG. 23 are block diagrams showing a configuration of a gate line drive circuit according to an eighth embodiment. For example, in the case where the gate line drive circuit 30 is composed of the unit shift registers SR which perform only forward shift as shown in FIG. 19, a configuration of FIG. 22 is obtained (relationship of connection between respective components is the same as in FIG. 2). Alternatively, in a case where the gate line drive circuit 30 is composed of the unit shift registers SR which perform bidirectional shift as shown in FIG. 21, a configuration of FIG. 23 is obtained (relationship of connection between respective components is the same as in FIG. 12).

According to this embodiment, the clock wiring can be reduced, whereby a parasitic resistance and a parasitic capacitance can be shortened, which prevents delay of a clock signal. Therefore, this embodiment is conducive to higher speed operation of the gate line drive circuit 30.

While the invention has been shown and described in detail, the foregoing description is in all aspects illustrative and not restrictive. It is therefore understood that numerous modifications and variations can be devised without departing from the scope of the invention.

What is claimed is:

1. An electro-optical device comprising a scanning line drive circuit having:
    a plurality of scanning lines;
    a plurality of signal lines intersecting with said plurality of scanning lines;
    a plurality of pixels formed in the vicinity of cross points between said plurality of scanning lines and said plurality of signal lines;
    an odd driver including a plurality of cascaded unit shift registers to drive odd lines of said plurality of scanning lines and capable of switching a shift direction of a signal; and
    an even driver including a plurality of cascaded unit shift registers to drive even lines of said plurality of scanning lines and capable of switching the shift direction of the signal, wherein
    said odd and even drivers are formed on the same substrate as said plurality of pixels and said plurality of scanning lines so as to sandwich said pixels,
    each of the unit shift registers of the odd and even drivers has:
        a first input terminal receiving an output signal of the unit shift register positioned in the second previous line; and
        a third input terminal receiving an output signal of the unit shift register positioned in the second next line,
    each of the unit shift registers of the odd and even drivers operates so as to:
        activate, at a time of forward shift, its own output signal delayed by the scanning period for two lines from an active period of the signal received by said first input terminal; and
        activate, at a time of backward shift, its own output signal delayed by the scanning period for two lines from an active period of the signal received by said third input terminal, and
    a phase of the output signal of the odd driver is different from a phase of the output signal of the even driver by a scanning period for one line.

2. The electro-optical device according to claim 1, wherein each of the unit shift registers of the odd and even drivers comprises:
    an output terminal outputting an output signal;
    a second input terminal receiving a first clock signal having the same phase as that of an output signal of the unit shift register positioned in the previous line;
    a fourth input terminal receiving a second clock signal having the same phase as that of an output signal of the unit shift register positioned in the next line;
    a clock terminal receiving a third clock signal delayed in phase by the scanning period for one line from the first clock signal at the time of forward shift and delayed in phase by the scanning period for one line from the second clock signal at the time of backward shift;
    a first transistor supplying said third clock signal to said output terminal;
    a second transistor supplying a power supply potential to a first node connected to a control electrode of said first transistor;
    a charging circuit charging a second node connected to a control electrode of said second transistor, based on a signal of a predetermined third node;
    a boosting circuit boosting said second node based on a signal of a predetermined fourth node; and
    a switching circuit connecting said first input terminal to said third node and connecting said third input terminal to said fourth node at the time of forward shift, and connecting said third input terminal to said third node and connecting said fourth input terminal to said fourth node at the time of backward shift.

3. The electro-optical device according to claim 2, wherein said charging circuit is a third transistor having a control electrode connected to said third node and charging said second node, and
said boosting circuit is a MOS capacitor element capacitively coupling said second node with said fourth node.

4. The electro-optical device according to claim 3, wherein said MOS capacitor element is composed of a MOS transistor, the MOS transistor having a gate functioning as one terminal of the MOS capacitor element and at least one current electrode functioning as the other terminal of the MOS capacitor element.

5. The electro-optical device according to claim 4, wherein a gate length of said MOS transistor is longer than a gate width thereof.

6. The electro-optical device according to claim 4, wherein said MOS transistor has current electrodes having different widths, and the current electrode having a narrower width is used as the other terminal of said MOS capacitor element.

7. The electro-optical device according to claim 6, wherein the current electrode having a longer width of the MOS transistor is supplied with a constant voltage when the gate of the MOS transistor is at an inactive level, and is made to be a floating state when the gate of the MOS transistor is at an active level.

8. The electro-optical device according to claim 1, wherein each of the unit shift registers of the odd and even drivers comprises:
    an output terminal outputting an output signal;
    a second input terminal receiving a first clock signal having the same phase as that of an output signal of the unit shift register positioned in the previous line;

a fourth input terminal receiving a second clock signal having the same phase as that of an output signal of the unit shift register positioned in the next line;

a clock terminal receiving a third clock signal delayed in phase by the scanning period for one line from the first clock signal at the time of forward shift and delayed in phase by the scanning period for one line from the second clock signal at the time of backward shift;

first and second voltage signal terminals receiving mutually complementary first and second voltage signals, respectively;

a first transistor supplying said third clock signal to said output terminal;

a second transistor supplying said first voltage signal to a first node connected to a control electrode of said first transistor;

a first charging circuit supplying said first voltage signal to a second node connected to a control electrode of said second transistor, based on the signal received by said first input terminal;

a first boosting circuit boosting said second node based on said first clock signal;

a third transistor supplying said second voltage signal to said first node;

a second charging circuit supplying said second voltage signal to a third node connected to a control electrode of said third transistor, based on the signal received by said third input terminal; and a second boosting circuit boosting said third node based on said second clock signal.

9. The electro-optical device according to claim 8, wherein said first charging circuit is a fourth transistor having a control electrode connected to said first input terminal and connected between said second node and said first voltage signal terminal, said first boosting circuit is a MOS capacitor element capacitively coupling said second node with said second input terminal, said second charging circuit is a fifth transistor having a control electrode connected to said third input terminal and connected between said third node and said second voltage signal terminal, and said second boosting circuit is a MOS capacitor element capacitively coupling said third node with said fourth input terminal.

10. The electro-optical device according to claim 9, wherein said MOS capacitor element is composed of a MOS transistor, the MOS transistor having a gate functioning as one terminal of the MOS capacitor element and at least one current electrode functioning as the other terminal of the MOS capacitor element.

11. The electro-optical device according to claim 10, wherein a gate length of said MOS transistor is longer than a gate width thereof.

12. The electro-optical device according to claim 10, wherein said MOS transistor has current electrodes having different widths, and the current electrode having a narrower width is used as the other terminal of said MOS capacitor element.

13. The electro-optical device according to claim 12, wherein the current electrode having a longer width of the MOS transistor is supplied with a constant voltage when the gate of said MOS transistor is at an inactive level, and is made to be a floating state when the gate of the MOS transistor is at an active level.

14. The electro-optical device according to claim 1, wherein each of the unit shift registers of the odd and even drivers comprises:

an output terminal outputting an output signal;

a second input terminal receiving a first clock signal having the same phase as that of an output signal of the unit shift register positioned in the previous line;

a fourth input terminal receiving a second clock signal having the same phase as that of an output signal of the unit shift register positioned in the next line;

a clock terminal receiving a third clock signal delayed in phase by the scanning period for one line from the first clock signal at the time of forward shift and delayed in phase by the scanning period for one line from the second clock signal at the time of backward shift;

a first transistor supplying said third clock signal to said output terminal;

a second transistor supplying said first clock signal to a first node connected to a control electrode of said first transistor;

a third transistor supplying said second clock signal to said first node;

a first boosting unit boosting a second node connected to a control electrode of said second transistor to a voltage higher than an amplitude of said first clock signal when said first clock signal is activated following the activation of the signal received by said first input terminal at the time of forward shift; and a second boosting unit boosting a third node connected to a control electrode of said third transistor to a voltage higher than an amplitude of said second clock signal when said second clock signal is activated following the activation of the signal received by said third input terminal at the time of backward shift; wherein said third transistor is kept in an off state at the time of forward shift, and said second transistor is kept in an off state at the time of backward shift.

15. The electro-optical device according to claim 1, wherein said odd driver and said even driver are supplied with clock signals through wirings having roughly the same length.

16. The electro-optical device according to claim 1, wherein said scanning line drives a pixel of a display element.

17. The electro-optical device according to claim 1, wherein said scanning line drives a pixel of an imaging element.

18. A shift register circuit comprising:

first to fourth input terminals, an output terminal, and a clock terminal;

first and second voltage signal terminals supplied with mutually complementary first and second voltage signals, respectively;

a first transistor supplying a clock signal inputted to said clock terminal to said output terminal;

a second transistor supplying said first voltage signal to a first node connected to a control electrode of said first transistor;

a third transistor supplying said second voltage signal to said first node;

a fourth transistor having a control electrode connected to said first input terminal and supplying said first voltage signal to a second node connected to a control electrode of said second transistor;

a first MOS capacitor element connected between said second input terminal and said second node;

a fifth transistor having a control electrode connected to said third input terminal and supplying said second voltage signal to a third node connected to a control electrode of said third transistor;

a second MOS capacitor element connected between said fourth input terminal and said third node;

a sixth transistor having a control electrode connected to said first input terminal and supplying said first voltage signal to said first node; and a seventh transistor having a control electrode connected to said third input terminal and supplying said second voltage signal to said first node.

19. An electro-optical device comprising a scanning line drive circuit having:

a plurality of scanning lines;

an odd driver including a plurality of cascaded unit shift registers to drive odd lines of said plurality of scanning lines; and an even driver including a plurality of cascaded unit shift registers to drive even lines of said plurality of scanning lines, wherein each of the unit shift registers of the odd and even drivers comprises:

an output terminal outputting an output signal;

a first input terminal receiving an output signal of the unit shift register positioned in the second previous line;

a second input terminal receiving a first clock signal delayed in phase by a scanning period for one line with respect to the output signal of the unit shift register positioned in the second previous line;

a clock terminal receiving a second clock signal delayed in phase by the scanning period for one line from said first clock signal;

a first transistor supplying said second clock signal to said output terminal;

a second transistor supplying said first clock signal to a first node connected to a control electrode of said first transistor; and a boosting unit boosting a second node connected to a control electrode of said second transistor to a voltage higher than an amplitude of said first clock signal when said first clock signal is activated following the activation of the signal received by said first input terminal, and a phase of the output signal of the odd driver is different form a phase of the output signal of the even driver by a scanning period for one line.

20. The electro-optical device according to claim 19, wherein said boosting unit comprises a charging/discharging circuit charging said second node after the signal received by said first input terminal is activated and before said first clock signal is activated, and then discharging said second node before said first clock signal is inactivated.

21. The electro-optical device according to claim 20, wherein said charging/discharging circuit comprises a third transistor having a control electrode supplied with a power supply potential, and one current electrode connected to said second node.

22. The electro-optical device according to claim 21, wherein the other current electrode of the third transistor is charged in response to activation of the signal received by said first input terminal and discharged in response to the charging of the first node.

23. The electro-optical device according to claim 19, further comprising:

a plurality of signal lines intersecting with said plurality of scanning lines; and a plurality of pixels formed in the vicinity of cross points between said plurality of scanning lines and said plurality of signal lines; wherein said scanning line drive circuit is formed on the same substrate as said plurality of pixels and said plurality of scanning lines, and said plurality of unit shift registers are formed on one sides of said pixels.

24. The electro-optical device according to claim 23, wherein said plurality of unit shift registers are formed on a side closer to a clock signal generator supplying clock signals to said plurality of unit shift registers compared with positions of said pixels.

25. An electro-optical device comprising a scanning line drive circuit having:

a plurality of scanning lines;

an odd driver including a plurality of cascaded unit shift registers to drive odd lines of said plurality of scanning lines and capable of switching a shift direction of a signal; and an even driver including a plurality of cascaded unit shift registers to drive even lines of said plurality of scanning lines and capable of switching the shift direction of the signal, wherein each of the unit shift registers of the odd and even drivers has:

an output terminal outputting an output signal;

a first input terminal receiving an output signal of the unit shift register positioned in the second previous line;

a third input terminal receiving an output signal of the unit shift register positioned in the second next line;

a second input terminal receiving a first clock signal having the same phase as that of an output signal of the unit shift register positioned in the previous line;

a fourth input terminal receiving a second clock signal having the same phase as that of an output signal of the unit shift register positioned in the next line;

a clock terminal receiving a third clock signal delayed in phase by the scanning period for one line from the first clock signal at the time of forward shift and delayed in phase by the scanning period for one line from the second clock signal at the time of backward shift;

a first transistor supplying said third clock signal to said output terminal;

a second transistor supplying said first clock signal to a first node connected to a control electrode of said first transistor;

a third transistor supplying said second clock signal to said first node;

a first boosting unit boosting a second node connected to a control electrode of said second transistor to a voltage higher than an amplitude of said first clock signal when said first clock signal is activated following the activation of the signal received by said first input terminal at the time of forward shift; and a second boosting unit boosting a third node connected to a control electrode of said third transistor to a voltage higher than an amplitude of said second clock signal when said second clock signal is activated following the activation of the signal received by said third input terminal at the time of backward shift, at the time of forward shift, said third transistor of each of said unit shift registers of the odd and even drivers is kept in an off state, at the time of backward shift, said second transistor of each of said unit shift registers of the odd and even drivers is kept in an off state, and a phase of the output signal of the odd driver is different from a phase of the output signal of the even driver by a scanning period for one line.

26. The electro-optical device according to claim 25, further comprising:

a plurality of signal lines intersecting with said plurality of scanning lines; and a plurality of pixels formed in the vicinity of cross points between said plurality of scanning lines and said plurality of signal lines; wherein said scanning line drive circuit is formed on the same substrate as said plurality of pixels and said plurality of scanning lines, and said plurality of unit shift registers are formed on one sides of said pixels.

27. The electro-optical device according to claim 26, wherein said plurality of unit shift registers are formed on a side closer to a clock signal generator supplying clock signals to said plurality of unit shift registers compared with positions of said pixels.

* * * * *